US012755927B2

(12) United States Patent
van Hoften

(10) Patent No.: US 12,755,927 B2
(45) Date of Patent: Oct. 6, 2026

(54) PIXEL ELEMENTS, PARTICLE BEAM MICROSCOPES INCLUDING THE SAME, AND ASSOCIATED METHODS

(71) Applicant: FEI Company, Hillsboro, OR (US)

(72) Inventor: Gerrit Cornelis van Hoften, Veldhoven (NL)

(73) Assignee: FEI Company, Hillsboro, OR (US)

( * ) Notice: Subject to any disclaimer, the term of this patent is extended or adjusted under 35 U.S.C. 154(b) by 631 days.

(21) Appl. No.: 17/984,067

(22) Filed: Nov. 9, 2022

(65) Prior Publication Data

US 2024/0153735 A1 May 9, 2024

(51) Int. Cl.
*H01J 37/244* (2006.01)
*H01J 37/04* (2006.01)

(52) U.S. Cl.
CPC ............ *H01J 37/244* (2013.01); *H01J 37/04* (2013.01)

(58) Field of Classification Search
None
See application file for complete search history.

(56) References Cited

U.S. PATENT DOCUMENTS

| | | | |
|---|---|---|---|
| 8,735,849 | B2 | 5/2014 | Hlavenka et al. |
| 9,609,243 | B2 | 3/2017 | Yadid-Pecht et al. |
| 9,686,483 | B2 | 6/2017 | Bagwell et al. |
| 9,699,398 | B2 | 7/2017 | Dierickx et al. |
| 9,780,138 | B2 | 10/2017 | Dupont |
| 9,819,882 | B2 | 11/2017 | Dierickx et al. |
| 10,043,843 | B2 | 8/2018 | Mansoorian et al. |
| 10,497,737 | B2 | 12/2019 | Dierickx |

(Continued)

FOREIGN PATENT DOCUMENTS

| | | | |
|---|---|---|---|
| BE | 1023468 | A1 | 3/2017 |
| EP | 2346079 | B1 | 11/2013 |

OTHER PUBLICATIONS

"TemCam XF-Series—www.tvips.com," Web page <https://www.tvips.com/camera-systems/temcam-xf-series/>, 4 pages, May 19, 2022, retrieved from Internet Archive Wayback Machine <https://web.archive.org/web/20220519023159/https://www.tvips.com/camera-systems/temcam-xf-series/> on Nov. 9, 2022.

(Continued)

*Primary Examiner* — James Choi
(74) *Attorney, Agent, or Firm* — Klarquist Sparkman, LLP

(57) ABSTRACT

Pixel elements and associated methods are disclosed herein. A pixel element can comprise a radiation-sensitive element configured to generate an electric charge, a floating diffusion node, a charge storage device, and an output stage configured to generate a charge signal. The pixel element is configured to operate in a high-gain mode and a low-gain mode and can have a total dynamic range that is at least 100,000:1. A method of operating a pixel element can comprise reading out a high-gain charge signal with the pixel element in a high-gain mode and reading out a low-gain charge signal with the pixel element in a low-gain mode. The reading out the low-gain charge signal comprises configuring a low-gain channel charge capacity of the pixel element such that a ratio of the low-gain channel charge capacity to a high-gain channel charge capacity is at least 30:1.

20 Claims, 11 Drawing Sheets

(56) References Cited

U.S. PATENT DOCUMENTS

| | | | | |
|---|---|---|---|---|
| 2012/0205539 | A1 * | 8/2012 | Hlavenka .............. | H01J 37/224 250/307 |
| 2014/0263947 | A1 | 9/2014 | Dierickx | |
| 2014/0353472 | A1 * | 12/2014 | Dierickx ................. | H10F 39/18 257/225 |
| 2019/0281238 | A1 | 9/2019 | Kalgi | |
| 2020/0027694 | A1 * | 1/2020 | Wang ................. | G01N 23/2251 |
| 2020/0388463 | A1 * | 12/2020 | Schmaunz ............ | H01J 37/244 |
| 2021/0066035 | A1 * | 3/2021 | Trimpl .................. | H01J 37/244 |

OTHER PUBLICATIONS

"OneView 16-Megapixel Camera for TEM Applications | Gatan, Inc.," Web page <https://www.gatan.com/products/tem-imaging-spectroscopy/oneview-camera/>, 11 pages, Oct. 17, 2022, retrieved from Internet Archive Wayback Machine <https://web.archive.org/web/20221017175846/https://www.gatan.com/products/tem-imaging-spectroscopy/oneview-camera/> on Nov. 9, 2022.

"GSENSE4040BSI—Gpixel," Web page https://www.gpixel.com/products/area-scan-en/gsense/gsense4040bsi/, 4 pages, May 26, 2022, retrieved from Internet Archive Wayback Machine <https://web.archive.org/web/20220526024839/https://www.gpixel.com/products/area-scan-en/gsense/gsense4040bsi/> on Nov. 9, 2022.

European Patent Office, European Search Report for related European Application No. EP23208523.3, Mar. 14, 2024, 2 pages.

* cited by examiner

PIXEL ELEMENTS, PARTICLE BEAM MICROSCOPES INCLUDING THE SAME, AND ASSOCIATED METHODS

FIELD

The present disclosure relates generally to pixel elements for particle beam microscopy image sensors with dynamic range calibrated pixels and associated methods.

BACKGROUND

Particle beam microscopy is a well known and increasingly important technique for imaging microscopic objects, particularly in the form of electron microscopy. The basic genus of the electron microscope finds practical application in the form of a variety of apparatus species, such as the Transmission Electron Microscope (TEM), Scanning Electron Microscope (SEM), and Scanning Transmission Electron Microscope (STEM), and also into various sub-species.

In a SEM, irradiation of a specimen by a scanning electron beam precipitates emanation of "auxiliary" radiation from the specimen in the form of secondary electrons, backscattered electrons, X-rays, and cathodoluminescence (infrared, visible and/or ultraviolet photons), for example. One or more components of this emanating radiation is/are then detected and used for image accumulation purposes.

In a TEM, the electron beam used to irradiate the specimen is chosen to be of sufficiently high energy to penetrate the specimen. The transmitted electrons emanating from the specimen can then be used to create an image. When such a TEM is operated in scanning mode (thus becoming a STEM), the image in question will be accumulated during a scanning motion of the irradiating electron beam.

In some examples, such as in so-called "dual-beam" tools (e.g., a FIB-SEM), a "machining" Focused Ion Beam (FIB) additionally is employed, allowing supportive activities such as ion-beam milling or Ion-Beam-Induced Deposition (IBID).

As an alternative to the use of electrons as irradiating beam, particle beam microscopy can also be performed using other species of charged particle. In this respect, the phrase "charged particle" may be understood as encompassing electrons, positive ions (e.g., Ga or He ions), negative ions, protons, and positrons, for example. In addition to imaging and performing (localized) surface modification (e.g., milling, etching, deposition, etc.), a charged particle microscope also may have other functionalities, such as performing spectroscopy, examining diffractograms, etc.

In all cases, a particle beam microscope (PBM) generally will comprise at least a radiation source (e.g., an electron source, ion gun, or X-ray source), an illuminator, a specimen holder, and a detector.

The detector can take many different forms depending on the radiation being detected. Examples include photodiodes, CMOS detectors, CCD detectors, photovoltaic cells, X-ray detectors (such as Silicon Drift Detectors and Si(Li) detectors), etc. In general, a PBM may comprise several different types of detector, selections of which can be invoked in different situations. It generally is desirable that the detector exhibit a sufficiently broad dynamic range to represent a wide range of incident particle beam signal magnitudes.

While the present disclosure generally pertains to the specific context of particle beam microscopy, and more specifically to electron microscopy, such descriptions are not intended to be limiting, and it is within the scope of the present disclosure that the apparatuses and methods disclosed herein may be applied in any suitable context.

SUMMARY

Pixel elements for particle beam microscopy image sensors with dynamic range calibrated pixels and associated methods are disclosed herein.

In a representative example, an apparatus comprises a scintillator configured to receive a particle beam and to generate an electromagnetic signal at an average photon conversion rate, a sensor configured to receive the electromagnetic signal, and a waveguide configured to convey the electromagnetic signal from the scintillator to the sensor. The sensor comprises at least one pixel element configured to produce a high-gain charge signal and a low-gain charge signal that collectively are characterized by a total dynamic range. The at least one each pixel element is calibrated such that the total dynamic range is based, at least in part, on the average photon conversion rate.

In another representative example,

- a pixel element comprises a radiation-sensitive element, a floating diffusion (FD) node, an output stage, and a charge storage device connected to the FD node. The output stage is connected to the FD node and is configured to generate a charge signal representative of an amount of electric charge stored in at least a portion of the pixel element. The pixel element is characterized by a high-gain charge capacity equal to a charge capacity of the radiation-sensitive element and a low-gain charge capacity equal to a total charge capacity of the FD node and the charge storage device. The pixel element is configured to operate in a high-gain mode and in a low-gain mode. When the pixel element is in the high-gain mode, the charge signal is a high-gain charge signal that represents the amount of electric charge stored in the radiation-sensitive element during an integration period. When the pixel element is in the low-gain mode, the charge signal is a low-gain charge signal that represents the amount of electric charge stored in one or both of the FD node and the charge storage device during the integration period. The high-gain charge signal has a high-gain signal dark noise magnitude, and the pixel element has a total dynamic range, defined as the ratio of the low-gain charge capacity to the high-gain signal dark noise magnitude, that is at least 100,000:1.

In another representative example, a method comprises providing a pixel element and producing a charge signal with the pixel element. The pixel element comprises a radiation-sensitive element, an FD node, an output stage connected to the FD node, and a charge storage device connected to the FD node. The radiation-sensitive element is configured to receive an electromagnetic signal that is representative of a particle beam and to generate and store an electric charge. The output stage is configured to generate the charge signal representative of an amount of electric charge stored in at least a portion of the pixel element. The charge signal is based, at least in part, on a number of photons produced by a scintillator that generates the electromagnetic signal. The scintillator is characterized by an average photon conversion rate, and the producing the charge signal is based, at least in part, on the average photon conversion rate.

In another representative example, a method comprises reading out the pixel element by reading out a high-gain charge signal with the pixel element in a high-gain mode and reading out a low-gain charge signal with the pixel element in a low-gain mode. Each of the reading out the low-gain charge signal and the reading out the high-gain charge signal is performed with a controller. When the pixel element is in the high-gain mode, the pixel element has a high-gain channel charge capacity. When the pixel element is in the low-gain mode, the pixel element has a low-gain channel charge capacity. The reading out the low-gain charge signal comprises configuring, with the controller, the low-gain channel charge capacity of the pixel element. The configuring the low-gain channel charge capacity comprises configuring such that a ratio of the low-gain channel charge capacity to the high-gain channel charge capacity is at least 30:1.

The foregoing and other objects, features, and advantages of the disclosed technology will become more apparent from the following detailed description, which proceeds with reference to the accompanying figures.

DETAILED DESCRIPTION

The present disclosure generally is directed to pixel elements that are configured and/or calibrated for use in conjunction with particle beam microscopes (PBMs) that use image sensors to form images that are based on one or more characteristics of a charged-particle or optical beam. As discussed in more detail below, such PBM-calibrated pixel elements can yield a significantly greater dynamic range than is currently achieved with pixel elements of existing optical image sensors.

Figure 1:
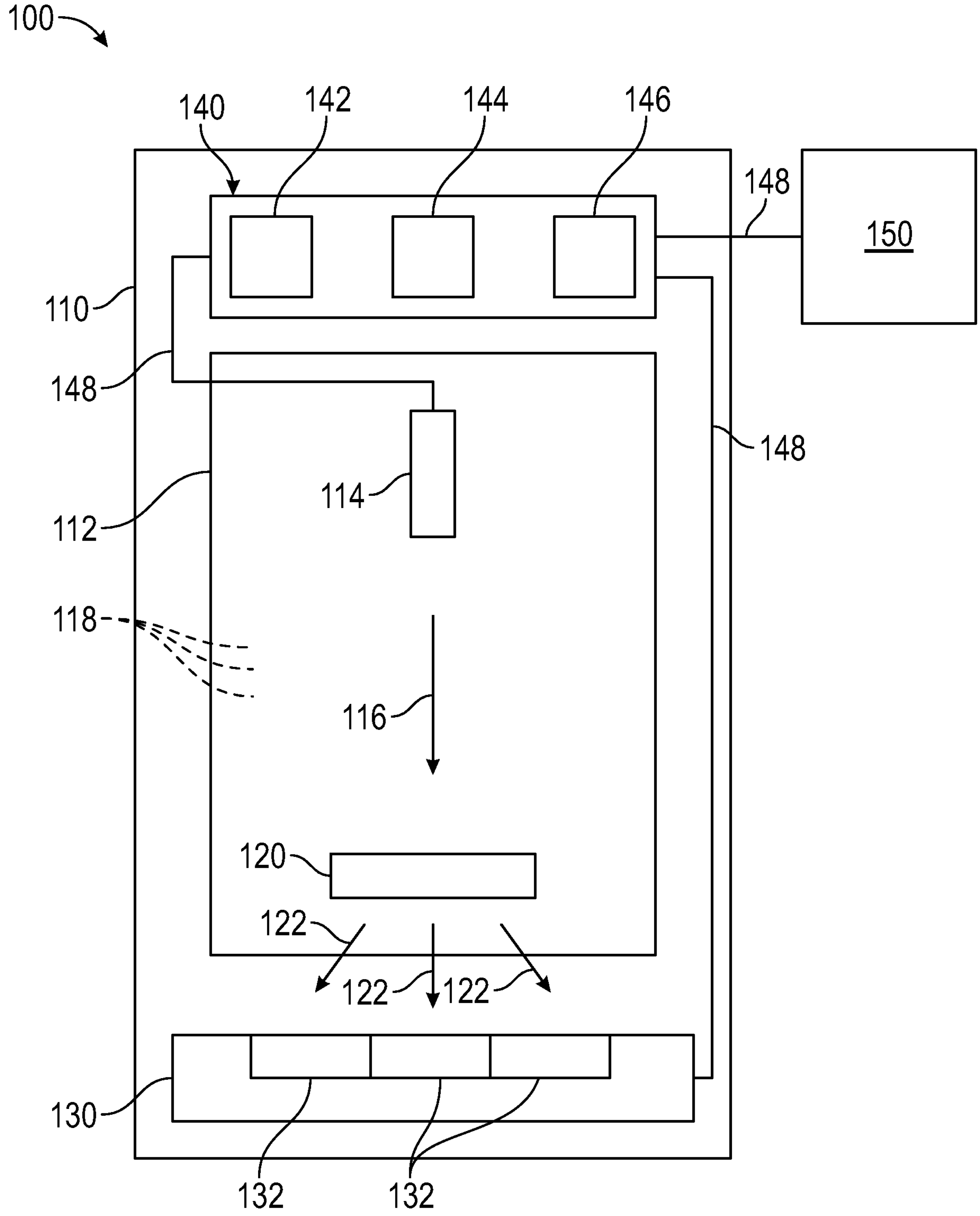
FIG. 1 is a schematic representation of an example of a PBM that can utilize the apparatuses and methods disclosed herein.

FIG. 1 is a schematic representation of an example of a particle beam microscope (PBM) 100. The PBM 100 can include an enclosure 110 that at least substantially encloses an imaging system 112, a particle beam source 114, and a sensor 130. The particle beam source 114 can generate and/or emit a particle beam 116 toward a sample 120, which in turn produces an auxiliary particle beam 122 that is received by the sensor 130. As shown in FIG. 1, the imaging system 112 can include one or more beam directing elements 118 for shaping, modulating, focusing, and/or directing the particle beam 116 from the particle beam source 114 toward the sample 120 and/or the sensor 130. As examples, and as discussed in more detail below, the one or more beam directing elements 118 can include illuminators, objective lenses, projection lenses, electrostatic/magnetic lenses, deflectors, correctors (such as stigmators), etc.

The sensor 130 can be configured to detect any of a variety of properties of the auxiliary particle beam 122 and/or to spatially locate the auxiliary particle beam 122. In this manner, measuring and/or characterizing the auxiliary particle beam 122 can enable the determination of one or more characteristics of the sample 120. As shown in FIG. 1, the sensor 130 can include a plurality of pixel elements 132, each of which can be configured to receive at least a portion of the auxiliary particle beam 122. Thus, for example, a measurement of an intensity of the auxiliary particle beam 122 at each of a plurality of pixel elements 132 can produce a spatial representation of one or more characteristics of the auxiliary particle beam 122.

As shown in FIG. 1, the PBM 100 can include a controller 140 that is programmed and/or otherwise configured to at least partially control operation of the PBM 100. For example, the controller 140 can at least partially control operation of the particle beam source 114 to produce the particle beam 116 and/or can at least partially control operation of the imaging system 112 and/or the focusing elements 118. Additionally or alternatively, the controller 140 can receive a signal from the sensor 130 that is representative of the auxiliary particle beam 122 and/or of the sample 120. In some examples, and as described in more detail herein, the controller 140 also can at least partially control operation of the sensor 130, such as by configuring the sensor 130 and/or one or more pixel elements 132 thereof for a particular mode of operation. The controller 140 can include any of a variety of modules (e.g., hardware and/or software) for performing these and other functions. As examples, and as shown in FIG. 1, the controller 140 can include a pixel configuration module 142 for configuring the pixel element(s) 132, a pixel readout module 144 for obtaining one or more signals from the pixel element(s) 132, an analog-to-digital converter (ADC) 146, etc.

As shown in FIG. 1, the controller 140 can be connected to any other suitable components of the PBM 100 via one or more control lines 148. In some examples, the control lines 148 can include and/or be physical signal conduits, such as wires, electrical buses, optical fibers, etc. Additionally or alternatively, in some examples, the control lines 148 can include and/or be wireless connections.

As shown in FIG. 1, the PBM 100 additionally can include a user interface 150 for receiving inputs from a human user and/or for recording and/or displaying information. The user interface can include any of a variety of inputs and/or outputs, examples of which include a keyboard, a mouse, a display, a touchscreen, a physical storage drive, etc.

Figure 2:
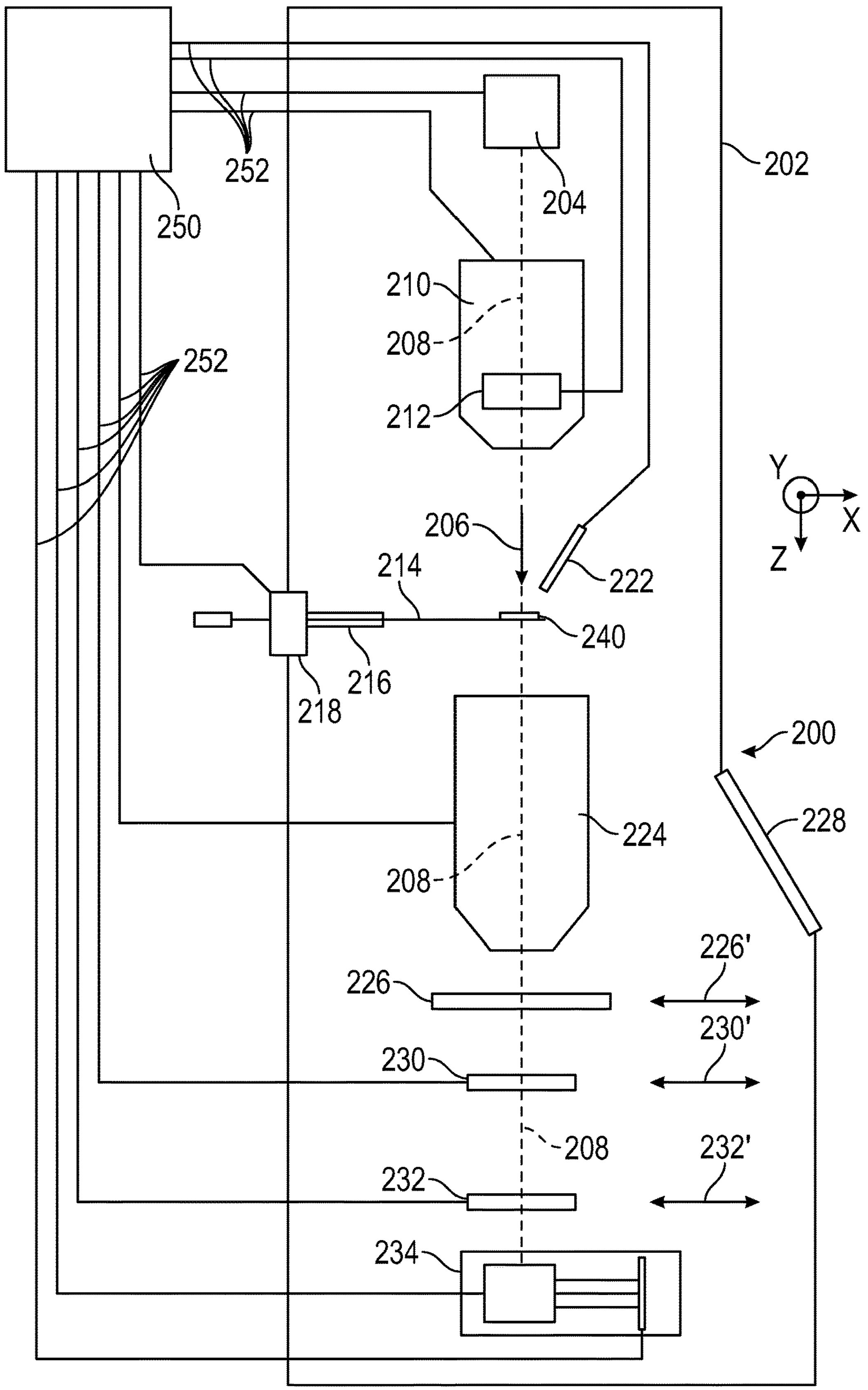
FIG. 2 is a schematic cross-sectional view of another example of a PBM that can utilize the apparatuses and method disclosed herein.

FIG. 2 is a schematic depiction of another example of a PBM 200. In particular, FIG. 2 illustrates a PBM in the form of a scanning transmission electron microscope (STEM). In this manner, the PBM 200 of FIG. 2 may be described as representing an example of the PBM 100 of FIG. 1.

As illustrated in FIG. 2, the PBM 200 comprises a vacuum enclosure 202 and an electron source 204 (e.g., a Schottky emitter) positioned in the vacuum enclosure 202. The electron source 204 produces an electron beam 206 that traverses an electron-optical illuminator 210, which directs and/or focuses the electron beam 206 onto a portion of a specimen 240. This illuminator 210 has an electron-optical axis 208' and can comprise any of a variety of electrostatic/magnetic lenses, (scan) deflector(s) 212, correctors (such as stigmators), etc. The illuminator 210 also can comprise and/or be a condenser system. The vacuum enclosure 202, the electron source 204, the electron beam 206, the specimen 240, and the illuminator 210 can be described as representing examples of the enclosure 110, the particle beam source 114, the particle beam 116, the sample 120, and the focusing element(s) 118 of the PBM 100 of FIG. 1.

In the example of FIG. 2, the specimen 240 is held on a specimen holder 214. As here illustrated, a portion of the specimen holder 214 extends within the enclosure 202 and is mounted in a cradle 216 that can be positioned/moved in multiple degrees of freedom by a positioning device (stage) A. For example, the cradle 216 may be displaceable in the X, Y, and Z directions depicted in FIG. 2, and/or may be rotated about a longitudinal axis parallel to the X direction. Such movement can allow different parts of the specimen 240 to be irradiated/imaged/inspected by the electron beam 206 traveling along the axis 208. Such motion additionally or alternatively can allow selected parts of the specimen 240 to be machined by a (non-depicted) focused ion beam, for example). Additionally or alternatively, in some examples, the electron beam 206 can be scanned relative to the specimen 240 with one or more deflectors 212.

The (focused) electron beam 206 traveling along the axis 208 can interact with the specimen 240 in such a manner as to cause various types of "stimulated" radiation to emanate from the specimen 240, including (for example) secondary electrons, backscattered electrons, X-rays and optical radiation (cathodoluminescence). One or more of these radiation types can be detected with the aid of a sensor 222, which might be a combined scintillator/photomultiplier or EDX (Energy-Dispersive X-Ray Spectroscopy) module, for instance. In such an example, an image could be constructed using basically the same principle as in a SEM. Additionally or alternatively, one can study electrons that traverse (pass through) the specimen 240, emerge (emanate) from it, and continue to propagate (substantially, though generally with some deflection/scattering) along axis 208. Such a transmitted electron flux enters an imaging system (e.g., a combined objective/projection lens) 224, which can comprise a variety of electrostatic/magnetic lenses, deflectors, correctors (such as stigmators), etc. The transmitted electron flux can be described as representing an example of the auxiliary particle beam 122 of FIG. 1.

In normal (non-scanning) TEM mode, this imaging system 224 can focus the transmitted electron flux onto a fluorescent screen 226, which, if desired, can be retracted/withdrawn (as schematically indicated by arrows 226') relative to the axis 208. An image (e.g., a diffractogram) of at least a portion of the specimen 240 will be formed by the imaging system 224 on the screen 226, and this may be viewed through a viewing port 228 located in a suitable part of a wall of the enclosure 202. The retraction mechanism for the screen 226 may, for example, be mechanical and/or electrical in nature.

Additionally or alternatively, and as shown in FIG. 2, the PBM 200 can include a TEM camera 230. At the TEM camera 230, the electron flux can form a static image (or diffractogram) that can be processed by a controller 250 and displayed on a display device (e.g., a display of the user interface 150 of FIG. 1), such as a flat panel display, for example. When not required, the TEM camera 230 can be retracted/withdrawn (as schematically indicated by arrows 230') relative to the axis 208.

Additionally or alternatively, and as shown in FIG. 2, the PBM 200 can include a STEM detector 232. An output from the STEM detector 232 can be recorded as a function of (X,Y) scanning position of the electron beam 206 on the specimen 240, and an image can be constructed that is a "map" of output from the STEM detector 232 as a function of (X,Y). In existing tools, the STEM detector 232 can comprise a single pixel with a diameter of e.g., 20 mm, as opposed to the matrix of pixels characteristically present in the TEM camera 230. Once again, when not required, the STEM detector 232 can be retracted/withdrawn (as schematically indicated by arrows 232') relative to the axis 208.

Additionally or alternatively, and as shown in FIG. 2, the PBM 200 can include a spectroscopic apparatus 234, which can include and/or be an EELS module, for example.

It should be noted that the order/location of items 230, 232 and 234 is not strict, and many possible variations are conceivable. For example, the spectroscopic apparatus 234 can also be integrated into the imaging system 224.

The controller/computer processor 250 is connected to various illustrated components via control lines (buses) 252. This controller 250 can provide a variety of functions, such as synchronizing actions, providing setpoints, processing signals, performing calculations, and displaying messages/information on a display device (not depicted in FIG. 2). The controller 250 may be positioned at least partially inside or outside the enclosure 202, and may have a unitary or composite structure, as desired. The skilled artisan will understand that the interior of the enclosure 202 does not have to be kept at a strict vacuum. For example, in a so-called "Environmental (S)TEM," a background atmosphere of a given gas is deliberately introduced/maintained within the enclosure 202. The skilled artisan also will understand that, in practice, it may be advantageous to confine the volume of enclosure 202 so that, where possible, it essentially extends minimally away from the axis 208, taking the form of a small tube (e.g., of the order of 1 cm in diameter) through which the employed electron beam passes, but widening out to accommodate structures such as the source 204, the specimen holder 214, the screen 226, the camera 230, the detector 232, the spectroscopic apparatus 234, etc.

In some examples, the illuminator 210 may comprise a beam shaping element such as a lens and/or aperture plate/diaphragm, to appropriately shape (focus) the beam 206 into a relatively narrow "pencil" of charged particles, causing it to irradiate only a relatively small area (footprint) of the specimen 240 at any given time. Relative motion between the specimen 240 and the footprint of the beam 206 to move the footprint onto another area of the specimen can be produced in any of a variety of manners, such as by using the positioning device 218 to move the specimen 240 relative to the beam 206 and/or by using the deflector 212 to deflect the beam 206 relative to the specimen 240; moving the source 204 or/and the abovementioned beam shaping element so as to displace the beam 206 relative to the specimen 240.

In some examples, for each such chosen position of the electron beam 206 relative to the specimen 240, one can use the TEM camera 230 to capture a diffractogram (diffraction pattern). Specifically, the controller 250 (or another processor device) can be programmed and/or configured to acquire a ptychographic measurement set, by recording an output of (for example) the TEM camera 230 for each of a series of different positions of the beam 206 upon the specimen 240 (achieved, for example, by sending an appropriate series of setpoints to items 218, 212, etc.). Additionally or alternatively, the controller 250 can be programmed and/or configured to process the recorded outputs of said camera 230 and use them as input to perform a mathematical reconstruction algorithm. Additionally or alternatively, the controller 250 can be programmed and/or configured to display the results of said reconstruction algorithm, e.g., in the form of an image on a display device (not shown).

Further examples and characteristics of PBMs that can use, and/or that can be used in conjunction with, PBM-calibrated dual-gain pixel elements according to the present disclosure are disclosed in U.S. Pat. Nos. 10,008,363 and 11,327,032, the complete disclosures of which are incorporated by reference herein.

As discussed above, various components of the PBM 200, such as the sensor 222 and/or the TEM camera 230, can be used to collect data that represents one or more properties of the specimen 240. In such examples, such components may be described as comprising a sensor device that comprises a plurality of pixel elements, each of which receives an electromagnetic signal and generates an electrical signal representing the magnitude of the received electromagnetic signal.

Figure 3:
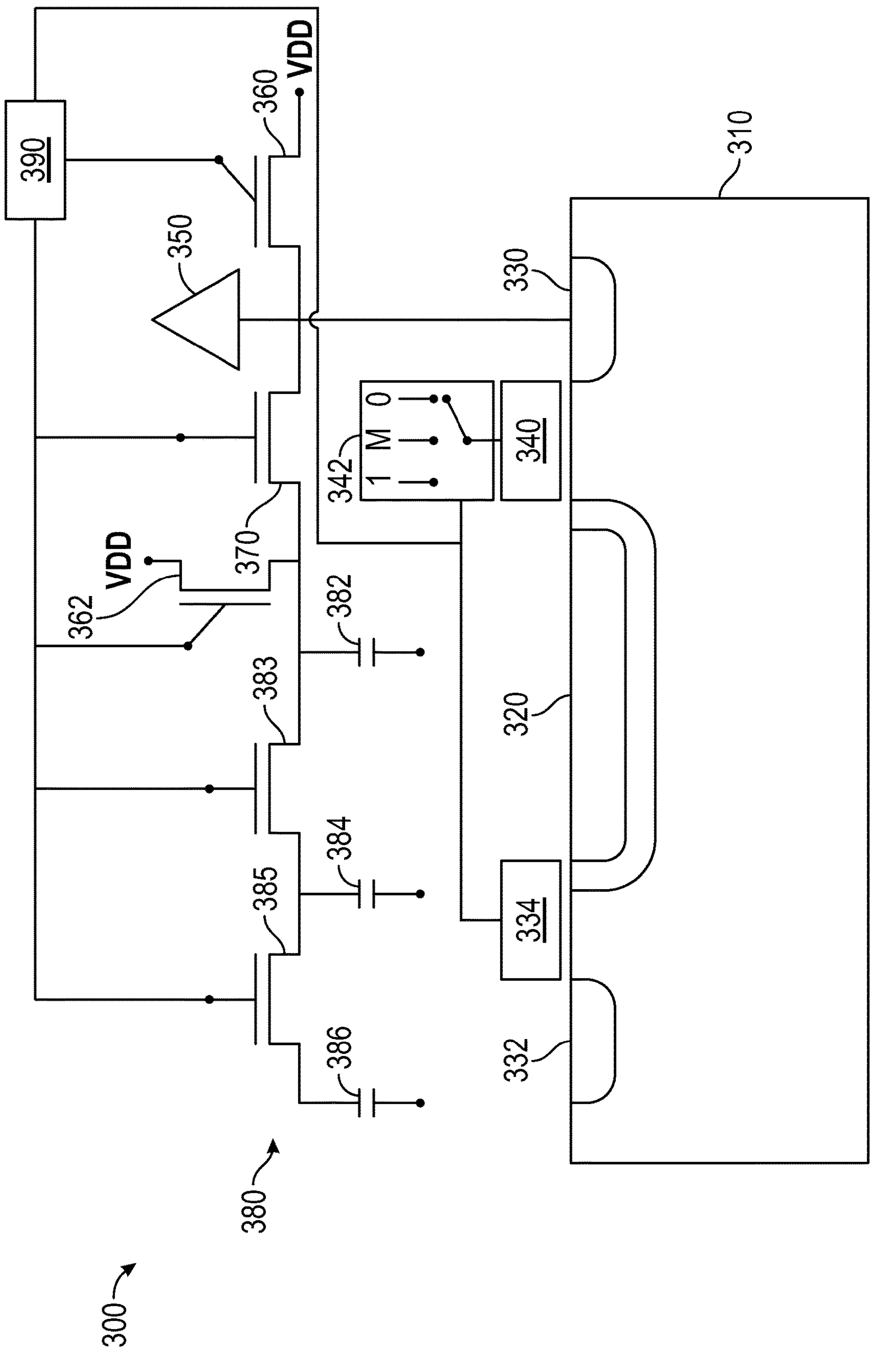
FIG. 3 is a schematic representation of a pixel element with a radiation-sensitive element connected to a floating diffusion node and a charge storage device according to an example.

In some examples, it is desirable to ensure that each pixel element of the sensor device exhibits a dynamic range that is sufficiently broad to represent a wide range of magnitudes of the received electromagnetic signal. Various pixel architectures exist for enhancing the total dynamic range of a pixel element. For example, FIG. 3 shows an example of such a pixel element 300, which is similar to those shown in U.S. Pat. No. 9,780,138. As described below, FIG. 3 illustrates various components that can be incorporated into the pixel element 300. It is to be understood, however, that not all elements shown in FIG. 3 are required to be present in an example of a pixel element 300 according to the present disclosure.

The pixel element 300 includes a radiation-sensitive element 320 on a semiconductor substrate 310, such as a lightly doped p-type substrate. The radiation-sensitive element 320 can be any suitable element configured to generate an electric charge in response to incident radiation, such as a photodiode, e.g., a regular photodiode, a hybrid photodiode or a monolithic photodiode. The radiation-sensitive element 320 may be a pinned photodiode (PPD). Alternatively, the photo-sensitive element 320 may for example comprise a metal-insulator-semiconductor structure forming a photogate.

The pixel element 300 additionally includes a floating diffusion node (FD) 330, an output stage 350 connected to the FD node 330, and a charge storage device 380 connected to the FD node 330. In particular embodiments of the present invention, the FD node 330 may be integrated in the substrate 310. For example, the FD node 330 may be an area of n+ doping in a p-substrate. The output stage 350 can include any suitable for generating a charge signal representative of a detected level of electric charge and/or a detected voltage at the FD node 330, such as for display or data storage. As examples, the output stage 350 can include and/or be a readout circuit, an analog to digital converter (ADC), etc.

In the example of FIG. 3, the FD node 330 is separated from the radiation-sensitive element 320 by a gap of substrate 310, which is covered by a transfer gate 340. The transfer gate may comprise an electrode and isolation layer, for example an oxide layer. In some examples, a single transfer gate 340 is provided between the radiation-sensitive element 320 and the FD node 330 for controlling any transfer of charge from the radiation-sensitive element 320 to the FD node 330. In particular, the transfer gate 340 can control the transfer of overflown charges to the FD node 330. From there, the charges may be transferred to the charge storage device 380, depending on the operational state of a merge switch 370 between the FD node 330 and the charge storage device 380. In the present disclosure, the merge switch 370 also may be referred to as a charge storage merge switch 370.

In the example of FIG. 3, the transfer gate 340 is connected to a drive circuit 342 configured to bias the transfer gate 340 to at least three different bias levels, such as bias levels corresponding to an ON state, an OFF state, and also at least one intermediate state. For example, if the transfer gate 340 has transistor characteristics, the intermediate voltage can be obtained by varying the voltage in the ohmic region. In this example, the drive circuit 342 is capable of sequentially biasing the transfer gate 340 to an ON bias voltage $V_1$, an intermediate or barrier voltage $V_M$, and an OFF bias voltage $V_0$. The drive circuit 342 can include an additional control for selection of the level of the barrier value $V_M$, hence allowing control of the saturation level of the pixel element 300.

The charge storage device 380 can include and/or be any suitable element or circuit configuration capable of storing charges. For example, and as shown in FIG. 3, the charge storage device 380 may comprise at least one capacitor 382, such an integrated capacitor, a metal-insulator-metal, a polysilicon-insulator-polysilicon capacitor, a MOS capacitor, an integrated capacitor, etc.

In some examples, and as shown in FIG. 3, the charge storage device 380 includes a system of capacitors, such as a plurality of capacitors in a parallel configuration, in a series configuration, and/or connected through switches. In particular, in the example of FIG. 3, the charge storage device 380 includes a first capacitor 382, a second capacitor 384, and a third capacitor 386 connected in parallel via merge switches 383 and 385. In particular, in this example, each of the merge switches 383 and 385 is connected in series between two capacitors, while the first capacitor 382, the second capacitor 384, and the third capacitor 386 are connected in parallel when the merge switches 383 and 385 are closed. In some examples, such capacitors can be implemented in metal-oxide layers of the pixel element 300.

As shown in FIG. 3, the pixel element 300 can include a reset transistor 360 connected between the FD node 330 and a voltage source VDD for depletion of charge in the FD node 330. In such examples, the reset transistor 360 also may be referred to as an FD node reset transistor 360.

In some examples, and as shown in FIG. 3, the pixel element 300 additionally or alternatively can include a second reset transistor 362 connected between the charge storage device 380 and a voltage source VDD for depleting the charge independently of the storage, if desired, such as to create several cycles of saturation. In such examples, the second reset transistor 362 also may be referred to as a charge storage reset transistor 362.

As shown in FIG. 3, the pixel element 300 also can include a separate transfer gate 334 connecting the radiation-sensitive element 320 to a drain region 332. The transfer gate 334 thus can operate as an electric shutter, such as a global shutter, and can improve the control of the timing of phases of operation of the pixel element 300. In such examples, the transfer gate 334 also may be referred to as a drain gate 334.

In the example of the pixel element 300, the radiation-sensitive element 320 can be characterized by a maximum charge capacity thereof, at which point the radiation-sensitive element 320 is said to be saturated. In some examples, this saturation value can be varied in order to vary a dynamic range of the pixel element 300, defined as a ratio between the saturation charge capacity and a minimum readable charge signal (e.g., a dark noise magnitude). Charges generated in excess of this saturation value can be transferred to the FD node 330 by overflowing the transfer gate 340.

In some examples, readout of the pixel element 300 includes an integration process and a readout process. The readout process can include a high-gain readout step and a low-gain readout step.

During the integration process, charges generated by radiation impinging upon the radiation-sensitive element 320 are integrated during an integration period. At the start of the integration period, the charge storage device 380 is connected to the FD node 330, for example by closing the merge switch 370.

The integration process additionally can include driving the transfer gate 340 between the radiation-sensitive element 320 and the FD node 330 to a predetermined intermediate bias voltage $V_M$, according to the desired saturation value of the radiation-sensitive element 320. Any charge generated in the radiation-sensitive element 320 in excess of this saturation value thus may be transferred into the FD node 330 and the charge storage device 380. At the end of the integration process and before the readout process starts, the transfer gate 340 optionally can be driven to an OFF bias voltage to disconnect the FD node 330 from the radiation-sensitive element 320. Additionally, at this point, the merge switch 370 can be opened to disconnect the FD node 330 from the charge storage device 380.

As used herein, the term "open," when used to describe the operation and/or state of a component that is described as a switch, is intended to refer to an operation and/or state in which the switch provides no conductive path for charge transfer therethrough. By contrast, as used herein, the term "closed," when used to describe the operation and/or state of a component that is described as a switch, is intended to refer to an operation and/or state in which the switch provides a conductive path for charge transfer therethrough.

During a readout period corresponding to the readout process, with the FD node 330 disconnected from each of the radiation-sensitive element 320 and the charge storage device 380, any charge collected in the FD node 330 during the integration period optionally can be read from the FD node 330 through the output stage 350 to produce a reading of a reset charge level.

The integrated charges stored in the radiation-sensitive element 320 then can be transferred to the FD node 330 by driving the transfer gate 340 to an ON bias to "open" the gate. Once the charges are transferred, the transfer gate 340 can be biased to an OFF bias voltage to "close" the gate.

As used herein, the term "open," when used to describe the operation and/or state of a component that is described as a gate, is intended to refer to an operation and/or state in which the switch provides a conductive path for charge transfer therethrough. By contrast, as used herein, the term "closed," when used to describe the operation and/or state of a component that is described as a gate, is intended to refer to an operation and/or state in which the switch provides no conductive path for charge transfer therethrough.

After transferring the integrated charges from the radiation-sensitive element 320 to the FD node 330, the charge level can be read from the FD node 330 with the output stage 350 to produce a reading of a high-gain signal level. In particular, because the merge switch 370 is open, the high-level gain signal represents the sum of the reset charge level and the charge level stored in the radiation-sensitive element 320 prior to opening the transfer gate 340 (e.g., during readout of the reset charge level).

In some examples, correlated double sampling (CDS) can be performed by subtracting the reset charge level from the high-gain signal level to produce a corrected high-gain signal level. In this manner, the corrected high-gain signal level can represent the charge level stored in the radiation-sensitive element 320 during the integration process.

Additionally, the charge storage device 380 can be connected to the FD node 330 to merge the charges therein, such as by closing the merge switch 370. Reading the charge level at the FD node 330 with the output stage 350 thus can produce a reading of the charge level of the charge storage device 380 merged with the charges that may have been collected in the FD node 330 and in the charge storage device 380 during the integration process. This signal thus can be referred to as a low-gain signal level.

In this manner, the readout process of the pixel element 300 can be described as producing each of a high-gain signal level and a low-gain signal level. The charge signal produced by the pixel element 300 thus may be described as including a high-gain charge signal corresponding to the high-gain signal level and a low-gain charge signal corresponding to the low-gain signal level.

As discussed above, the high-gain signal level represents the charge stored in the radiation-sensitive element 320 during the integration process. Thus, a maximum value of the high-gain signal level can be at least partially defined by the charge capacity of the radiation-sensitive element, which in turn can be at least partially determined by the barrier voltage level $V_M$. This maximum value of the high-gain signal level without reaching saturation may be referred to as a high-gain charge capacity of the pixel element 300.

As discussed above, the low-gain signal level represents the total charge stored in the radiation-sensitive element 320 during the integration process as well as any charge that overflows the transfer gate 340 and subsequently is stored in the FD node 330 and/or in the charge storage device 380. Thus, a maximum value of the low-gain signal level can be at least partially determined by the respective charge storage capacities of the FD node 330 and the charge storage device 380. This maximum value of the low-gain signal level without reaching saturation may be referred to as a low-gain charge capacity of the pixel element 300.

In particular, the charge storage capacity of the charge storage device 380 can be determined through appropriate selection and/or configuration of the capacitors of the charge storage device 380, such as the first capacitor 382, the second capacitor 384, and/or the third capacitor 386 shown in FIG. 3. As more specific example, the charge storage capacity of the charge storage device 380 can be configured by configuring the capacitance of each capacitor in the charge storage device 380 and/or by configuring the charge storage device 380 to include an appropriate number of capacitors.

In some examples, the process of reading out the high-gain signal level may be described as operating the pixel element 300 in a high-sensitivity mode, in a high-gain mode, and/or with high-gain channel of the pixel element 300. Similarly, in some examples, the process of reading out the low-gain signal level may be described as operating the pixel element 300 in a low-sensitivity mode, in a low-gain mode, and/or with low-gain channel of the pixel element 300. Accordingly, the pixel element 300 also may be referred to as a dual-gain pixel element 300. As described above, a process of reading out the charge signal produced by the pixel element 300 can include reading out the high-gain charge signal and/or operating the pixel element in the high-gain mode prior to reading out the low-gain charge signal and/or operating the pixel element in the low-gain mode.

Readout of the pixel element 300 also can include various other steps and/or functions, such as may be enabled by the various optional components of the pixel element 300 introduced above. For example, the readout process further can include resetting the pixel element 300 at the end of the readout process, such as by connecting the voltage source VDD to the FD node 330 via the reset transistor 360.

As another example, a cycle of biasing the transfer gate 340 to OFF-ON-OFF states also can performed during the readout process (e.g., after merging the charges in the FD node 330, or after the first reading) to include charges integrated in the radiation-sensitive element 320 in the phases in which the transfer gate 340 was "open."

As another example, the drain gate 334 can be used as an electronic shutter, such as to obtain a global shutter in a sensor array. For example, closing the drain gate 334 can be used to determine and/or define the moment at which the integration period starts. When operating the pixel element 300 in a global shutter mode, it may be desirable that the low-gain signal level charge overflows from the FD node 330 into the charge storage device 380, while the high-gain signal level charge is transferred only to the FD node 330. This may be accomplished by operating the merge switch 370 as a barrier such that only a high level of charge results in charge overflow into the charge storage device 380.

During the readout process in a global shutter mode, the pixel element 300 can be sampled twice. First, the high-gain signal level can be obtained by reading the voltage at the FD node 330, and the merge switch 370 subsequently can be closed to allow a measurement of the total charge in the FD node 330 and in the charge storage device 380. At the end of the readout process, a global reset step can reset the pixel element 300, such as with the second reset transistor 362.

In some examples, the pixel element 300 additionally or alternatively can be operated in a global shutter mode with time gating. For example, when the pixel element includes the drain region 332 connected to the radiation-sensitive element 320 via the drain gate 334, integration of charge in the radiation-sensitive element 320 is prevented while the drain gate 334 is open. In some examples, the drain gate 334 can be kept open until immediately prior to global transfer of charges from the radiation-sensitive element 320, thus enabling very short integration times on the order of microseconds.

Operating the pixel element 300 in a global shutter mode with time gating thus can enable the pixel element 300 to capture incident radiation that is characterized by a high dose rate without saturation of the charge capacity of the pixel element. Such operation can be particularly beneficial when the pixel element 300 is used in conjunction with a PBM, such as the PBM 200. In particular, operating the pixel element 300 using time gating to restrict exposure times to extremely short intervals can enable the use pixel element 300 even with very high dose rates of incident radiation, such as may be typical of PBM techniques such as X-ray diffraction.

For example, the drain gate 334 can be kept open until immediately prior to global transfer of charges from the radiation-sensitive element 320 to yield a very short time-gated integration time interval such that the charge capacity of the pixel element is not saturated even at very high dose rates of incident radiation. As more specific examples, the time-gated integration time interval can be at least 1/10000 of a total frame time between initiation of successive frames, at least 1/1000 of the total frame time, at least 1/100 of the total frame time, at least 1/10 of the total frame time, at most equal to the total frame time, at most 1/5 of the total frame time, at most 1/50 of the total frame time, at most 1/500 of the total frame time, and/or at most 1/5000 of the total frame time. Additionally or alternatively, the time-gated integration time interval can be at least 1 microsecond (μs), at least 3 μs, at least 5 μs, at least 10 μs, at most 20 μs, at most 15 μs, at most 7 μs, at most 2 μs, and/or at most 1 μs.

In various examples, the time-gated integration time interval can be selectively varied prior to and/or during operation of the pixel element 300. For example, a user can select a suitable time-gated integration time interval with which to operate the pixel element 300, such as based upon a known dose rate of the incident radiation. In this manner, operating the pixel element 300 in a global shutter mode with time gating can allow for use of the pixel element 300 with incident radiation of any of a variety of dose rates without saturation of the charge capacity of the pixel element.

It is to be noted that such global shutter operation with time gating can be used with dual-gain pixels such as the pixel element 300 as well as with pixel elements featuring only a single gain channel (e.g., a high gain channel).

In an example in which the charge storage device 380 includes multiple capacitors, merging the charges may comprise several sequential merging steps. For example, each of the merge switch 383 and the merge switch 385 shown in FIG. 3 can be operated as a three-level switch in a manner similar to that of the transfer gate 340. In such an example, during the integration process, each of the first capacitor 382, the second capacitor 384, and the third capacitor 386 can be charged until reaching a capacity set by a corresponding merge switch 383 or 385, at which point the charges can flow into the subsequent capacitor. In such an example, the readout process can include separate charge readout operations corresponding to each such capacitor as the charge of each capacitor is merged with the FD node 330. Such a process further can expand a dynamic range of the pixel element at the expense of an increased time interval needed to complete the readout process. In the present disclosure, each of the merge switch 383 and/or the merge switch 385 also may be referred to as a parallel capacitor merge switch.

As additionally shown in FIG. 3, the pixel element 300 (and/or an associated image sensor) further can include a pixel controller 390 for controlling the operation of any other components of the pixel element 300. As examples, the pixel controller 390 can be programmed and/or configured to receive the charge signal from the output stage 350, to control operation of the drive circuit 342, to control operation of the drain gate 334, to control operation of the reset switch 360, to control operation of any of the merge switches 370, 383, and/or 385, and/or to control operation of the reset transistor 362. In this manner, the pixel controller 390 can be programmed and/or configured to execute at least a portion of any of the pixel readout processes described herein.

The pixel controller 390 can include and/or be any suitable hardware and/or software for controlling the pixel element 300 or one or more components thereof as described herein. As examples, the controller 140 of the PBM 100 of FIG. 1 and/or the controller 250 of the PBM 200 of FIG. 2 can include and/or be the pixel controller 390.

Figure 4A:
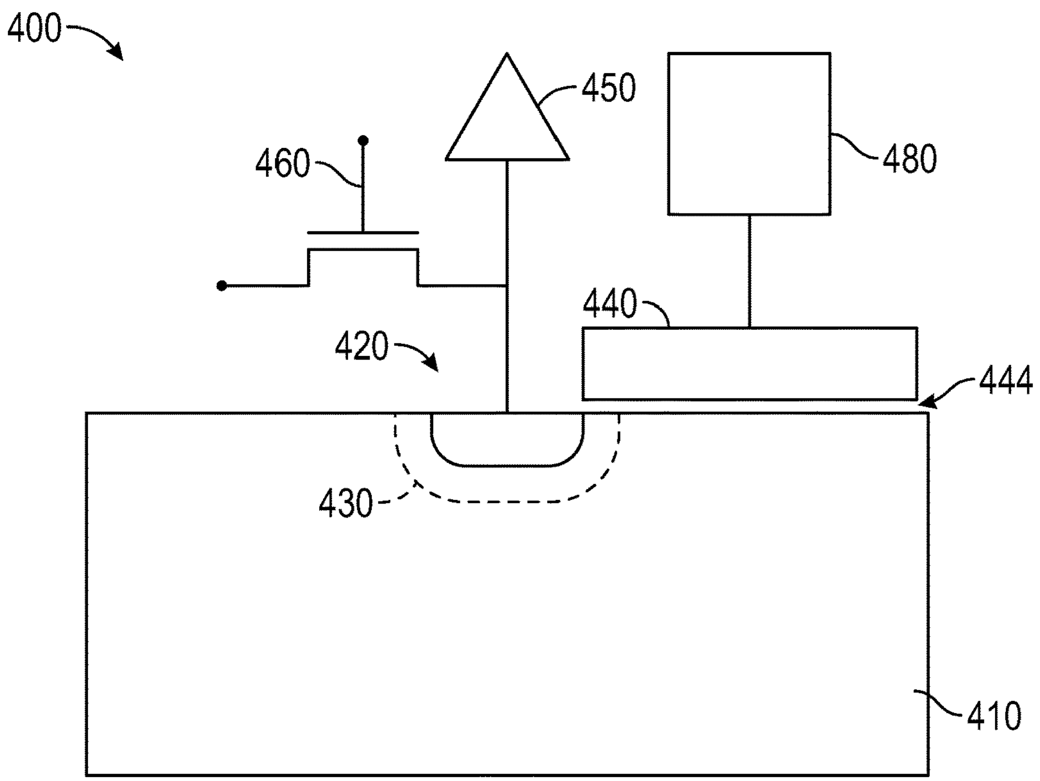
FIG. 4A is a schematic representation of a pixel element with a charge storage region associated with a radiation-sensitive element according to another example.
Figure 4B:
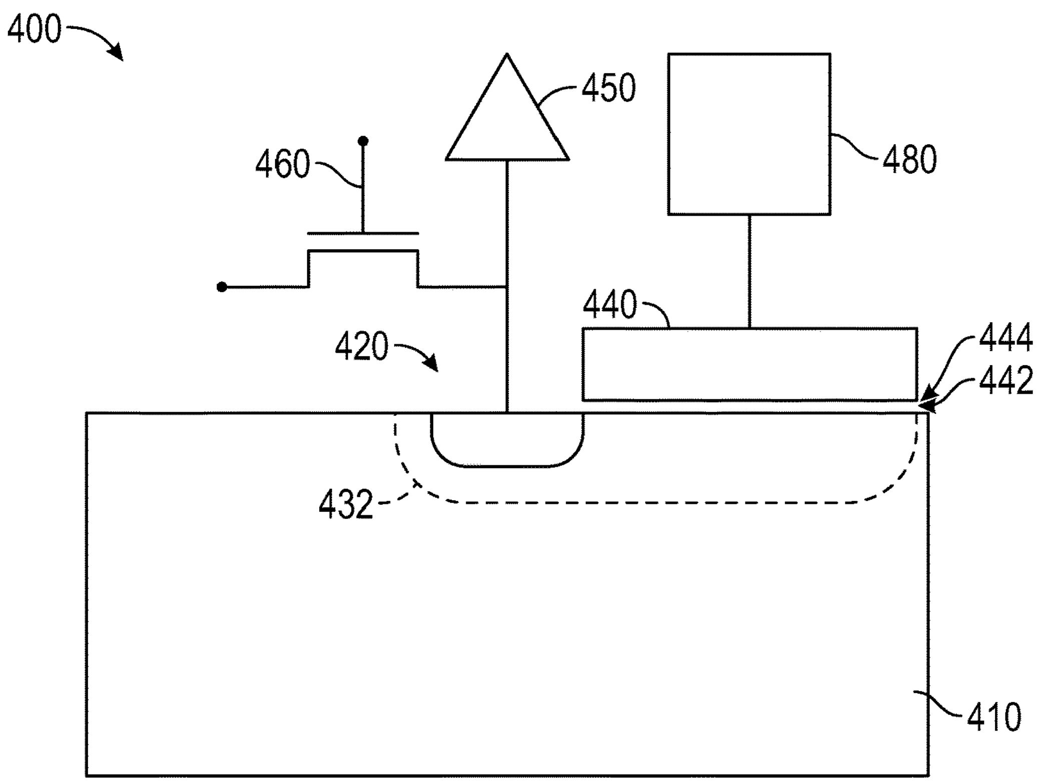
FIG. 4B is a schematic representation of the pixel element of FIG. 4A with an electrode forming an inversion region that extends a capacity of the charge storage region.

As another example, FIGS. 4A-4B illustrate a pixel element 400, which is similar to that shown in U.S. Pat. No. 10,497,737. The pixel element 400 comprises a semiconductor substrate 410. The semiconductor substrate may be a p-type substrate, e.g., may be composed of silicon or germanium with a small amount of p-type dopants such as boron, aluminum or other group III elements to provide an excess of holes in the substrate.

The pixel element 400 comprises a radiation-sensitive element 420 for generating an electric charge in response to incident radiation, and a charge accumulation region 430 is provided in the semiconductor substrate 410 for accumulating this electric charge. For example, the charge accumulation region 430 may be formed by an n-doped region embedded in the p-type substrate 410.

The radiation-sensitive element 420 may comprise a photodiode, e.g., a regular photodiode, a hybrid photodiode or a monolithic photodiode. The radiation-sensitive element 420 may be a pinned photodiode (PPD). Alternatively, the photo-sensitive element 420 may for example comprise a metal-insulator-semiconductor structure forming a photogate.

The charge accumulation region 430 may be formed by a depletion layer of the radiation-sensitive element 420, e.g., a depletion layer of a photodiode or photogate, e.g., a layer formed between doped semiconductor regions having opposite doping polarity forming such photodiode. However, the charge accumulation region 430 may be separate from the radiation-sensitive element 420 and may collect charges generated in the radiation-sensitive element and transmitted through a conductive path between the radiation-sensitive element 420 and the charge accumulation region 430. Stated differently, the charge accumulation region 430 may be a floating diffusion region provided in the substrate.

The pixel element 400 further comprises an electrode 440 arranged on the semiconductor substrate adjacent to the charge accumulation region. The electrode 440 is electrically insulated from the semiconductor substrate such as to form an inversion region 442 in the semiconductor substrate (labeled in FIG. 4B) that connects to the charge accumulation region 430 to form an extended charge accumulation region 432 when a voltage is applied to said electrode, e.g., such that charge storage in the charge accumulation region can be extended over the inversion region when a voltage is applied to the electrode. For example, the electrode 440 may be isolated from the semiconductor substrate 410 by an electrically insulating material, e.g., a material having high electric susceptibility, e.g., a semiconductor oxide such as silicon dioxide.

The inversion region 442 may be adapted for enabling a transfer of electric charge from the charge accumulation region 430 (which also may be referred to as a base charge accumulation region 430) to the inversion region 442 when a suitable voltage is applied to the electrode 440. This charge capacity extension is enabled by applying a suitable potential to the electrode 440, such that the electrode 440 and the inversion region 442 may form a capacitive element, e.g., a conductor-insulator-semiconductor capacitive element. For example, the electrode may be arranged on the substrate in close proximity to the charge accumulation region 430 such that this inversion region 442 allows charge migration between the base charge accumulation region 430 (e.g., the charge accumulation region associated with the radiation-sensitive element 420) and the inversion region 442, thereby forming the extended charge accumulation region 432. Thus, the electrode 440 and the inversion region 442 in the semiconductor substrate 410 may form a tunable capacitive element, e.g., a metal-insulator-semiconductor (MIS) capacitor, adapted for extending the charge storage capacity in a controllable manner, e.g., by adjusting the voltage applied to the electrode 440. In particular embodiments, the charge storage capacity of such tunable capacitive element may be larger than the capacity of the base charge accumulation region 430.

FIG. 4A illustrates an example in which the electrode 440 is electrically grounded and/or otherwise brought to a voltage such that the inversion region 442 is negligible and/or absent. Stated differently, FIG. 4A illustrates an example in which the electrode 440 is brought to a first voltage (e.g., a grounded voltage) such that charges produced by the radiation-sensitive element 420 can be stored in the base charge accumulation region 430. Accordingly, in the example of FIG. 4A, the base charge accumulation region 430 is substantially and/or exclusively formed by and/or associated with the radiation-sensitive element 420. As used herein, the first voltage also may be referred to as a high-gain mode electrode voltage.

By contrast, FIG. 4B illustrates a configuration of the pixel element 400 in which a suitable voltage has been applied to the electrode 440 to form the inversion region 442 adjacent to the base charge accumulation region 430 associated with the radiation-sensitive element 420. Stated differently, FIG. 4B illustrates an example in which the electrode 440 is brought to a second voltage to form the inversion region 442 such that charges produced by the radiation-sensitive element can be stored in the extended charge accumulation region 432 and/or in the inversion region 442. Thus, in the example of FIG. 4B, the extended charge accumulation region 432 extends over and/or includes the inversion region 442 and thus can store a greater amount of charge generated in the radiation-sensitive element 420 relative to the configuration of FIG. 4A. As used herein, the second voltage also may be referred to as a low-gain mode electrode voltage.

As illustrated in FIGS. 4A-4B, applying a voltage to the electrode 440 may be described as having the effect of increasing a size (e.g., an areal and/or volumetric size) of the extended charge accumulation region 432 relative to that of the base charge accumulation region 430. In some examples, applying a voltage to the electrode 440 additionally or alternatively may be described as having the effect of forming an additional and/or separate charge accumulation region to which charges may flow from the base charge accumulation region 430 associated with the radiation-sensitive element 420.

For controlling the activation and/or inactivation of the electrode 440, and hence the switching on and switching off or thus connection and disconnection between the inversion region 442 in the substrate to the charge accumulation region 430, a suitable pixel controller 480 may be provided. In particular, the pixel controller 480 may be suitably programmed for applying the right potential, e.g., voltage signals, to the electrode 440. Such connection and disconnection are preferably both performed during a readout cycle of the pixel element 400.

The pixel controller 480 can include and/or be any suitable hardware and/or software for controlling the pixel element 400 as described herein (e.g., by selectively varying the voltage applied to the electrode 440 to selectively vary the charge capacity of the extended charge accumulation region 432). As examples, the controller 140 of the PBM 100 of FIG. 1 and/or the controller 250 of the PBM 200 of FIG. 2 can include and/or be the pixel controller 480.

The pixel element 400 also may comprise an output stage 450 configured to generate a charge signal representative of an amount of the electrical charge stored in the base charge accumulation region 430 and/or in the extended charge accumulation region 432. For example, the base charge accumulation region 430 and/or in the extended charge accumulation region 432, e.g., a floating diffusion region connected to the photosensitive element 420 or a depletion layer of the photosensitive element 420, may be connected to the gate of an output buffer amplifier, e.g., a charge to voltage amplifier such as a source follower.

Before readout of the pixel element 400, the base charge accumulation region 430 and/or in the extended charge accumulation region 432 may be reset, e.g., emptied of non-equilibrium charge carriers, for example by operating a reset switch 460 that opens a conductive path from the charge accumulation region 430 to a reference voltage supply. During an integration period, the voltage in the base charge accumulation region 430 and/or in the extended charge accumulation region 432 may change due to charge accumulation, and this change may be amplified by the output buffer amplifier for readout.

The variable capacity of the charge accumulation region enables the pixel element 400 to operate in two distinct operational modes: a high-sensitivity mode, in which the switchable capacitive element is switched off by applying a suitable high-gain mode electrode voltage to the electrode 440, and a low-sensitivity mode, in which the switchable capacitive element is switched on by applying a suitable low-gain mode electrode voltage to the electrode 440 that is different than the high-gain mode electrode voltage. In some examples, the high-sensitivity mode additionally or alternatively may be described as a high-gain mode and/or a high-gain channel of the pixel element 400. Similarly, in some examples, the low-sensitivity mode additionally or alternatively may be described as a low-gain mode and/or a low-gain channel of the pixel element 400. Accordingly, the pixel element 400 also may be referred to as a dual-gain pixel element 400.

The pixel controller 480 can be programmed and/or configured to selectively transition the pixel element 400 between the high-gain mode and the low-gain mode in any suitable manner. For example, and as shown in FIGS. 4A-4B, the pixel element 400 can be described as including a tunable capacitive element 444, and the pixel controller 480 can be programmed and/or configured to selectively vary a capacitance of the tunable capacitive element 444 to transition the pixel element 400 between the high-gain mode and the low-gain mode.

In some examples, such as in the example of FIGS. 4A-4B, the tunable capacitive element 444 is formed by the electrode 440 and the semiconductor substrate 410. Accordingly, in some examples, the pixel controller 480 additionally or alternatively can be programmed and/or configured to selectively apply a suitable voltage to the electrode 440 (e.g., the high-gain mode electrode voltage or the low-gain mode electrode voltage) to transition the pixel element 400 between the high-gain mode and the low-gain mode.

While FIGS. 4A-4B illustrate the pixel controller 480 as being separate and/or disconnected from the output stage 450, this is not required. For example, it also is within the scope of the present disclosure that the pixel controller 480 can be a component of a controller (e.g., the controller 140 and/or the controller 250) that additionally receives a signal form the output stage 450.

The pixel element 400 thus may be used in applications where an image sensor needs to capture a high dynamic range of incident intensities within an acquired image. Specifically, the pixel element 400 may be described as having multiple linear ranges respectively associated with the sensitivity and/or gain modes thereof, e.g., each with a realistic dynamic range, e.g., 2,500:1.

Furthermore, a gain factor may be implemented between these ranges, e.g., between every pair selected from these ranges, so that the ratio between the illumination level corresponding to saturation in the lowest gain range and the noise equivalent illumination level in the highest gain range, represents a dynamic range that is higher than 2,500:1, for example in the order of 10,000:1, or in the order of 100, 000:1, or even higher. This gain factor between ranges may be obtained by a tunable capacitive element, e.g., a programmable MOS capacitor, that is placed in parallel to the floating diffusion and/or in parallel to the photodiode. This tunable capacitive element may be controlled, for example, by first collecting all photo charges in the large-valued capacitor, and then reducing the capacitance value by changing the MOS gate voltage.

The pixel calibration concepts and methods disclosed herein also may be applied to other examples of pixel elements that may be characterized by high-gain and low-gain operational modes. For example, during readout of a row of pixel elements in an image sensor that uses an array of pixel elements arranged in rows and columns, the signal of each pixel can be connected to a column line through a source follower and a row select transistor. The column lines can serve as the input to amplifiers, such as through a sample and hold circuit. For each column, the signal can be routed to two or more amplifiers to obtain a high-gain and a low-gain reading of the pixel signal. The outputs of the amplifiers can be connected to one or more ADCs, such as through a multiplexer. For each column, two analog-to-digital conversions can be obtained, such as using specific high-gain and low-gain amplifiers or by using an amplifier with switchable gain.

As another example, in a charge-coupled device (CCD), the charge of each pixel element is shifted to a read-out node where the voltage representing the pixel signal is measured. Such an output node may be regarded as being analogous to the FD node 330 of the pixel element 300 shown in FIG. 3. Accordingly, reading a signal on the output node of a CCD can be performed two or more times to obtain a high-gain signal and a low-gain signal.

As additionally will be appreciated by one of ordinary skill in the art, the pixel design principles and concepts disclosed herein can be applied to any suitable pixel orientation, such as back-side illuminated pixel elements and/or front-side illuminated pixel elements.

Further examples of pixel elements, dual-gain pixel elements, and/or image sensors comprising such pixel elements are disclosed in U.S. Pat. Nos. 9,699,398, 9,780,138, 9,819,882, and 10,497,737, the complete disclosures of which are incorporated by reference herein.

To enhance the performance of a dual-gain pixel element, it is instructive to consider the sources of noise that will affect a measured signal produced by a pixel element (e.g., the pixel element 300 and/or the pixel element 400). Let $P_\gamma$ represent the raw electromagnetic signal that is incident upon the radiation-sensitive element (e.g., a number of photons collected within an integration time interval that are of sufficient energy to generate an electron within the radiation-sensitive element) and let Q represent the quantum efficiency representing the proportion of incident photons that generate electrons within the pixel element. The signal generated within the pixel element (represented as a number of electrons) is thus $P_e=QP_\gamma$.

The incidence of the photons upon the radiation-sensitive element may be represented as a Poisson process, such that the number of photons arriving within a time interval is subject to noise in the form of photon shot noise. The magnitude $S_\gamma$ of the photon shot noise may be represented as $S_\gamma=\sqrt{P_\gamma}$, and thus the magnitude of the shot noise $S_e$ associated with the number of electrons generated within the pixel element is thus given by $S_e=Q\sqrt{P_\gamma}$.

As used herein, the term "raw," as used to describe an electromagnetic signal (e.g., an optical signal and/or a photon beam), is intended to refer to a signal that is characterized by photon shot noise in this manner. In this manner, a "raw" electromagnetic signal may be contrasted with a photon beam that is generated by an intermediate component such as a scintillator and in which the Poisson statistics pertain to the random arrivals of particles at the scintillator rather than to the random arrivals of photons at the radiation-sensitive element.

As used herein, terms such as "electromagnetic signal," "optical signal," "photon beam," and the like may be used interchangeably to describe a signal and/or a beam that comprises electromagnetic radiation and/or a series of photons.

As used herein, the term "magnitude," as used to characterize a signal, may represent any suitable characteristic of the signal, such as a root-mean-square (RMS) amplitude of the signal.

As used herein, terms such as "calibrate," "calibrated," and the like may be used to refer to one or more properties of a pixel element (e.g., a PBM-calibrated dual-gain pixel element as disclosed herein) that are particularly suited for a particular use and/or application. For example, a PBM-calibrated dual-gain pixel element according to the present disclosure may be particularly suited for use in conjunction with a PBM (e.g., the PBM 200) and/or a PBM image sensor (e.g., a sensor of the TEM camera 230). As another example, an optical-calibrated pixel element according to the present disclosure may be particularly suited for use in conjunction with an optical microscope and/or an optical image sensor thereof. In some examples, a PBM-calibrated dual-gain pixel element also may be described as being a PBM-optimized dual-gain pixel element. Such descriptions are not intended to be limiting, however, and it is within the scope of the present disclosure that a device and/or component may be described as being "calibrated" even when the performance of the device and/or component is not strictly perfect, ideal, or optimal. Instead, terms such as "calibrated" are intended simply to connote relative suitability for the stated purpose and/or application.

In some examples, and as described in more detail herein, a pixel element such as the PBM-calibrated dual-gain pixel element may be described as being "calibrated" for a particular application as a result of a manner in which the pixel element is operated. For example, a PBM-calibrated dual-gain pixel element according to the present disclosure may be substantially structurally similar to the pixel element 300 of FIG. 3, but may be calibrated for use in conjunction with a PBM as a result of a configuration of the charge storage device 380. As another example, a PBM-calibrated dual-gain pixel element according to the present disclosure may be substantially structurally similar to the pixel element 400 of FIGS. 4A-4B, but may be calibrated for use in conjunction with a PBM as a result of a manner in which a voltage is applied to the electrode 440 during operative use of the pixel element.

The number of electrons generated within the pixel element in an integration time interval and/or the measurement of this number also will be affected by a dark noise contribution. In particular, such a dark noise contribution can include dark noise arising from the amplification circuit and/or the ADC that receive the charge signal from the pixel element. Such a dark noise contribution also can include dark noise corresponding to electrons that are spontaneously generated within the radiation-sensitive element and/or that spontaneously migrate to the charge accumulation region from the semiconductor substrate. As another example, the dark noise contribution can be at least partially based upon a dark current, which can introduce uncertainty in the number of electrons generated in the pixel element as a result of Poisson noise within the pixel element. Such a dark current can be especially significant at longer exposure times (e.g., greater than 5 seconds).

In some examples, such as in the pixel element 400, the pixel element can introduce a dark noise contribution in the form of reset noise (e.g., kTC noise). In such examples, such reset noise can be at least partially compensated by obtaining additional dark signal samples, such as via correlated double sampling.

The magnitude D of this dark noise signal generally can depend on the temperature of the pixel element and/or on the dynamic range characterizing the mode in which the pixel element operates. This mode-specific dynamic range can in turn be characterized as the ratio of the maximum signal magnitude detectable by the pixel element in a given mode (e.g., the charge capacity of the pixel element in the given mode) to the magnitude of the noise signal generated by the pixel element when no photons are received at the radiation-sensitive element (e.g., the dark noise magnitude D).

For a given pixel element and/or a given mode thereof, the charge capacity may be selectively chosen and/or configured (e.g., as described above in the context of the pixel element 400), while the dynamic range may be a property of the amplifier circuit and/or associated materials. Thus, for the purposes of this discussion, it generally is sufficient to model the magnitude of the dark noise of a given operational mode as a fixed proportion of the charge capacity of the given operational mode, with a constant of proportionality relating the charge capacity to the dark noise magnitude being equal (or at least substantially equal) to the dynamic range of the given operational mode.

As used herein, the term "mode," as used to characterize a pixel element and/or a portion and/or operational regime thereof, may be used to describe any suitable property and/or component(s) of the pixel element. For example, when the pixel element is the pixel element 400 discussed above, the term "mode" may refer to either of the high-sensitivity mode or the low-sensitivity mode discussed above.

Additionally or alternatively, a pixel element may be described as comprising a high-gain channel with a total charge capacity $C_H$ and an associated dark noise magnitude $D_H$ and a low-gain channel with a total charge capacity $C_L$ and an associated dark noise magnitude $D_L$. In particular, the high-gain channel dark noise magnitude $D_H$ and the low-gain channel dark noise magnitude $D_L$ can represent input referenced noise levels that represent the magnitude of the dark noise (which can depend on factors external to the pixel element) relative to the corresponding input signal.

In some examples, such as in the examples of the pixel element 300 and the pixel element 400 discussed above, the high-gain channel and the low-gain channel may correspond to the high-sensitivity mode and the low-sensitivity mode, respectively. Additionally or alternatively, the high-gain channel and the low-gain channel may refer to the use of respective capacitors (or capacitive elements) that produce different respective total charge capacities.

In a representative example, a pixel element can comprise a high-gain channel with a total charge capacity $C_H$=10,000 electrons (e) and a low-gain channel with a total charge capacity $C_L$=125,000 $e^-$, with each channel exhibiting a respective dynamic range of 2,500:1. The dark noise magnitudes of the high-gain channel and the low-gain channel are thus $D_H$=4 $e^-$ and $D_L$=50 $e^-$, respectively.

In some examples, the channel that is most suitable for readout of the accumulated charge of the pixel element is based on the total charge that is accumulated in the pixel element (e.g., in the charge accumulation region). For example, when the accumulated charge is less than the high-gain channel total charge capacity, either of the high-gain channel or the low-gain channel can be used alone to measure the accumulated charge. Because the high-gain channel typically has a lower dark noise magnitude than the low-gain channel, measuring the accumulated charge with the high-gain channel alone in such an example enables a measurement with a higher signal-to-noise ratio (SNR) than would be achieved by measuring the same accumulated charge with the low-gain channel alone.

Alternatively, when the accumulated charge exceeds the high-gain channel charge capacity, the high-gain channel itself cannot accurately represent the actual accumulated charge magnitude. In such an example, the high-gain channel may be described as being "saturated." Such an accumulated charge magnitude can, however, be measured by the low-gain channel, provided that the accumulated charge is less than the low-gain channel charge capacity.

Accordingly, a suitable method of performing a readout of the accumulated charge the pixel element using the high-gain channel and/or the low-gain channel can enable the measurement of a signal of any magnitude between the high-gain channel noise floor of $D_H$ and the total charge capacity of the low-gain channel. For example, the readout of a pixel element can include first recording (e.g., with the output stage 350 of the pixel element 300 or with the output stage 450 of the pixel element 400) the accumulated charge with the pixel element in the low-sensitivity mode of operation (e.g., with the electrode 440 of the pixel element 400 suitably biased to produce the inversion region 442) and subsequently recording the accumulated charge with the pixel element in the high-sensitivity mode of operation. This sequence is not required, however, and it additionally is within the scope of the present disclosure that the pixel readout may be performed by operating the pixel element in the high-sensitivity mode and/or the low sensitivity mode in any suitable sequence.

In the representative example discussed herein, any accumulated charge magnitude between the noise floor $D_H$ of the high-gain channel and the total charge capacity $C_L$ of the low-gain channel thus may be accurately recorded, and the pixel element thus may be described as exhibiting a total dynamic range of $C_L/D_H$=31,250:1.

For simplicity, the dual-gain pixel element may be characterized by a ratio R that represents the ratio of the total charge capacity of the low-gain channel to the total charge capacity of the high-gain channel. For example, in the representative example discussed above, R=12.5:1. For increasing values of R, the total dynamic range of the dual-gain pixel element increases at the expense of amplifying the effect of the dark noise of the low-gain channel. To configure such a dual-gain pixel element to enhance and/or maximize the total dynamic range of the pixel element, a skilled artisan must balance these competing effects. In particular, balancing these effects may comprise configuring each channel such the SNR characterizing the low-gain channel is no more than a threshold proportion of the SNR characterizing the high-gain channel at the signal level at which the high-gain channel is saturated.

For a given photon signal magnitude $P_\gamma$ incident upon the pixel element, the associated noise power $N^2$ for each channel may be written as $$N_{H,L}(P_\gamma)^2 = S_e(P_\gamma)^2 + D_{H,L}^2 = Q^2 P_\gamma + D_{H,L}^2,$$

and the SNR $\Omega$ for each channel may be written as $$\Omega_{H,L}(P_\gamma) = \frac{P_e(P_\gamma)}{N_{H,L}(P_\gamma)} = \frac{QP_\gamma}{\sqrt{Q^2 P_\gamma + D_{H,L}^2}} = \frac{P_\gamma}{\sqrt{P_\gamma + \left(\frac{D_{H,L}}{Q}\right)^2}}.$$

Figure 5A:
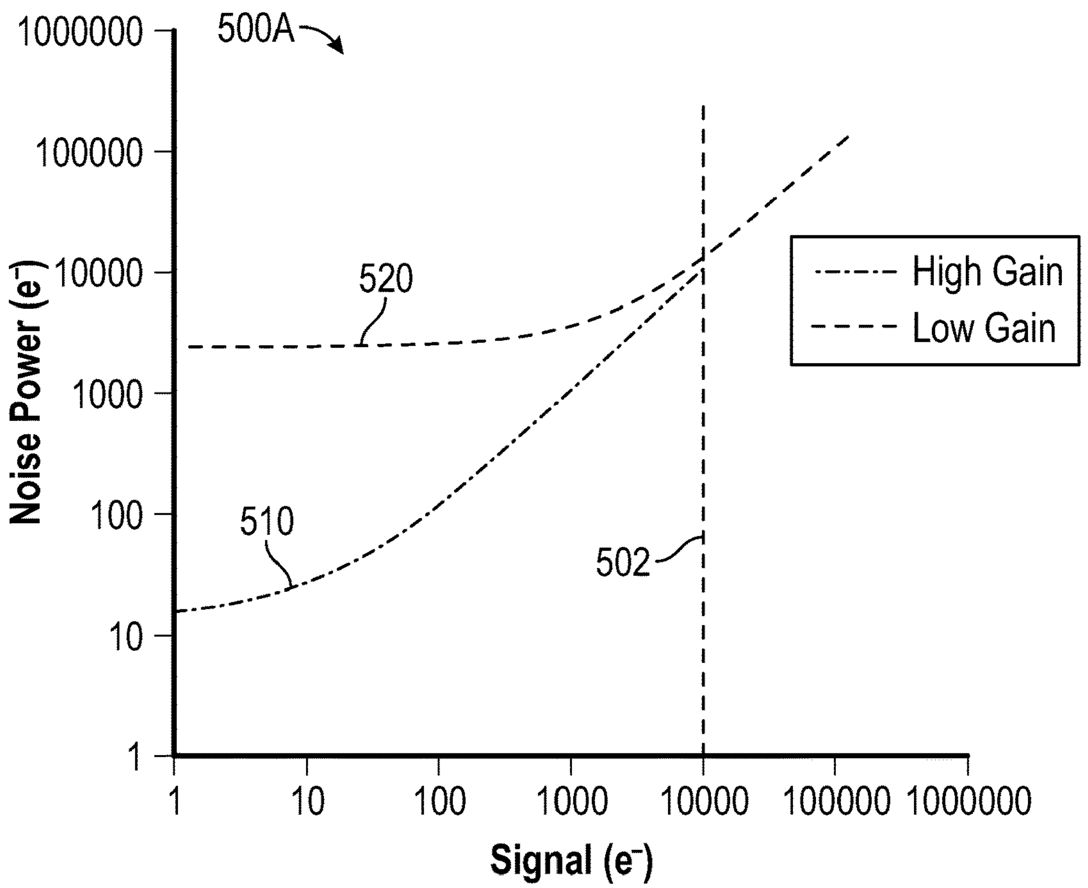
FIG. 5A is a logarithmic graph representing a signal-dependent noise power of a high gain channel and of a low gain channel of a calibrated pixel element that receives an electromagnetic signal according to an example.

For small photon signal magnitudes, the noise power of each channel is dominated by the dark noise magnitude, and the SNR is correspondingly small. For large photon signal magnitudes, the noise power of each channel is dominated by the photon shot noise and is proportional to the square root of the signal magnitude. These trends are shown in FIG. 5A, which is a logarithmic plot representing the noise power $N(P_\gamma)^2$ as a function of the signal $P_\gamma$ for each of the high-gain channel and the low-gain channel. As shown in FIG. 5A, each of the high-gain noise power 510 and the low-gain noise power 520 is generally constant (e.g., horizontal) for small values of $P_\gamma$ and transitions to a power-law trend at higher values of $P_\gamma$.

As shown in FIG. 5A, it generally is desirable to configure the dual-gain pixel element (e.g., through proper selection of the ratio R) such that the low-gain noise power curve 520 is nearly continuous with the high-gain noise power curve 510 at the signal 502 corresponding to the high-gain channel charge capacity $C_H$. Because these two curves will only be perfectly coincident at the signal 502 when the curves are perfectly coincident over the full range of $P_\gamma$ (i.e., when R=1), it is necessary to determine an acceptable degree of deviation between these curves.

Figure 5B:
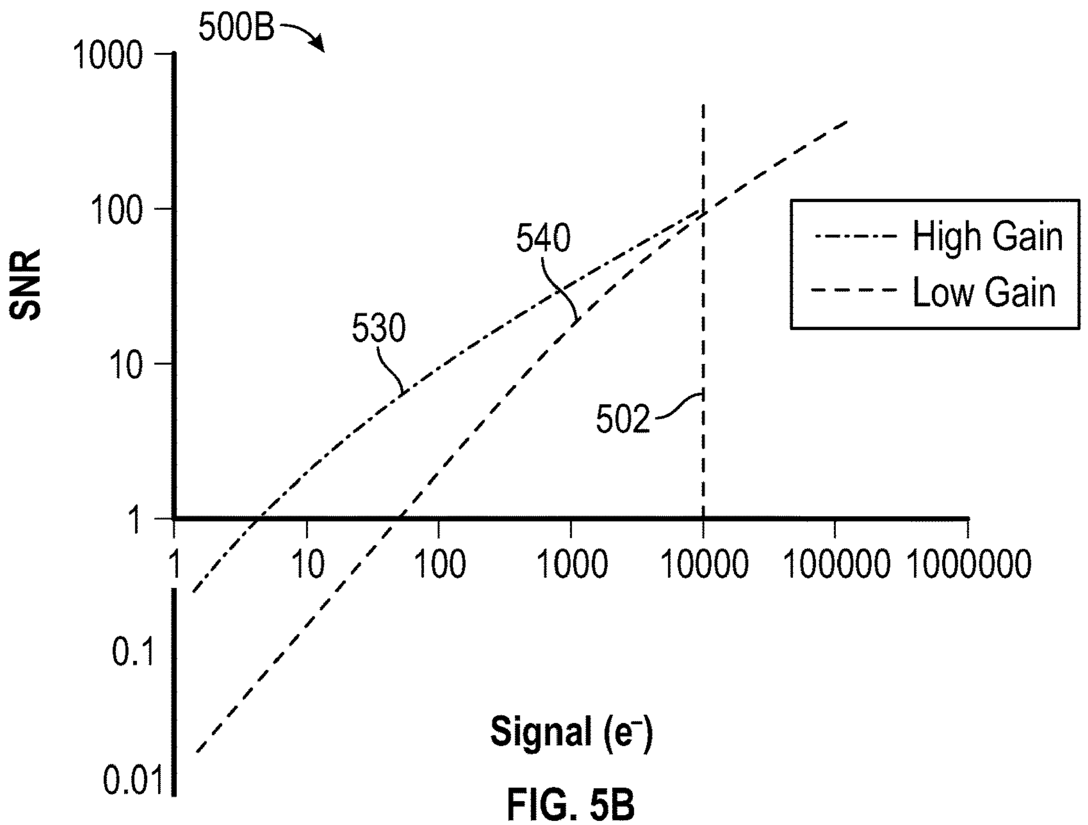
FIG. 5B is a logarithmic graph representing a signal-dependent signal-to-noise ratio of the high gain channel and of the low gain channel of the calibrated pixel element of FIG. 5A.
Figure 5C:
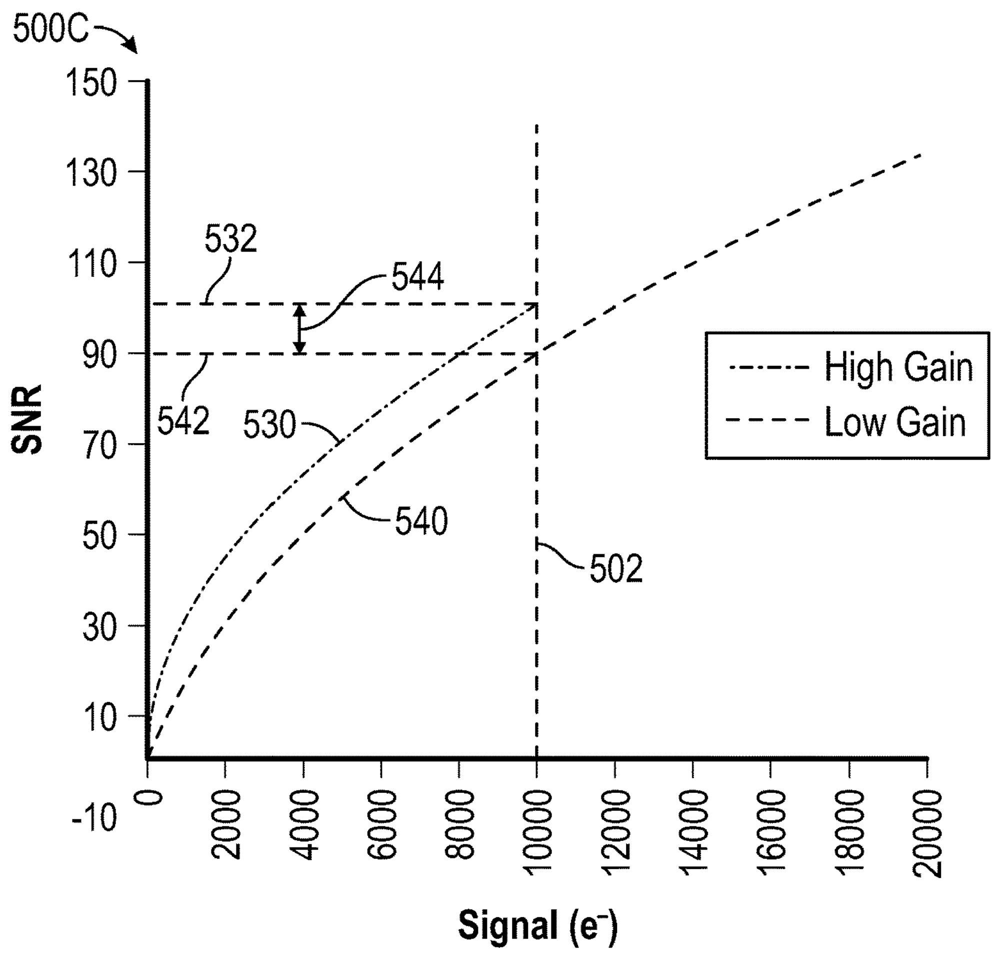
FIG. 5C is a linear graph representing the signal-to-noise ratios shown in FIG. 5B.

To characterize the acceptable deviation between the curves 510 and 520, it is instructive to consider the SNRs of each channel, illustrated on logarithmic axes in FIG. 5B and illustrated on linear axes in FIG. 5C. As shown in FIG. 5C, the SNR 432 of the high-gain channel at the signal 502 exceeds the SNR 542 of the low-gain channel at the signal 502 by a SNR difference (α) 544, which in turn may be characterized as a proportion of the SNR 432: $\alpha=\Delta\Omega/\Omega_H$, where $\Delta\Omega=\Omega_H-\Omega_L$ at the signal level corresponding to saturation of the high-gain channel. Combining this expression with the SNR expression shown above, it can be seen that, in general, $$\alpha = 1 - \frac{\sqrt{C_H + \left(\frac{D_H}{Q}\right)^2}}{\sqrt{C_H + \left(\frac{D_L}{Q}\right)^2}}.$$

In the example of FIGS. 5A-5C, α=10.49%. (In considering the example of FIGS. 5A-5C, it is assumed for simplicity that Q=1 in the formula above.) As used herein, the quantity α may be referred to as a normalized crossover noise offset. In this representative example, the dual-gain pixel element may be described as being calibrated for receiving a raw electromagnetic signal (e.g., an optical signal), and thus may be described as an optical-calibrated dual-gain pixel element.

Figure 6A:
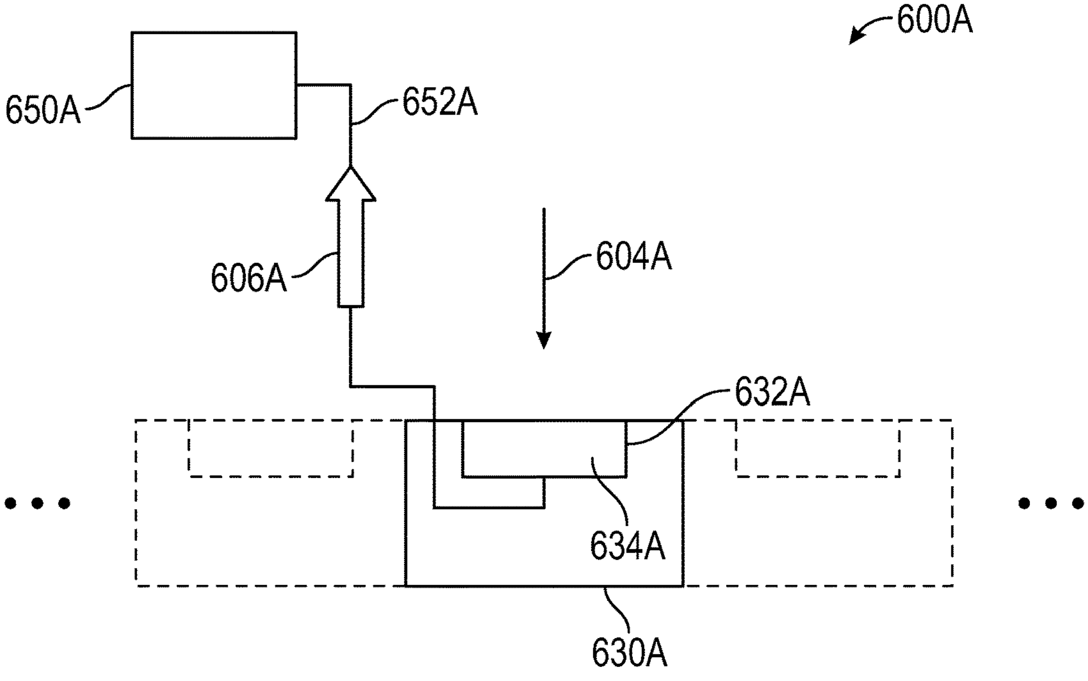
FIG. 6A is a schematic representation of a pixel element that receives a photon beam according to an example.

The above analysis pertains to examples in which the photons incident upon the pixel element represent the raw signal to be measured. FIG. 6A is a highly schematic representation of such an example. Specifically, FIG. 6A illustrates an image sensor 600A in which a photon beam 604A is incident upon a photoreceptor 632A of a pixel element 630A and thereby produces a generated charge 634A within the pixel element 630A. The pixel element 630A subsequently generates and transmits a pixel charge signal 606A to a pixel controller 650A via a control line 652A. In some examples (e.g., depending upon the configuration of the operational modes thereof), the pixel element 630A also may be an example of an optical-calibrated dual-gain pixel element 630A.

Figure 6B:
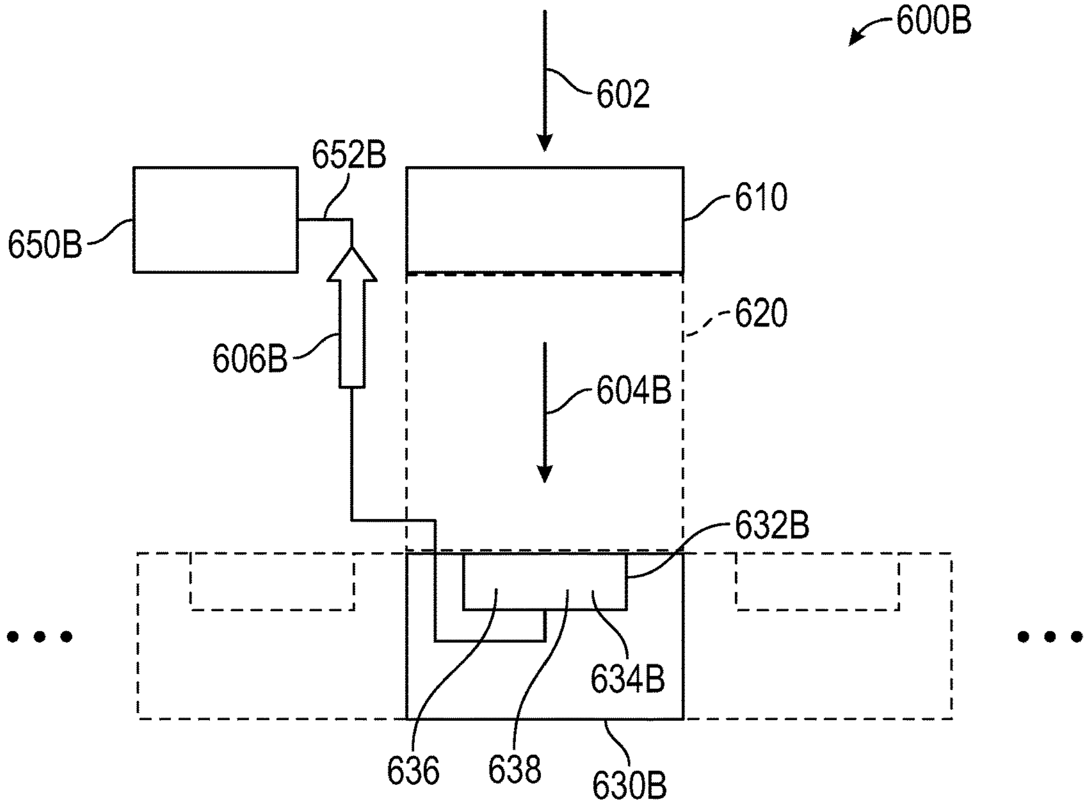
FIG. 6B is a schematic representation of a pixel element that receives a photon beam that is generated by a scintillator according to an example.

In the case of an image sensor for a PBM, however, the raw signal to be imaged may correspond to a particle beam (e.g., an electron beam or another beam of corpuscular and/or quantized particles) rather than a continuous electromagnetic signal. For example, FIG. 6B schematically illustrates a PBM image sensor 600B with a pixel element 630B that generates and transmits a pixel charge signal 606B to a pixel controller 650B via a control line 652A that represents a magnitude of a particle beam 602. In this example, the PBM image sensor 600B comprises a scintillator 610 that receives the particle beam 602 and generates a photon beam 604B, which subsequently is incident upon a photoreceptor 632B of the pixel element 630B to produce a generated charge 634B.

In some examples, and as illustrated in FIG. 6B, the PBM image sensor 600B further comprises a waveguide 620 that directs the photon beam 604B from the scintillator 610 to the photoreceptor 632B. The PBM image sensor 600B can, for example, represent an image sensor of the TEM camera 230 discussed above in the context of FIG. 2. Additionally or alternatively, the pixel element 630B can represent the pixel element 132 of the PBM 100 discussed above in the context of FIG. 1, the pixel element 300 discussed above in the context of FIG. 3, and/or the pixel element 400 discussed above in the context of FIGS. 4A-4B.

The waveguide 620 can include and/or be any suitable structure for conveying and/or directing the photon beam 604B from the scintillator 610 to the photoreceptor 632B. As examples, the waveguide 620 can include and/or be an optical fiber, a fiber optic bundle, a fiber optic plate, and/or a fiber faceplate. Additionally or alternatively, the PBM image sensor 600B and/or the waveguide 620 can include a lens system and/or other optical elements such as apertures, attenuators, etc. For simplicity, it is to be understood that the scintillator 610 schematically represented in FIG. 6B comprises a scintillator and/or any other suitable components known to the art for generating an electromagnetic signal from a particle beam.

In some examples, and as schematically illustrated in FIG. 6B, the pixel element 630B can be described as comprising a high-gain channel 636 and a low-gain channel 638. Accordingly, in such examples, the pixel element 630B also may be referred to as a dual-gain pixel element 630B. In an example in which the high-gain channel 636 and/or the low-gain channel 638 are calibrated as disclosed herein, the pixel element 630B also may be referred to as a PBM-calibrated dual-gain pixel element 630B.

The operation of the scintillator 610 may be characterized in any of a variety of manners. In some examples, the operation of the scintillator 610 is characterized by the average number β of photons that are generated by the scintillator 610 for each primary electron (pe) that is incident upon the scintillator 610 from the particle beam 602. In the present disclosure, β may be referred to as an average photon conversion rate.

Additionally or alternatively, the operation of the scintillator 610 can be characterized by the average number (3' of charge carriers (e.g., electrons) that are generated in the pixel element 630B for each primary electron that is incident upon the scintillator 610 from the particle beam 602. For example, in an idealized system in which every photon generated by the scintillator 610 is received at the pixel element 630B and results in the generation of a corresponding charge carrier, β=β'.

In practice, however, any of a variety of factors can lead to the number of charge carriers generated in the pixel element 630B being smaller than the number of photons generated by the scintillator 610. In particular, one may write $\beta'=\kappa\beta$, where $\kappa<1$ is a quantity that represents the cumulative effect of factors that diminish the total number of charge carriers generated in the pixel element 630B relative to the number of photons generated by the pixel element 630B. As examples, κ can represent the cumulative effect of factors such as a quantum efficiency of charge generation in the pixel element 630B, a transfer efficiency of photons in the waveguide 620, a fill factor characterizing a sensitive area of the pixel element 630B, etc. In the present disclosure, β' can be referred to as an average charge carrier conversion rate.

For the purposes of this discussion, it is assumed that the particle beam 602 is a charged particle beam, such as an electron beam. This is not required, however, and it additionally is within the scope of the present disclosure that the particle beam 602 can comprise any suitable particles and/or corpuscular entities, such as high-energy photons (e.g., X-ray photons). Accordingly, the scintillator 610 generally may be described as operating to produce photons responsive to each such particle arriving at the scintillator. In this manner, the average photon conversion rate R may be described as representing the average number of photons produced by the scintillator for each primary particle that is incident upon the scintillator. As used herein, the term "primary particle" thus may refer to any suitable particle (e.g., of a beam of such particles), such as electrons, ions, high-energy photons, etc., that can cause the scintillator to generate photons as described herein.

Additionally, while the present disclosure generally relates to examples in which a particle beam is incident upon a scintillator, this is not required. For example, in other examples, the particle beam can be incident upon the pixel element itself or a related component in such a manner that each particle of the particle beam can generate multiple charge carriers in the pixel element. This may be the case, for example, in a direct detection scheme, such as in a TEM system or in a STEM system in which the pixel element is a direct electron detector that receives primary electrons. As another example, this may be the case when the particle beam includes a beam of high-energy photons, such as X-ray photons.

In such examples, operation of the pixel element still can be characterized in terms of the average charge carrier conversion rate (3', which in such examples can be defined as the average number of charge carriers generated in the pixel element for each particle of the particle beam that is incident upon the pixel element (or upon an area of another component corresponding to the pixel element). Accordingly, in the following discussions, it is to be understood that the quantity (3' can be used to characterize the charge generation statistics of any system in which multiple charge carriers are generated for each incident particle.

In this manner, the average charge carrier conversion rate (3' can be defined more generally as the average number of charge carriers that are generated in the pixel element (e.g., a radiation-sensitive element thereof) for each particle of the particle beam that is incident upon and/or received by an area corresponding to the pixel element. Such an area can include and/or be an area of the radiation-sensitive element, an area of a scintillator, an area of a fiber optic plate and/or faceplate, etc. that corresponds to the pixel element.

In the case of the PBM image sensor 600B, the pixel element 630B again exhibits dark noise associated with each of the high-gain and the low-gain channel, but the shot noise is properly understood as pertaining to the arrival of electrons in the electron beam 602.

In analogy to the above analysis, let $P_{pe}$ represent the raw electron beam signal that is incident upon the scintillator 610 (e.g., the number of primary electrons arriving at the scintillator 610 within an integration time interval), let $P_\gamma=\beta P_{pe}$ represent the number of photons generated by the scintillator 610 within the integration time interval, and let $P_e=\kappa P_\gamma=\beta' P_{pe}$ represent the signal generated within the pixel element 630B (represented as a number of electrons), where $\beta'=\kappa\beta$.

The incidence of the electrons upon the scintillator 610 may be modeled as a Poisson process, such that the number of electrons arriving within a time interval is subject to noise in the form of primary electron shot noise. The magnitude $S_{pe}$ of the primary electron shot noise may be represented as $S_{pe}=\sqrt{P_{pe}}$, and thus the magnitude of the shot noise $S_e$ associated with the number of electrons generated within the pixel element 630B is given by $S_e=\beta\sqrt{P_{pe}}$. That is, compared to the optical sensor of FIG. 6A and of the above analysis, the shot noise associated with the electrons generated within the pixel element is amplified by a factor of β'.

For a given primary electron signal magnitude $P_{pe}$ incident upon the scintillator 610, the associated noise power for each channel thus may be written as $$N_{H,L}(P_{pe})^2 = S_e(P_{pe})^2 + D_{H,L}^2 = \beta'^2 P_{pe} + D_{H,L}^2,$$

and the SNR Ω for each channel may be written as $$\Omega_{H,L}(P_{pe}) = \frac{P_e(P_{pe})}{N_{H,L}(P_{pe})} = \frac{\beta' P_{pe}}{\sqrt{\beta' 2 P_{pe} + D_{H,L}^2}} = \frac{P_{pe}}{\sqrt{P_{pe} + \left(\frac{D_{H,L}}{\beta'}\right)^2}}.$$

Comparing this expression to the corresponding expression for the SNR corresponding to a photon signal magnitude $P_\gamma$, it is seen that the expressions are identical in form aside from the dark noise magnitude being further diminished by a factor of β'. Stated differently, for the purposes of calculating a SNR, either channel of a dual-gain pixel element that receives an electromagnetic signal generated by a scintillator may be modeled as the equivalent channel of an equivalent pixel element that receives a raw electromagnetic signal with an effective signal strength $P'=P_{pe}$ and with an effective dark noise magnitude $D_{H,L}'=D_{H,L}/\beta'$. The effect of this analysis on the configuration of a dual-gain pixel element (e.g., the pixel element 630B) for a PBM image sensor (e.g., the PBM image sensor 600B) may be understood with reference to FIGS. 7A-8C. FIGS. 7A-8C represent the signal-dependent noise power (FIGS. 7A and 8A) and SNR (FIGS. 7B-7C and 8B-8C) of a dual-gain pixel element of a PBM image sensor that is used in conjunction with a scintillator (e.g., the scintillator 610) that generates a photon beam (e.g., the photon beam 604B) from a primary electron beam (e.g., the charged particle beam 602) at an average photon conversion rate such that the average charge carrier conversion rate is β'=33.33 electrons generated in the dual-gain pixel element per primary electron received at the scintillator.

Figure 7A:
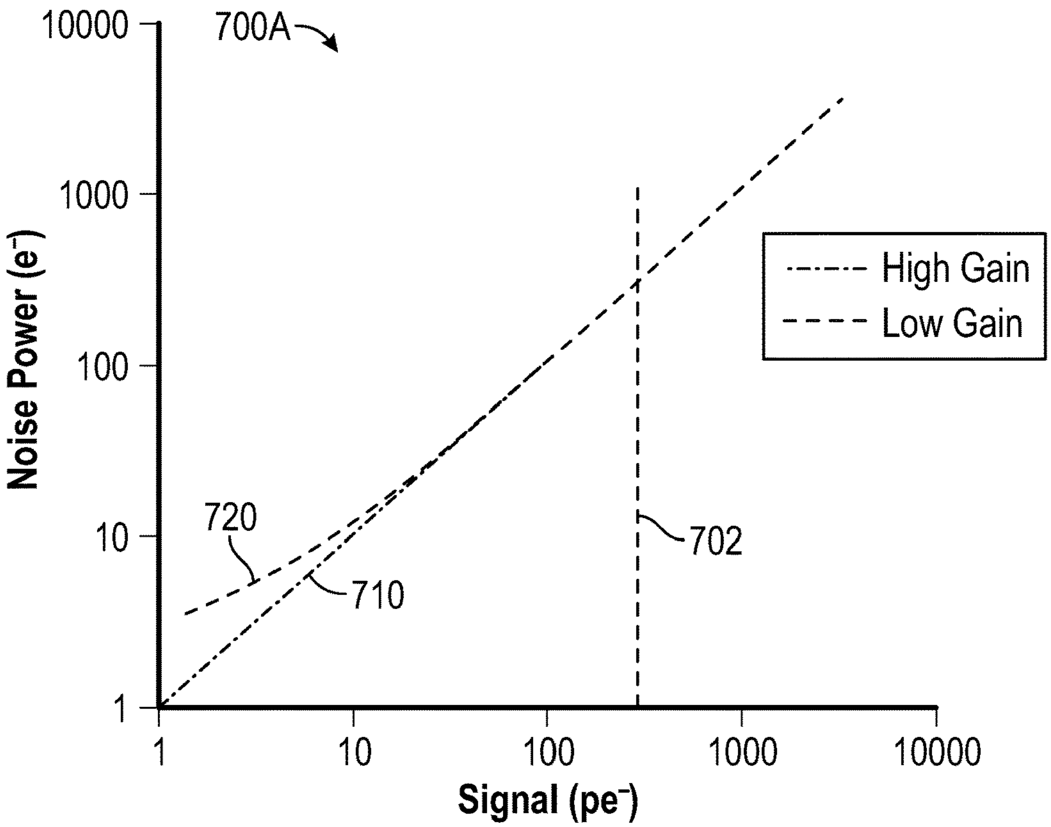
FIG. 7A is a logarithmic graph representing a signal-dependent noise power of a high gain channel and of a low gain channel of an uncalibrated pixel element that receives an electromagnetic signal that is generated by a scintillator according to an example.
Figure 7B:
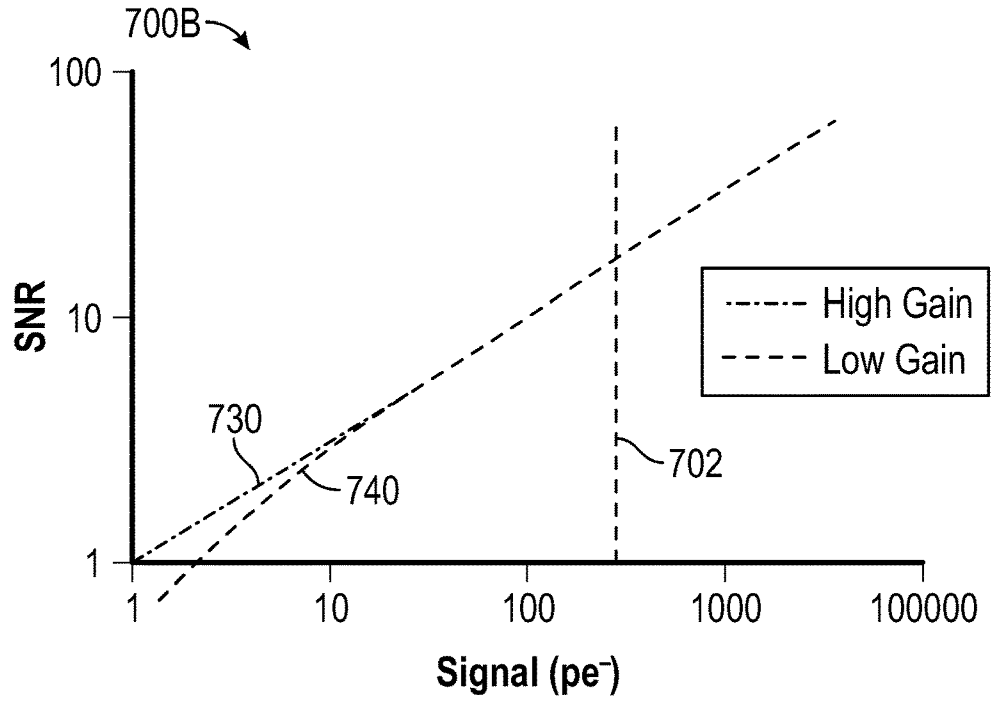
FIG. 7B is a logarithmic graph representing a signal-dependent signal-to-noise ratio of the high gain channel and of the low gain channel of the uncalibrated pixel element of FIG. 7A.
Figure 7C:
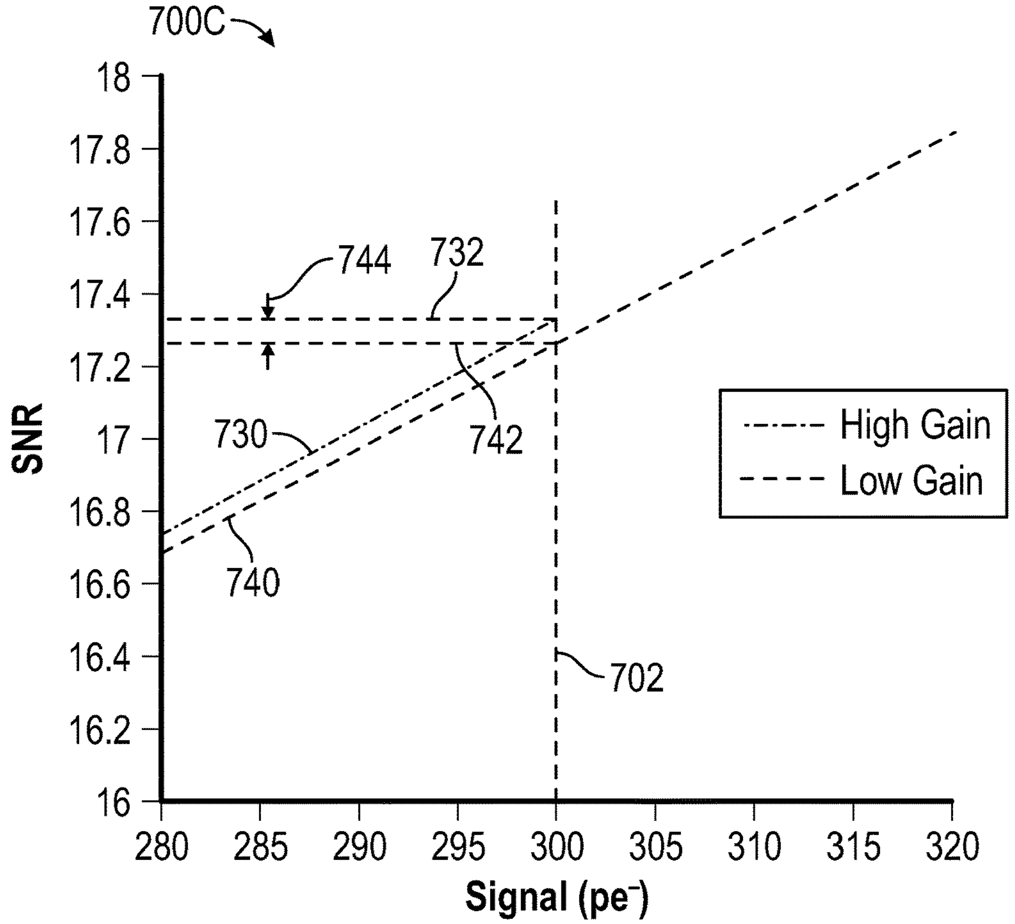
FIG. 7C is a linear graph representing the signal-to-noise ratios shown in FIG. 7B.

FIGS. 7A-7C represent the signal-dependent noise power and SNR of an example of a dual-gain pixel element that is configured identically to the representative example discussed above in the context of an optical-calibrated dual-gain pixel element. In particular, FIGS. 7A-7C correspond to an example in which $C_H$=10,000 $e^-$, $C_L$=125,000 $e^-$, $D_H$=4 $e^-$, and $D_L$=50 $e^-$, such that R=12.5. Comparing FIG. 7A to FIG. 5A, it is seen that the introduction of the scintillator has the effect of diminishing the dark noise contribution to such an extent that the (primary electron) shot noise is the dominant noise source across nearly the full range of primary electron signal amplitudes. As a result, in the example of FIGS. 7A-7C, the respective noise powers and the respective SNRs exhibited by the high-gain channel and the low-gain channel are nearly identical to one another at the crossover signal level 702 corresponding to saturation of the high-gain channel. More specifically, and as shown in FIG. 7C, the SNR ($\Omega_H$) 732 of the high-gain channel at the crossover signal level 702 exceeds the SNR ($\Omega_L$) 742 of the low-gain channel at the crossover signal level 702 by a SNR difference (Mi) 744. In the example of FIGS. 7A-7C, the quantity $\alpha=\Delta\Omega/\Omega_H$ is 0.371%.

The similarity between the respective noise powers of the high-gain and the low-gain channels in the example of FIGS. 7A-7C indicates that the total dynamic range of the dual-gain pixel element can be increased further, such as by configuring the low-gain channel to feature a larger total charge capacity $C_L$, without compromising the acceptable noise characteristics of the pixel element. This charge capacity $C_L$—or, more generally, the ratio $R=C_L/C_H$—may be enhanced by imposing the condition that the quantity a assume a known and/or preferred value. For example, let $\rho=\Omega_H(P_C)/\Omega_L(P_C)$ be the ratio of the SNRs of the high-gain channel and the low-gain channel at the primary electron signal level $P_C$ corresponding to saturation of the high-gain channel. In the present disclosure, the quantity ρ may be described as a crossover SNR ratio. One then may write $$\Omega_H = \rho\Omega_L$$

$$\frac{P_c}{\sqrt{P_c + \left(\frac{D_H}{\beta'}\right)^2}} = \frac{\rho P_c}{\sqrt{P_c + \left(\frac{D_L}{\beta'}\right)^2}}$$

$$D_L = \beta' \sqrt{P_C(\rho^2 - 1) + \left(\frac{\rho D_H}{\beta'}\right)^2}.$$

Selecting the condition that $\alpha=10.49\%$ corresponds to $\rho=(1-\alpha)^{-b\ 1}=1.117$; inserting this value into the above expression with $\beta'=33.33$, $P_C=300$ primary electrons, and $D_H=4$ electrons, one obtains $D_L=287.8$ electrons. Assuming that the low-gain channel again has a gain of 2,500:1, this dark noise magnitude corresponds to $C_L=719{,}400$ electrons, which will be obtained at a primary electron signal level of $P_{pe}=C_L/\beta'=21{,}580$ primary electrons. The condition that $\alpha=10.49\%$ thus is achieved at a ratio $R=C_L/C_H=71.95$, which in turn corresponds to a total dynamic range of the dual-gain pixel of $C_L/D_H=179{,}900$, or nearly six times the total dynamic range of the optical-calibrated dual-gain pixel element discussed above.

In this example, the dual-gain pixel element that is represented by these properties may be described as a PBM-calibrated dual-gain pixel element and/or as a TEM-calibrated dual-gain pixel element. It should be noted, however, that these properties are not universal, and that the values of quantities such as R will depend upon the value of β' specific to a given TEM image sensor as well as the value of α that is deemed to be acceptable and/or optimal for a given application.

Figure 8A:
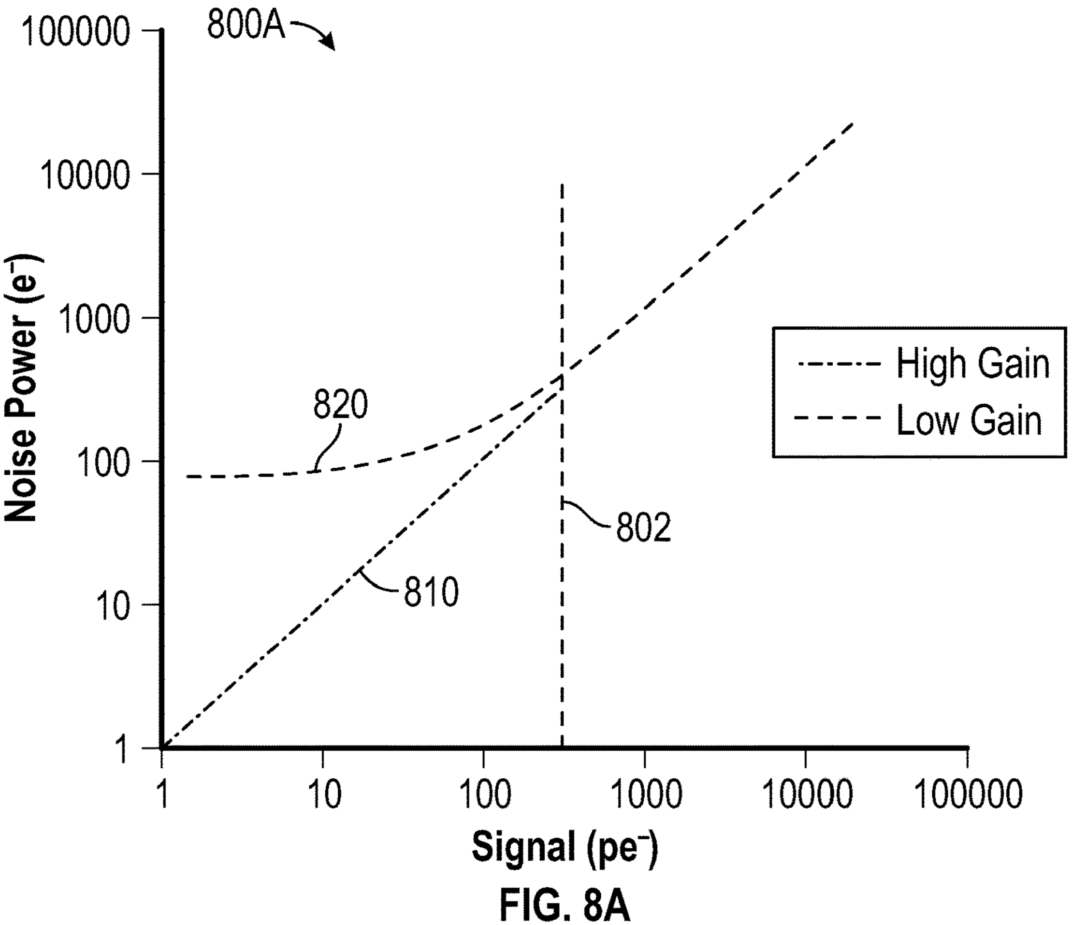
FIG. 8A is a logarithmic graph representing a signal-dependent noise power of a high gain channel and of a low gain channel of a calibrated pixel element that receives an electromagnetic signal that is generated by a scintillator according to an example.
Figure 8B:
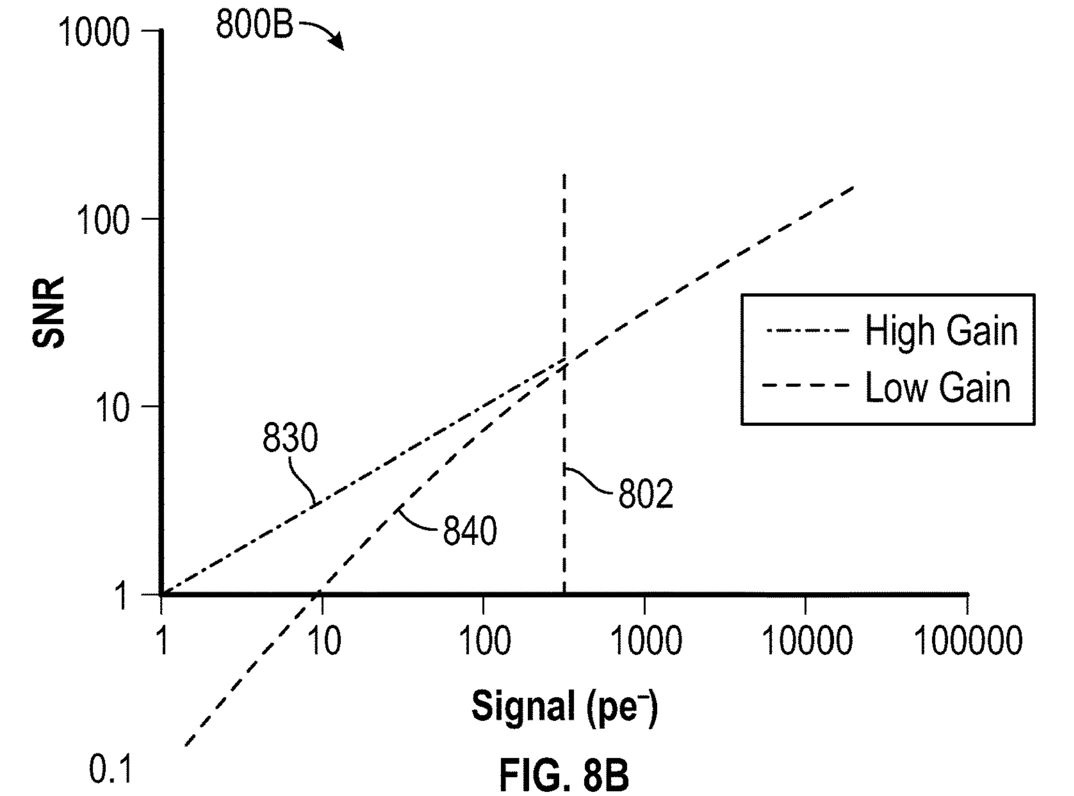
FIG. 8B is a logarithmic graph representing a signal-dependent signal-to-noise ratio of the high gain channel and of the low gain channel of the calibrated pixel element of FIG. 8A.
Figure 8C:
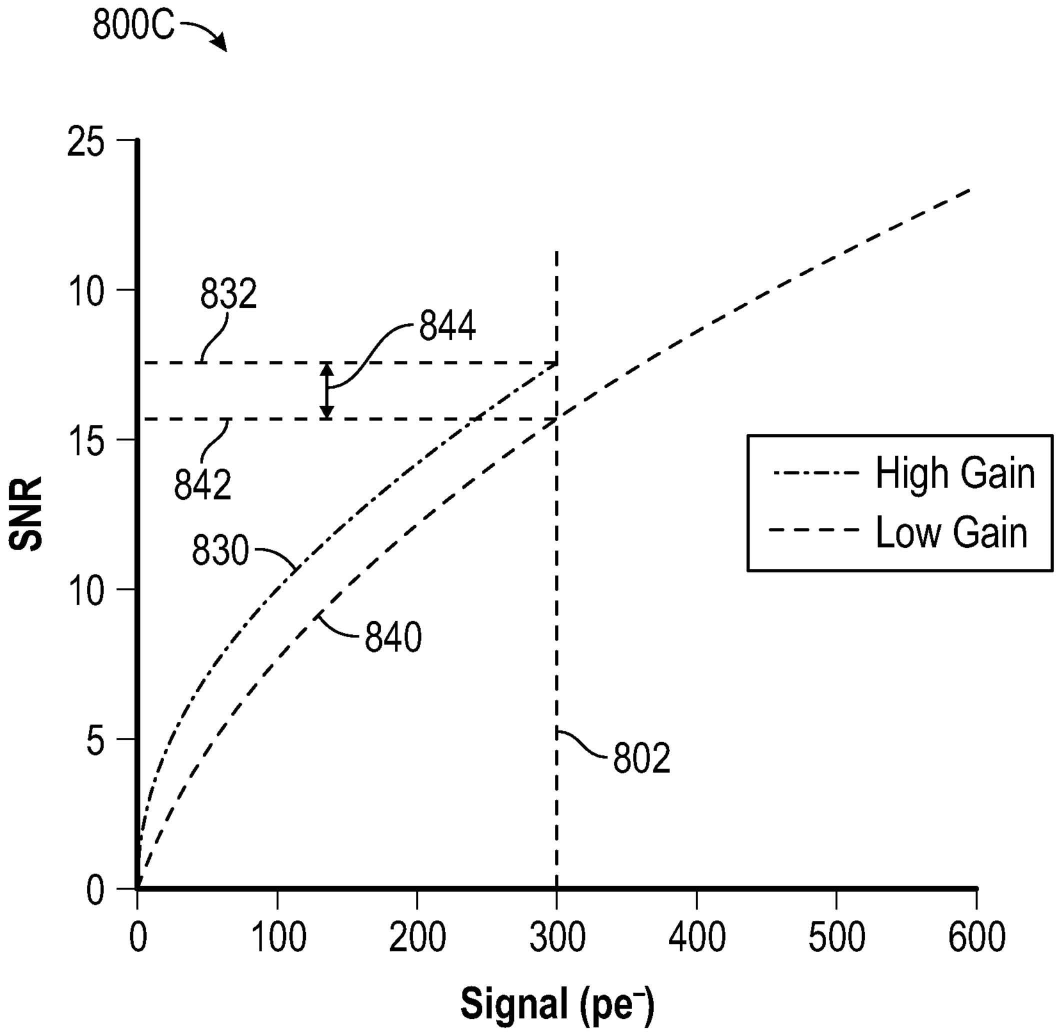
FIG. 8C is a linear graph representing the signal-to-noise ratios shown in FIG. 8B.

FIGS. 8A-8C represent the signal-dependent noise power and SNR of an example of a dual-gain pixel element that is calibrated according to the present disclosure. In particular, FIGS. 8A-8C correspond to an example in which $C_H=10{,}000\ e^-$, $C_L=719{,}400\ e^-$, $D_H=4\ e^-$, and $D_L=287.8\ e^-$, such that $R=71.95$.

Aside from the numerical values of noise power, signal-to-noise-ratio, and signal amplitude, the curves shown in FIGS. 8A-8C are qualitatively similar to those shown in FIGS. 5A-5C, respectively. This similarity reflects the fact that the relative properties of the high-gain and low-gain channels of the pixel element represented in FIGS. 8A-8C were selected such that the two channels of this pixel element exhibits similar relative noise properties as the corresponding channels of the calibrated optical pixel element represented in FIGS. 5A-5C. Comparing FIG. 8C to FIG. 5C additionally emphasizes the effect of the scintillator in amplifying the impact of the shot noise relative to the dark noise, as it is seen that the numerical values of the SNRs exhibited by each channel are significantly lower in the calibrated TEM pixel element relative to the corresponding properties of the calibrated optical pixel element discussed above.

While the above derivation pertains to an example in which the total dynamic range of the dual-gain pixel element is determined based upon a target normalized crossover noise offset $\alpha=10.49\%$, it additionally is within the scope of the present disclosure that a PBM-calibrated dual-gain pixel element need not be specifically configured with reference to such a quantity. Stated differently, a dual-gain pixel element that exhibits functional properties (e.g., low-gain and/or high-gain charge capacities, etc.) that yield an enhanced total dynamic range in the manner disclosed herein may be regarded as falling under the scope of the present disclosure even when such a configuration is not a direct result having determined a target normalized crossover noise offset as described herein. In this manner, dual-gain pixel elements exhibiting the dynamic range properties described herein may be regarded as pixel elements according to the present disclosure regardless of the specific calculations performed in the design and/or operation of such pixel elements.

Accordingly, a PBM-calibrated dual-gain pixel element according to the present disclosure can exhibit any of a variety of total dynamic ranges, such as a total dynamic range that is at least 50,000:1, at least 100,000:1, at least 150,000:1, at least 200,000:1, at least 500,000:1, at least 1,000,000:1, at least 1,500,000:1, at most 2,000,000:1, at most 1,250,000:1, at most 750,000:1, at most 300,000:1, at most 175,000:1, at most 125,000:1, and/or at most 75,000:1.

Additionally or alternatively, a PBM-calibrated dual-gain pixel element according to the present disclosure can comprise a high-gain channel and a low-gain channel with respective properties (e.g., respective dark noise magnitudes, respective charge capacities, etc.) such that the normalized crossover noise offset α is at least 2%, at least 5%, at least 10%, at least 15%, at least 20%, at least 25%, at least 30%, at most 40%, at most 27%, at most 22%, at most 17%, at most 12%, at most 7%, and/or at most 3%.

Additionally or alternatively, a PBM-calibrated dual-gain pixel element according to the present disclosure can comprise a high-gain channel with a high-gain channel charge capacity $C_H$ and a low-gain channel with a low-gain channel charge capacity $C_L$ such that the ratio $R=C_L/C_H$ is at least 30:1, at least 50:1, at least 100:1, at least 150:1, at most 200:1, at most 125:1, at most 75:1, and/or at most 40:1.

Additionally or alternatively, a PBM-calibrated dual-gain pixel element according to the present disclosure can comprise a low-gain channel that exhibits a SNR $\Omega_L$ at a crossover signal strength $P_C$ corresponding to the high-gain channel charge capacity that is at least 5:1, at least 10:1, at least 15:1, at least 20:1, at least 25:1, at least 30:1, at least 40:1, at most 50:1, at most 35:1, at most 27:1, at most 22:1, at most 17:1, at most 12:1, and/or at most 7:1.

As discussed herein, the enhanced total dynamic range of the PBM-calibrated dual-gain pixel element 630B is achieved via the recognition that the effect of the scintillator 610 is to amplify the shot noise associated with the particle beam 602 incident upon the scintillator 610 by factor corresponding to the average charge carrier conversion rate β'. As a result, the relative impact of the dark noise magnitude of each channel is correspondingly diminished, enabling the low-gain channel 638 to be configured with a higher dark noise magnitude than in an optical-calibrated dual-gain pixel element.

In this manner, design aspects that can enable the enhanced total dynamic range of dual-gain pixel elements according to some disclosed examples may be dependent upon the type of the detected input (e.g., the nature of the particle beam). Such calibrations thus may need to consider the form of the entire detection system, including the sensor, the scintillator, and any other associated optical and/or electrical connections such as a waveguide positioned between the sensor and the scintillator.

Calibration principles described herein additionally or alternatively may be applied to other processes for obtaining signals from pixel elements with a high dynamic range. As an example, frame summing can be used to enhance the effective dynamic range of a pixel element that exhibits only a single gain channel (e.g., a high gain channel). As a representative example, a high-gain pixel element may have a charge capacity corresponding to a primary electron signal level of 300 electrons. In such an example, the pixel element may be used to record an exposure corresponding to a particle beam intensity of (for example) 22,000 primary electrons per pixel element with an exposure time of 15 milliseconds (ms). To do so, the high-gain pixel element can be used to record a series of 22,000/300≈73 sequential frames whose respective signals can be summed.

Though such frame summing effectively increases the charge capacity of the high-gain pixel element, this comes at the cost of increased exposure time (requiring 15 ms/frame 73 frames=1.1 s). Additionally, summing these frames also sums the dark noise contributions of each frame, diminishing the total effective dynamic range by a factor of the square root of the number of frames summed. Moreover, to avoid saturation of the pixel element, a beam current of the particle beam may need to be reduced to a value that is difficult to set in practical applications.

As another example, multiple non-identical exposures also can be used to record an exposure corresponding to a beam intensity in excess of a pixel element's high-gain capacity. For example, a dual exposure process for recording an image with the high-gain pixel element and particle beam intensity discussed above can include recording a first, high-gain exposure with an exposure time of 1.1 s followed by a second, low-gain exposure with an exposure time of 15 ms. If the signal received at the pixel element corresponds to the maximum particle beam intensity, the second exposure alone can accurately reflect the signal strength without saturation of the pixel element, at the expense of a diminished SNR. If the signal received at the pixel element during the first exposure is sufficiently weak to avoid saturation of the pixel element in this exposure interval, such a signal can be accurately measured with a relatively high SNR (e.g., relative to the second exposure).

As a variation of the dual exposure process described above, the low-gain part of the signal can be acquired in a frame summing mode. In particular, recording a dual exposure of a signal that is close to and greater than the high-gain capacity of the pixel element can result in a SNR that is significantly smaller than the SNR of an exposure corresponding to a signal that is close to and less than the high-gain capacity of the pixel element. This discontinuity in the relationship between SNR and signal intensity can be mitigated and/or resolved, however, by capturing a signal with a magnitude in excess of the high-gain capacity using frame summing. In particular, this may result in bringing the signal-dependent SNRs of the high-gain and low-gain measurements into closer alignment in a manner similar to that described above in the context of dual-gain pixel elements.

Using such frame summing techniques with a dual-gain pixel element according to the present disclosure, however, can enable recording signals with even higher dynamic ranges than those corresponding to a single exposure frame. For example, if a dual-gain pixel element with a single-frame total dynamic range of 180,000:1 is operated in a frame summing mode to capture 73 exposure frames in the manner described above, the total dynamic range of such an exposure can be (180,000:1) sqrt(73 frames)=1,500,000:1.

As discussed above in the context of the pixel element 300, time gating also can be used to yield very short integration time intervals. Accordingly, time gating techniques also can be applied to the frame summing techniques described above, such as to avoid saturation of the pixel element even at very high dose rates and/or particle beam intensities of the incident particle beam. Accordingly, time gating in combination with frame summing may obviate the need to decrease the beam current of the particle beam to avoid pixel saturation.

While the examples discussed herein generally pertain to examples in which the scintillator operates to generate photons at an average photon conversion rate such that the average charge carrier conversion rate β'=33.33, this is not required, and it additionally is within the scope of the present disclosure that the PBM-calibrated dual-gain pixel element can operate in conjunction with any suitable scintillator. As examples, the PBM-calibrated dual-gain pixel element can be used in conjunction with a scintillator that generates photons at an average photon conversion rate such that the average charge carrier conversion rate β' is at least 10, at least 20, at least 30, at least 50, at least 100, at most 200, at most 75, at most 40, at most 25, and/or at most 15.

As discussed above, the average charge carrier conversion rate β' can be related to the photon conversion rate β characterizing the scintillator by the relation β'=κβ. The quantity κ can assume any of a variety of values quantifying the system including the scintillator and the pixel element, such as at least 0.01, at least 0.05, at least 0.1, at least 0.15, at least 0.2, at least 0.3, at most 0.5, at most 0.25, at most 0.17, at most 0.12, at most 0.07, and/or at most 0.02. Additionally, or alternatively, PBM-calibrated dual-gain pixel element can be used in conjunction with a scintillator characterized by an average photon conversion rate β that is at least 10, at least 50, at least 100, at least 150, at least 200, at least 300, at least 500, at most 1000, at most 400, at most 250, at most 175, at most 125, at most 75, and/or at most 25.

Additionally, in some examples, the average photon conversion rate characterizing the scintillator can be at least partially based upon a beam energy of the particle beam. Accordingly, in the calibration techniques described herein, the values of β and/or β' may be at least partially based upon the beam energy used as well as on the properties (e.g., intrinsic properties) of the scintillator.

Figure 9:
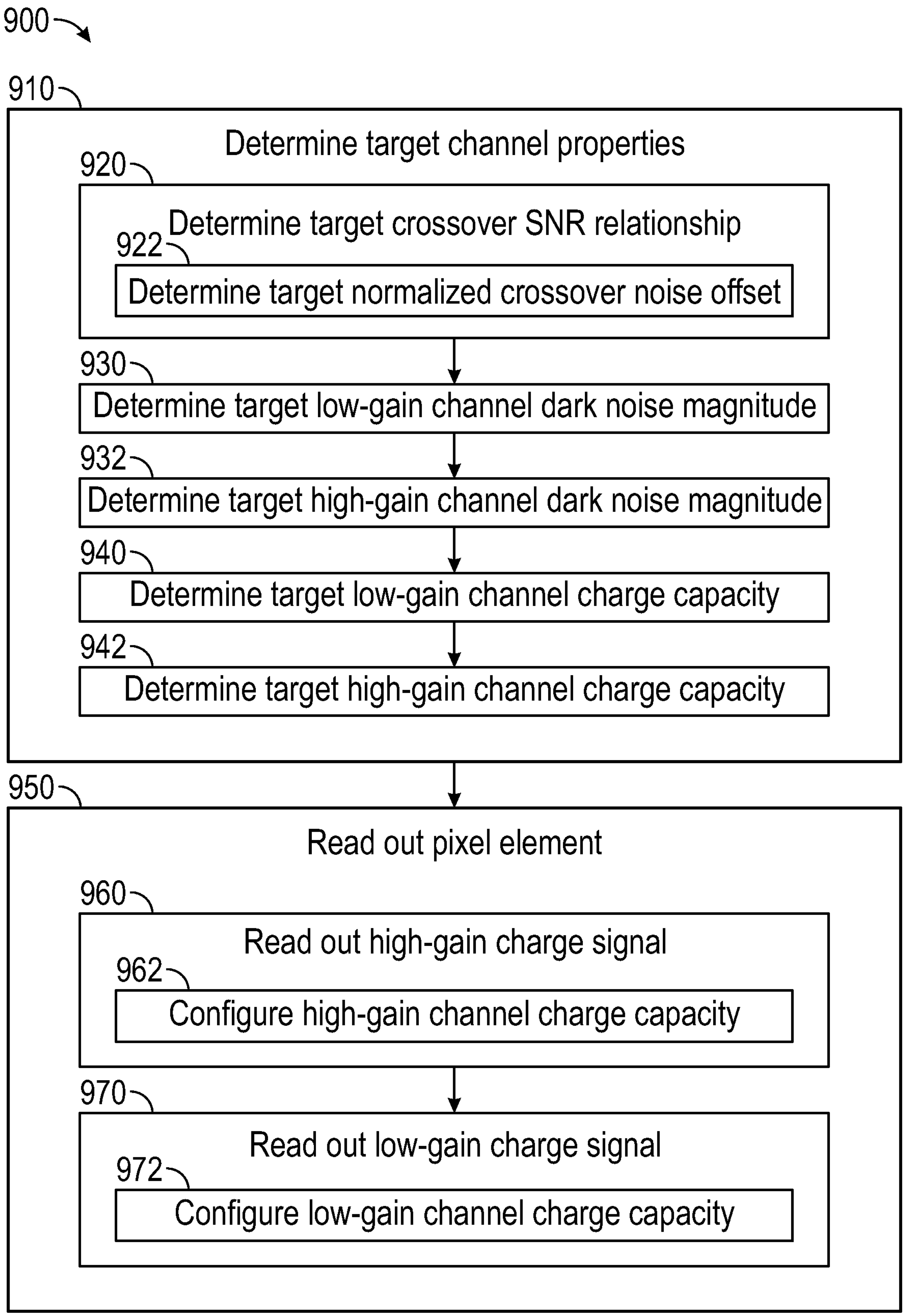
FIG. 9 is a flowchart depicting examples of methods of operating a PBM-calibrated dual-gain pixel element according to the present disclosure.

FIG. 9 is a flowchart depicting an example of a method 900 of operating a pixel element (e.g., the pixel element 132, the pixel element 300, the pixel element 400, and/or the PBM-calibrated dual-gain pixel element 630B), such as may be used in a PBM (e.g., the PBM 100 and/or the PBM 200). In particular, the method 900 generally pertains to a method of operating a dual-gain pixel element of an image sensor (e.g., the sensor 130, the PBM image sensor 600B, and/or an image sensor of the TEM camera 230) that receives an electromagnetic signal (e.g., the photon beam 604B) that is generated by a scintillator (e.g., the scintillator 610). The scintillator in turn generates the electromagnetic signal (e.g., the photon beam 604B) responsive to a particle beam (e.g., an electron beam, the auxiliary charged particle beam 122, and/or the particle beam 602) at an average photon conversion rate β as discussed herein. The electromagnetic signal generated by the scintillator can generate charge carriers (e.g., electrons) in the dual-gain pixel element at an average charge carrier conversion rate $\beta'=\kappa\beta$ as discussed herein.

As discussed herein, the pixel element can include a high-gain channel (e.g., the high-gain channel 636) and a low-gain channel (e.g., the low-gain channel 638). In particular, the pixel element can be described as operating in and/or utilizing the high-gain channel when in the high-gain mode, and/or the pixel element can be described as operating in and/or utilizing the low-gain channel when in the low-gain mode. When the pixel element is in the high-gain mode, a signal obtained by reading out the pixel element (e.g., via the output stage 350 or the output stage 450) can be referred to as a high-gain charge signal. Similarly, when the pixel element is in the low-gain mode, a signal obtained by reading out the pixel element (e.g., via the output stage 350 or the output stage 450) can be referred to as a low-gain charge signal.

As discussed herein, each of the high-gain channel and the low-gain channel may be characterized by a charge capacity thereof. In particular, the high-gain channel may be characterized by a high-gain channel charge capacity (such as the charge capacity $C_H$ discussed herein) and/or the low-gain channel may be characterized by a low-gain channel charge capacity (such as the charge capacity $C_L$ discussed herein). In such examples, each of the high-gain channel charge capacity and the low-gain channel charge capacity may be measured and/or represented as a maximum number of charge carriers (e.g., electrons) that may be stored in the respective channel to be read out by the pixel element and/or the associated image sensor.

Each of the high-gain channel charge capacity and/or the low-gain channel charge capacity may be configured and/or determined in any suitable manner. In some examples, the high-gain channel charge capacity and/or the low-gain channel charge capacity corresponds to a capacitance of a portion of the pixel element when operating in the high-gain mode and/or the low-gain mode, respectively. Additionally or alternatively, in some examples, the high-gain channel charge capacity and/or the low-gain channel charge capacity is independently configurable. For example, in the example of the pixel element 300, the low-gain charge capacity can be configured via appropriate selection and/or configuration of the capacitors of the charge storage device 380. As additional examples, the high-gain charge capacity and/or the low-gain charge capacity of the pixel element 300 and/or the pixel element 400 may be configurable via suitable selection of a material property of at least a portion of the pixel element, suitable selection of a capacitance of a component of the pixel element (e.g., the tunable capacitive element 444 of the pixel element 400), suitable selection of a voltage applied to an electrode (e.g., the voltage applied to the electrode 440 of the pixel element 400), etc.

As discussed herein, each of the high-gain channel and the low-gain channel additionally may be characterized by a respective characteristic dark noise magnitude thereof. In particular, the high-gain channel and/or the high-gain charge signal may be characterized by a high-gain channel dark noise magnitude (such as the dark noise magnitude $D_H$ discussed herein). Similarly, the low-gain channel and/or the low-gain charge signal may be characterized by a low-gain channel dark noise magnitude (such as the dark noise magnitude $D_L$ discussed herein). In such examples, each of the high-gain channel dark noise magnitude and the low-gain channel dark noise magnitude may be measured and/or represented as a characteristic noise magnitude and/or amplitude that is measured by the pixel element when no charges are generated by electromagnetic signals incident upon the pixel element. As such, each of the high-gain channel dark noise magnitude and/or the low-gain channel dark noise magnitude may be represented as a number of charge carriers (e.g., electrons), and/or may be represented as a suitably averaged noise magnitude (e.g., an RMS noise magnitude).

As shown in FIG. 9, the method 900 comprises reading out, at 950, the pixel element. In particular, the reading out the pixel element at 950 comprises reading out, at 960, the high-gain channel charge signal and/or reading out, at 970, the low-gain channel charge signal. The reading out the pixel element at 950, the reading out the high-gain channel charge signal at 960, and/or the reading out the low-gain channel charge signal at 970 each can be performed with any suitable controller, such as the controller 140 of the PBM 100, the controller 250 of the PBM 200, the pixel controller 480 of the pixel element 400, and/or the pixel controller 650B of the image sensor 600B.

In some examples, and as shown in FIG. 9, the reading out the high-gain charge signal at 960 comprises configuring, at 962 and with the controller, the high-gain channel charge capacity of the pixel element in the high-gain mode. Additionally or alternatively, in some examples, and as shown in FIG. 9, the reading out the low-gain charge signal at 970 comprises configuring, at 972 and with the controller, the low-gain channel charge capacity of the pixel element in the low-gain mode.

As described in more detail herein, the configuring the high-gain channel charge capacity at 962 and/or the configuring the low-gain channel charge capacity at 972 can be performed such that pixel element has a total dynamic range that is significantly greater than that of a similar pixel element that is calibrated for receiving a raw optical signal. For example, in some examples, the configuring the high-gain channel charge capacity at 962 and/or the configuring the low-gain channel charge capacity at 972 includes configuring such that a total dynamic range of the pixel element, defined as the ratio of the low-gain channel charge capacity to the high-gain channel dark noise magnitude, is at least 50,000:1, at least 100,000:1, at least 150,000:1, at least 200,000:1, at least 500,000:1, at least 1,000,000:1, at least 1,500,000:1, at most 2,000,000:1, at most 1,250,000:1, at most 750,000:1, at most 300,000:1, at most 175,000:1, at most 125,000:1, and/or at most 75,000:1.

The reading out the pixel element at 950, the configuring the high-gain channel charge capacity at 962 and/or the configuring the low-gain channel charge capacity at 972 may be performed in any suitable manner to yield a desired total dynamic range. For example, the configuring the high-gain channel charge capacity at 962 and/or the configuring the low-gain channel charge capacity at 972 can comprise configuring such that the normalized crossover noise offset $\alpha=(\Omega_H-\Omega_L)/\Omega_H$ is at least 2%, at least 5%, at least 10%, at least 15%, at least 20%, at least 25%, at least 30%, at most 40%, at most 27%, at most 22%, at most 17%, at most 12%, at most 7%, and/or at most 3%.

Additionally or alternatively, the configuring the low-gain channel charge capacity at 972 can comprise configuring such that a target low-gain channel dark noise magnitude $D_L$ is substantially equal to the quantity $$D_L = \beta' \sqrt{P_C(\rho^2 - 1) + \left(\frac{\rho D_H}{\beta'}\right)^2}.$$

In this expression, β' represents the average charge carrier conversion rate characterizing the scintillator and/or other characteristics of the image sensor. $P_C$ represents a crossover signal strength of the electromagnetic signal at which the radiation-sensitive element generates an electric charge equal to the high-gain channel charge capacity. Additionally, $\rho=\Omega_H/\Omega_L$, where $\Omega_H$ is a signal-to-noise ratio of the high-gain charge signal at the crossover signal strength and $\Omega_L$ is the signal-to-noise ratio of the low-gain charge signal at the crossover signal strength, and $D_H$ represents a high-gain channel dark noise magnitude of the high-gain charge signal.

During the reading out the pixel element at 950, the reading out the high-gain channel charge signal at 960 and/or the reading out the low-gain channel charge signal at 970 each may be performed in any suitable manner. For example, the configuring the high-gain channel charge capacity at 962 and/or the configuring the low-gain channel charge capacity at 972 can comprise varying, with the controller, a capacitance of a tunable capacitive element (e.g., the tunable capacitive element 444 of the pixel element 400). As another example, the pixel element can comprise an electrode (e.g., the electrode 440 of the pixel element 400) that functions to vary a capacity of a charge accumulation region of the pixel element (e.g., the charge accumulation region 430). In such examples, the configuring the low-gain channel charge capacity at 972 can comprise using the controller to bring the electrode to a low-gain mode electrode voltage.

Additionally or alternatively, the configuring the high-gain channel charge capacity at 962 can comprise using the controller to bring the electrode to a high-gain mode electrode voltage. In such examples, the high-gain mode electrode voltage can be equal to, or approximately equal to, a ground voltage, such that the charge accumulation region is a base charge accumulation region (e.g., the base charge accumulation region 430). In such examples, the low-gain mode electrode voltage can have a magnitude that is greater than that of the high-gain mode electrode voltage, such that the charge accumulation region is an extended charge accumulation region (e.g., the extended charge accumulation region 432).

Additionally or alternatively, each of the configuring the high-gain channel charge capacity at 962 and/or the configuring the low-gain channel charge capacity at 972 can comprise selecting a circuit element (e.g., a passive circuit element and/or a capacitor) that exhibits a suitable capacitance as a component of the pixel element, such as to yield a target high-gain channel charge capacity and/or a target low-gain channel charge capacity as described below.

The reading out the high-gain charge signal at 960 and the reading out the low-gain charge signal at 970 can be performed in any suitable sequence during the reading out the pixel element at 950. For example, the reading out the high-gain charge signal at 960 can be performed prior to the reading out the low-gain charge signal at 970. As another example, the reading out the low-gain charge signal at 970 can be performed prior to the reading out the high-gain charge signal at 960.

In some examples, and as shown in FIG. 9, the method 900 also can comprise determining, at 910, one or more target channel properties of the high-gain channel and/or of the low-gain channel. In such examples, the reading out the high-gain channel charge signal at 960 and/or the configuring the high-gain channel charge capacity at 962 can be performed based, at least in part, on the target channel properties. Additionally or alternatively, the reading out the low-gain channel charge signal at 970 and/or the configuring the low-gain channel charge capacity at 972 can be performed based, at least in part, on the target channel properties.

The determining the one or more target channel properties at 910 can be performed, at least in part, with any suitable controller, such as the controller 140 of the PBM 100, the controller 250 of the PBM 200, the pixel controller 480 of the pixel element 400, and/or the pixel controller 650B of the image sensor 600B. Additionally or alternatively, one or more aspects and/or substeps of the determining the one or more target channel properties at 910 can be performed by a controller and/or computer other than those disclosed above and/or by a human user.

The determining the one or more target channel properties at 910 can include calculating, selecting, and/or otherwise determining any suitable parameters characterizing the operation of the pixel element. For example, and as discussed herein, each of the high-gain channel and the low-gain channel may be characterized by a respective dynamic range thereof. In particular, the high-gain channel may be characterized by a high-gain channel dynamic range $\Phi_H$ that is defined as the ratio of the high-gain channel charge capacity to the high-gain channel dark noise magnitude: $\Phi_H={}_CH/D_H$. Similarly, the low-gain channel may be characterized by a low-gain channel dynamic range $\Phi_L$ that is defined as the ratio of the low-gain channel charge capacity to the low-gain channel dark noise magnitude: $\Phi_L=C_L/D_L$.

In various examples, each of the high-gain channel dynamic range and the low-gain channel dynamic range is at least partially determined by one or more material properties of the pixel element and/or of an associated amplifier circuit. For example, while the total charge capacity of each channel may be selectively varied, such as via a tunable capacitive element associated with the channel, the associated noise properties may not be so readily controlled and/or selected. Thus, while it generally is desirable that each of the high-gain channel dynamic range and the low-gain channel dynamic range be as large as practically possible, it may not be possible and/or practical to select and/or configure such values arbitrarily. Instead, in practice, configuring the high-gain channel and/or the low-gain channel may comprise selectively configuring a charge capacity thereof (e.g., by selectively applying a voltage to an electrode that forms an inversion region in the pixel element and/or by configuring a capacitance of a charge storage device), and related properties such as the dark noise magnitude may be substantially dependent upon the selected charge capacity (e.g., via a substantially fixed dynamic range characteristic).

In some examples, one or more properties of the high-gain channel may be known and/or fixed, and the configuring the low-gain channel charge capacity at 972 may be based, at least in part, on one or more properties of the high-gain channel, such as the high-gain channel charge capacity and/or the high-gain channel dark noise magnitude. In particular, and as shown in FIG. 9, the determining the one or more target channel properties at 910 can comprise determining, at 920, a target crossover SNR relationship and/or determining, at 930, a target low-gain channel dark noise magnitude, either or both of which also may be performed based, at least in part, on one or both of the high-gain channel charge capacity and the high-gain channel dark noise magnitude. Accordingly, in such examples, the configuring the low-gain channel charge capacity at 972 can be based, at least in part, on the target crossover SNR relationship (as determined at 920) and/or the target low-gain channel dark noise magnitude (as determined at 930).

In some examples, and as shown in FIG. 9, the determining the one or more target channel properties at 910 additionally or alternatively comprises determining, at 940, a target low-gain channel charge capacity $C_L$. In particular, because the low-gain channel dark noise magnitude $D_L$ can be related to the low-gain channel charge capacity $C_L$ (e.g., via a substantially constant low-gain channel dynamic range $\Phi_L=C_L/D_L$), the determining the target low-gain channel dark noise magnitude at 930 and the determining the target low-gain channel charge capacity at 940 can be described as analogous steps.

As discussed above, the charge capacity of the pixel element can be related to and/or at least partially determined by a voltage applied to an electrode of the pixel element that selectively varies a charge capacity of a charge accumulation region of the pixel element. In particular, and as discussed above, the method 900 can comprise bringing the electrode to a low-gain mode electrode voltage while reading out the charge signal in the low-gain mode. Accordingly, in some examples, the determining the one or more target channel properties at 910 can comprise determining the low-gain mode electrode voltage to be applied to the electrode. In some examples, the determining the low-gain mode electrode voltage can be based, at least in part, on the target low-gain channel charge capacity. That is, in such examples, the low-gain mode electrode voltage can be determined and/or calculated such that applying the low-gain mode electrode voltage to the electrode causes the charge accumulation region to have a capacity equal to, or approximately equal to, the target low-gain channel charge capacity.

The determining the target crossover SNR relationship at 920 may be performed in any suitable manner and/or based on any suitable criteria. In particular, the determining the target crossover SNR relationship at 920 can comprise determining a target relationship between the high-gain channel SNR $\Omega_H$ and the low-gain channel SNR $\Omega_L$ as evaluated at the crossover signal level $P_C$ corresponding to saturation of the high-gain channel. As discussed herein, this relationship can be characterized by the normalized crossover noise offset $\alpha=(\Omega_H-\Omega_L)/\Omega_H$. In particular, and as discussed above, configuring the low-gain channel and/or the high-gain channel to exhibit a relatively high value of the normalized crossover noise offset can correlate to configuring the pixel element to have a relatively high total dynamic range at the expense of a diminished SNR for signals greater than P c.

Accordingly, in some examples, the determining the target crossover SNR relationship at 920 comprises determining, at 922, a target normalized crossover noise offset. In such examples, the determining the target normalized crossover noise offset at 922 can comprise determining (e.g., selecting) the target normalized crossover noise offset to be a maximum acceptable normalized crossover noise offset.

Such a determination in turn may be based upon any of a variety of considerations. For example, the determining the target normalized crossover noise offset at 922 can comprise selecting the target normalized crossover noise offset to be equal to, or approximately equal to, a corresponding normalized crossover noise offset characterizing a dual-gain pixel that is used in an optical image sensor, as discussed above. Additionally or alternatively, the determining the target normalized crossover noise offset at 922 can comprise selecting the target normalized crossover noise offset to be at least 2%, at least 5%, at least 10%, at least 15%, at least 20%, at least 25%, at least 30%, at most 40%, at most 27%, at most 22%, at most 17%, at most 12%, at most 7%, and/or at most 3%. Equivalently, the determining the target crossover SNR relationship at 922 can comprise determining any suitable relationship between $\Omega_H$ and $\Omega_L$ that corresponds to any of the aforementioned target normalized crossover noise offsets.

This is not required of all examples, however, and it additionally is within the scope of the present disclosure that the determining the target crossover SNR relationship at 922 can comprise determining and/or calculating any other suitable metric for comparing $\Omega_H$ and $\Omega_L$. As an example, and as discussed above, the relationship between $\Omega_H$ and $\Omega_L$ at the crossover signal level $P_C$ also may be characterized by the crossover SNR ratio ρ such that $\Omega_H=\rho\Omega_L$.

The determining the target low-gain channel dark noise magnitude at 930 also may be performed in any suitable manner based on any suitable criteria. For example, the determining the target low-gain channel dark noise magnitude at 930 can comprise calculating the target low-gain channel dark noise magnitude that will yield the target crossover SNR relationship (e.g., the target normalized crossover noise offset).

Additionally or alternatively, the determining the target low-gain channel dark noise magnitude at 930 and/or the determining the target low-gain channel charge capacity at 940 can comprise calculating based, at least in part, on a quantum efficiency Q characterizing the pixel element, the average photon conversion rate β characterizing the scintillator associated with the pixel element, the average charge carrier conversion rate β', the particle beam signal strength $P_C$ that corresponds to saturation of the high-gain channel, and/or the high-gain channel dark noise magnitude $D_H$. Specifically, in some examples, the determining the target low-gain channel dark noise magnitude ($D_L$) at 930 can comprise calculating the quantity $$D_L=\beta'\sqrt{P_C(\rho^2-1)+\left(\frac{\rho D_H}{\beta'}\right)^2}$$

(where $\rho=(1-\alpha)^{-1}$) as derived and discussed above. Additionally or alternatively, the determining the target low-gain channel dark noise magnitude at 930 and/or the determining the target low-gain channel charge capacity at 940 can comprise determining such that the determined target low-gain channel dark noise magnitude is substantially equal to a value as calculated via this equation.

In some examples, the configuring the low-gain channel charge capacity at 972 is based, at least in part, on the target low-gain channel dark noise magnitude. For example, and as discussed, the low-gain channel charge capacity $C_L$ can be related to the low-gain channel dark noise magnitude $D_L$ and the low-gain channel dynamic range $\Omega_L$ as $C_L=\Omega_L D_L$. Accordingly, in an example in which the low-gain channel dynamic range is known, the configuring the low-gain channel charge capacity at 972 can comprise configuring such that the low-gain channel charge capacity is substantially equal to the product of the low-gain channel dynamic range and the target low-gain channel charge dark noise magnitude.

While the present disclosure generally relates to examples in which the properties of the high-gain channel are given and/or fixed (e.g., not readily and/or selectively configurable), this is not required of all examples. For example, and as discussed above, it also is within the scope of the present disclosure that the method 900 additionally or alternatively can comprise the configuring the high-gain channel charge capacity at 962. Accordingly, in some examples, and as shown in FIG. 9, the determining the one or more target channel properties at 910 comprises determining, at 932, a target high-gain channel dark noise magnitude and/or determining, at 942, a target high-gain channel charge capacity. Thus, in such examples, the configuring the high-gain channel charge capacity at 962 can be based, at least in part, on the target high-gain channel dark noise magnitude and/or the target high-gain channel charge capacity. In some examples, either or both of the determining the target high-gain channel dark noise magnitude at 932 and/or the determining the target high-gain channel capacity at 942 also may be performed based, at least in part, on one or both of the low-gain channel charge capacity and the high-gain channel dark noise magnitude.

Similar to the determining the target low-gain channel dark noise magnitude at 930, the determining the target high-gain channel dark noise magnitude at 932 can comprise calculating the target high-gain channel dark noise magnitude that will yield the target normalized crossover noise offset. Additionally or alternatively, the determining the target high-gain channel dark noise magnitude at 932 can comprise determining based, at least in part, on the quantum efficiency Q characterizing the pixel element, the average photon conversion rate β characterizing the scintillator associated with the pixel element, the average charge carrier conversion rate β', the particle beam signal strength $P_C$ that corresponds to saturation of the high-gain channel, and/or the low-gain channel dark noise magnitude $D_L$. Specifically, in some examples, and in analogy to the above derivations and discussions, the determining the target high-gain channel dark noise magnitude ($D_H$) at 932 can comprise calculating the quantity $$D_H = \beta' \sqrt{P_c\left(\frac{1}{\rho^2} - 1\right) + \left(\frac{D_L}{\rho\beta'}\right)^2},$$

where $\rho=(1-\alpha)^{-1}$. Additionally or alternatively, the determining the target high-gain channel dark noise magnitude at 932 can comprise determining such that the determined target high-gain channel dark noise magnitude is substantially equal to a value as calculated via this equation.

In some examples, the configuring the high-gain channel charge capacity at 962 is based, at least in part, on the target high-gain channel dark noise magnitude. For example, and as discussed, the high-gain channel charge capacity $C_H$ can be related to the high-gain channel dark noise magnitude $D_H$ and the high-gain channel dynamic range $\Phi_H$ as $C_H=\Phi_H D_H$. Accordingly, in an example in which the high-gain channel dynamic range is known, the configuring the high-gain channel charge capacity at 962 can comprise configuring such that the high-gain channel charge capacity is substantially equal to the product of the high-gain channel dynamic range and the target high-gain channel charge dark noise magnitude.

Additionally or alternatively, in some examples, the determining the target low-gain channel charge capacity at 940 and/or the determining the target high-gain channel charge capacity at 942 can include determining such that the normalized crossover noise offset $\alpha=(\Omega_H-\Omega_L)/\Omega_H$ is one or more of at least 2%, at least 5%, at least 10%, at least 15%, at least 20%, at least 25%, at least 30%, at most 40%, at most 27%, at most 22%, at most 17%, at most 12%, at most 7%, and at most 3%.

General Considerations

As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items.

As used herein, the term "substantially" means the listed value and/or property and any value and/or property that is at least 75% of the listed value and/or property. Equivalently, the term "substantially" means the listed value and/or property and any value and/or property that differs from the listed value and/or property by at most 25%. For example, "substantially equal" refers to quantities that are fully equal, as well as to quantities that differ from one another by up to 25%.

The systems, apparatus, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

The innovations can be described in the general context of computer-executable instructions, such as those included in program modules, being executed in a computing system on a target real or virtual processor. Generally, program modules or components include routines, programs, libraries, objects, classes, components, data structures, etc. that perform particular tasks or implement particular abstract data types. The functionality of the program modules may be combined or split between program modules as desired in various embodiments. Computer-executable instructions for program modules may be executed within a local or distributed computing system. In general, a computing system or computing device can be local or distributed, and can include any combination of special-purpose hardware and/or general-purpose hardware with software implementing the functionality described herein.

In various examples described herein, a module (e.g., component or engine) can be "programmed" and/or "coded"

to perform certain operations or provide certain functionality, indicating that computer-executable instructions for the module can be executed to perform such operations, cause such operations to be performed, or to otherwise provide such functionality. Although functionality described with respect to a software component, module, or engine can be carried out as a discrete software unit (e.g., program, function, class method), it need not be implemented as a discrete unit. That is, the functionality can be incorporated into a larger or more general-purpose program, such as one or more lines of code in a larger or general-purpose program.

For the sake of presentation, the detailed description uses terms like “determine” and “use” to describe computer operations in a computing system. These terms are high-level abstractions for operations performed by a computer, and should not be confused with acts performed by a human being. The actual computer operations corresponding to these terms vary depending on implementation.

Described algorithms may be, for example, embodied as software or firmware instructions carried out by a digital computer. For instance, any of the disclosed methods can be performed by one or more a computers or other computing hardware that is part of a microscopy tool. The computers can be computer systems comprising one or more processors (processing devices) and tangible, non-transitory computer-readable media (e.g., one or more optical media discs, volatile memory devices (such as DRAM or SRAM), or nonvolatile memory or storage devices (such as hard drives, NVRAM, and solid-state drives (e.g., Flash drives)). The one or more processors can execute computer-executable instructions stored on one or more of the tangible, non-transitory computer-readable media, and thereby perform any of the disclosed techniques. For instance, software for performing any of the disclosed embodiments can be stored on the one or more volatile, non-transitory computer-readable media as computer-executable instructions, which when executed by the one or more processors, cause the one or more processors to perform any of the disclosed techniques or subsets of techniques.

Having described and illustrated the principles of the disclosed technology with reference to the illustrated embodiments, it will be recognized that the illustrated embodiments can be modified in arrangement and detail without departing from such principles. For instance, elements of examples performed in software may be implemented in hardware and vice-versa. Also, the technologies from any example can be combined with the technologies described in any one or more of the other examples. It will be appreciated that procedures and functions such as those described with reference to the illustrated examples can be implemented in a single hardware or software module, or separate modules can be provided. The particular arrangements above are provided for convenient illustration, and other arrangements can be used.

Additional Examples of the Disclosed Technology

In view of the above-described implementations of the disclosed subject matter, this application discloses the additional examples enumerated below. It should be noted that one feature of an example in isolation or more than one feature of the example taken in combination with and optionally, in combination with one or more feature of one or more further examples are further examples also falling within the disclosure of this application.

Example 1. A pixel element comprising:

a radiation-sensitive element configured to receive an electromagnetic signal that is representative of a particle beam and to generate an electric charge;

a charge accumulation region that receives and stores the electric charge generated by the radiation-sensitive element; and an output stage configured to generate a charge signal representative of an amount of the electrical charge stored in the charge accumulation region;

wherein the pixel element is configured to operate in each of a high-gain mode and a low-gain mode, wherein, when the pixel element is in the high-gain mode, the charge accumulation region has a high-gain channel charge capacity and the charge signal generated by the output stage includes a high-gain channel dark noise magnitude, wherein, when the pixel element is in the low-gain mode, the charge accumulation region has a low-gain channel charge capacity and the charge signal generated by the output stage includes a low-gain channel dark noise magnitude, wherein the pixel element has a total dynamic range that is defined as the ratio of the low-gain channel charge capacity to the high-gain channel dark noise magnitude.

Example 2. The pixel element of any example herein, particularly example 1, wherein the total dynamic range is one or more of at least 50,000:1, at least 100,000:1, at least 150,000:1, at least 200,000:1, at least 500,000:1, at least 1,000,000:1, at least 1,500,000:1, at most 2,000,000:1, at most 1,250,000:1, at most 750,000:1, at most 300,000:1, at most 175,000:1, at most 125,000:1, and at most 75,000:1.

Example 3. The pixel element of any example herein, particularly any one of examples 1-2, further comprising a tunable capacitive element, and wherein the charge accumulation region varies in charge capacity responsive to the tunable capacitive element varying in capacitance.

Example 4. The pixel element of any example herein, particularly any one of examples 1-3, wherein the pixel element comprises a semiconductor substrate that comprises the charge accumulation region.

Example 5. The pixel element of any example herein, particularly example 4, wherein the semiconductor substrate comprises a p-type substrate, and wherein the charge accumulation region comprises an n-type region embedded in the semiconductor substrate.

Example 6. The pixel element of any example herein, particularly any one of examples 1-5, wherein the radiation-sensitive element comprises one or more of a photodiode, a regular photodiode, a hybrid photodiode, a monolithic photodiode, a pinned photodiode, and a photogate.

Example 7. The pixel element of any example herein, particularly any one of examples 1-6, wherein the charge accumulation region comprises a depletion layer of the radiation-sensitive element.

Example 8. The pixel element of any example herein, particularly any one of examples 1-7, wherein the charge accumulation region comprises a floating diffusion region.

Example 9. The pixel element of any example herein, particularly any one of examples 1-8, wherein at least a portion of the charge accumulation region is separate from the radiation-sensitive element and collects charges generated by in the radiation-sensitive element via a conductive path between the radiation-sensitive element and the charge accumulation region.

Example 10. The pixel element of any example herein, particularly any one of examples 1-9, wherein the pixel element comprises a semiconductor substrate and an electrode electrically insulated from the semiconductor substrate, and wherein the electrode is configured to selectively vary a charge capacity of the pixel element.

Example 11. The pixel element of any example herein, particularly example 10, wherein the electrode is configured to form an inversion region in the semiconductor substrate to vary the charge capacity of the pixel element when a voltage is applied to the electrode.

Example 12. The pixel element of any example herein, particularly example 11, wherein the inversion region expands a size of the charge accumulation region from a base charge accumulation region to an expanded charge accumulation region.

Example 13. The pixel element of any example herein, particularly example 12, wherein the charge accumulation region is the base charge accumulation region when the pixel element operates in the high-gain mode, and wherein the charge accumulation region is the expanded charge accumulation region when the pixel element operates in the low-gain mode.

Example 14. The pixel element of any example herein, particularly any one of examples 11-13, wherein the inversion region is electrically connected to the charge accumulation region via a conductive path.

Example 15. The pixel element of any example herein, particularly any one of examples 10-14, wherein the pixel element is in the high-gain mode when the electrode is brought to a high-gain mode electrode voltage, and wherein the pixel element is in the low-gain mode when the electrode is brought to a low-gain mode electrode voltage that is different than the high-gain mode electrode voltage.

Example 16. The pixel element of any example herein, particularly example 15, wherein the high-gain mode electrode voltage is equal to, or approximately equal to, a ground potential.

Example 17. The pixel element of any example herein, particularly any one of examples 1-16, wherein, when the pixel element operates in the high-gain mode, the high-gain charge signal has a signal-to-noise ratio $\Omega_H$ at a crossover signal strength of the electromagnetic signal at which the radiation-sensitive element generates an electric charge equal to the high-gain channel charge capacity, wherein, when the pixel element operates in the low-gain mode, the low-gain charge signal has a signal-to-noise ratio $\Omega_L$ at the crossover signal strength, wherein the pixel element is characterized by a normalized crossover noise offset that is defined as $\alpha=(\Omega_H-\Omega_L)/\Omega_H$, and wherein the normalized crossover noise offset is one or more of at least 2%, at least 5%, at least 10%, at least 15%, at least 20%, at least 25%, at least 30%, at most 40%, at most 27%, at most 22%, at most 17%, at most 12%, at most 7%, and at most 3%.

Example 18. The pixel element of any example herein, particularly any one of examples 1-17, wherein a ratio of the low-gain channel charge capacity to the high-gain channel charge capacity is one or more of at least 30:1, at least 50:1, at least 100:1, at least 150:1, at most 200:1, at most 125:1, at most 75:1, and at most 40:1.

Example 19. The pixel element of any example herein, particularly any one of examples 1-18, wherein, when the pixel element operates in the low-gain mode, the low-gain charge signal has a signal-to-noise ratio $\Omega_L$ at a crossover signal strength of the electromagnetic signal at which the radiation-sensitive element generates an electric charge equal to the high-gain channel charge capacity, and wherein the signal-to-noise ratio $\Omega_L$ is one or more of at least 5:1, at least 10:1, at least 15:1, at least 20:1, at least 25:1, at least 30:1, at least 40:1, at most 50:1, at most 35:1, at most 27:1, at most 22:1, at most 17:1, at most 12:1, and at most 7:1.

Example 20. A PBM image sensor comprising the pixel element of any example herein, particularly any one of examples 1-19.

Example 21. The PBM image sensor of any example herein, particularly example 20, further comprising a pixel controller operative to transition the pixel element between the high-gain mode and the low-gain mode.

Example 22. The PBM image sensor of any example herein, particularly example 21, wherein the pixel element comprises a tunable capacitive element, and wherein the pixel controller is operative to vary a capacitance of the tunable capacitive element to transition the pixel element between the high-gain mode and the low-gain mode.

Example 23. The PBM image sensor of any example herein, particularly any one of examples 21-22, wherein the pixel element comprises an electrode configured to selectively vary a charge capacity of the pixel element, wherein the pixel controller is programmed to bring the electrode to a high-gain mode electrode voltage to transition the pixel element to the high-gain mode, and wherein the pixel controller is programmed to bring the electrode to a low-gain mode electrode voltage that is different than the high-gain mode electrode voltage to transition the pixel element to the low-gain mode.

Example 24. The PBM image sensor of any example herein, particularly any one of examples 20-23, wherein the PBM image sensor is configured such that the radiation-sensitive element generates charge carriers at an average charge carrier conversion rate β', defined as a number of charge carriers generated by the radiation-sensitive element for each particle of the particle beam that is received in an area corresponding to the pixel element, that is one or more of at least 10, at least 20, at least 30, at least 50, at least 100, at most 200, at most 75, at most 40, at most 25, and at most 15.

Example 25. The PBM image sensor of any example herein, particularly any one of examples 20-24, further comprising a scintillator that receives the particle beam and that generates the electromagnetic signal responsive to the particle beam.

Example 26. The PBM image sensor of any example herein, particularly example 25, wherein the scintillator produces photons of the electromagnetic signal at an average photon conversion rate 13, defined as a number of photons generated for each received particle of the particle beam, that is one or more of at least 50, at least 100, at least 150, at least 200, at least 300, at least 500, at most 1000, at most 400, at most 250, at most 175, at most 125, and at most 75.

Example 27. A PBM comprising the pixel element of any example herein, particularly any one of examples 1-19.

Example 28. The PBM of any example herein, particularly example 27, wherein the PBM comprises one or more of a scanning electron microscope (SEM), a transmission electron microscope (TEM), and a scanning transmission electron microscope (STEM).

Example 29. The PBM of any example herein, particularly any one of examples 27-28, wherein the PBM comprises a PBM image sensor that comprises the pixel element.

Example 30. The PBM of any example herein, particularly any one of examples 27-29, wherein the PBM comprises a pixel controller operative to transition the pixel element between the high-gain mode and the low-gain mode.

Example 31. A method, comprising: reading out a pixel element by reading out a high-gain charge signal with the pixel element in a high-gain mode and reading out a low-gain charge signal with the pixel element in a low-gain mode.

Example 32. The method of any example herein, particularly example 31, wherein one or more of the reading out the pixel element, the reading out the low-gain charge signal, and the reading out the high-gain charge signal is performed with a controller.

Example 33. The method of any example herein, particularly any one of examples 31-32 wherein the pixel element is the pixel element of any example herein, particularly any one of examples 1-19.

Example 34. The method of any example herein, particularly any one of examples 31-33, further comprising, prior to the reading out the pixel element, determining one or more target channel properties of the pixel element corresponding to one or both of the high-gain mode and the low-gain mode.

Example 35. The method of any example herein, particularly example 34, wherein the determining the one or more target channel properties of the pixel element is performed, at least in part, with a controller.

Example 36. The method of any example herein, particularly any one of examples 34-35, wherein one or both of the reading out the low-gain charge signal and the reading out the high-gain charge signal is performed based, at least in part, on the determining the one or more target channel properties.

Example 37. The method of any example herein, particularly any one of examples 34-36, wherein the pixel element comprises a radiation-sensitive element configured to receive an electromagnetic signal and to generate an electric charge;

wherein, when the pixel element is in the high-gain mode, the pixel element has a high-gain channel charge capacity, the high-gain charge signal comprises a dark noise signal with a high-gain channel dark noise magnitude, and the high-gain charge signal has a signal-to-noise ratio $\Omega_H$ at a crossover signal strength of the electromagnetic signal at which the radiation-sensitive element generates an electric charge equal to the high-gain channel charge capacity;

wherein, when the pixel element is in the low-gain mode, the pixel element has a low-gain channel charge capacity, the low-gain charge signal comprises a dark noise signal with a low-gain channel dark noise magnitude, and the low-gain charge signal has a signal-to-noise ratio $\Omega_L$ at the crossover signal strength; and wherein the determining the one or more target channel properties comprises determining a target crossover signal-to-noise relationship between $\Omega_H$ and $\Omega_L$.

Example 38. The method of any example herein, particularly example 37, wherein the determining the target crossover signal-to-noise relationship comprises determining a target normalized crossover noise offset defined as $\alpha=(\Omega_H-\Omega_L)/\Omega_H$.

Example 39. The method of any example herein, particularly example 38, wherein the determining the target normalized crossover noise offset comprises one or more of:

(i) selecting the target normalized crossover noise offset to be a maximum acceptable normalized crossover noise offset;

(ii) selecting the target normalized crossover noise offset to be equal to, or approximately equal to, a corresponding normalized crossover noise offset characterizing a pixel element that is used in an optical image sensor; and (iii) selecting the target normalized crossover noise offset to be one or more of at least 2%, at least 5%, at least 10%, at least 15%, at least 20%, at least 25%, at least 30%, at most 40%, at most 27%, at most 22%, at most 17%, at most 12%, at most 7%, and at most 3%.

Example 40. The method of any example herein, particularly any one of examples 34-39, wherein, when the pixel element is in the low-gain mode, the pixel element has a low-gain channel charge capacity, and the low-gain charge signal comprises a dark noise signal with a low-gain channel dark noise magnitude, and wherein the determining the one or more target channel properties comprises one or both of:

(i) determining a target low-gain channel dark noise magnitude; and (ii) determining a target low-gain channel charge capacity.

Example 41. The method of any example herein, particularly example 40, wherein, when the pixel element is in the high-gain mode, the pixel element has a high-gain channel charge capacity, and the high-gain charge signal comprises a dark noise signal with a high-gain channel dark noise magnitude; and wherein the determining the target low-gain channel charge capacity comprises determining such that a total dynamic range of the pixel element, defined as the ratio of the low-gain channel charge capacity to the high-gain channel dark noise magnitude, is one or more of at least 50,000:1, at least 100,000:1, at least 150,000:1, at least 200,000:1, at least 500,000:1, at least 1,000,000:1, at least 1,500,000:1, at most 2,000,000:1, at most 1,250,000:1, at most 750,000:1, at most 300,000:1, at most 175,000:1, at most 125,000:1, and at most 75,000:1.

Example 42. The method of any example herein, particularly any one of examples 40-41, wherein the pixel element comprises a radiation-sensitive element configured to receive an electromagnetic signal that is representative of a particle beam and to generate an electric charge, wherein the radiation-sensitive element is configured to generate the electric charge at an average charge carrier conversion rate (3', defined as a number of charge carriers generated by the radiation-sensitive element for each particle of the particle beam that is received in an area corresponding to the pixel element; and wherein one or both of the determining the target low-gain channel dark noise magnitude and the determining the target low-gain channel charge capacity is based, at least in part, on the average charge carrier conversion rate.

Example 43. The method of any example herein, particularly example 2, wherein the determining the target low-gain channel dark noise magnitude comprises calculating such that the target low-gain channel dark noise magnitude $D_L$ is substantially equal to the quantity $$D_L = \beta'\sqrt{P_C(\rho^2-1)+\left(\frac{\rho D_H}{\beta'}\right)^2},$$

where β' represents the average charge carrier conversion rate, $P_C$ represents a crossover signal strength of the electromagnetic signal at which the radiation-sensitive element generates an electric charge equal to a high-gain channel charge capacity of the pixel element in the high-gain mode, $\rho=\Omega_H/\Omega_L$, where $\Omega_H$ is a signal-to-noise ratio of the high-gain charge signal at the crossover signal strength and $\Omega_L$ is the signal-to-noise ratio of the low-gain charge signal at the crossover signal strength, and $D_H$ represents a high-gain channel dark noise magnitude of the high-gain charge signal.

Example 44. The method of any example herein, particularly any one of examples 42-43, wherein the pixel element is a component of a PBM image sensor that comprises a scintillator that receives the particle beam and that generates the electromagnetic signal responsive to the particle beam at an average photon conversion rate, and wherein one or both of the determining the target low-gain channel dark noise magnitude and the determining the target low-gain channel charge capacity is based, at least in part, on the average photon conversion rate.

Example 45. The method of any example herein, particularly any one of examples 34-44, wherein, when the pixel element is in the high-gain mode, the pixel element has a high-gain channel charge capacity, and the high-gain charge signal comprises a dark noise signal with a high-gain channel dark noise magnitude, and wherein the determining the one or more target channel properties comprises one or both of:

(i) determining a target high-gain channel dark noise magnitude; and (ii) determining a target high-gain channel charge capacity.

Example 46. The method of any example herein, particularly any one of examples 34-45, wherein the pixel element comprises a radiation-sensitive element configured to receive an electromagnetic signal and to generate an electric charge;

wherein, when the pixel element is in the high-gain mode, the pixel element has a high-gain channel charge capacity, the high-gain charge signal comprises a dark noise signal with a high-gain channel dark noise magnitude, and the high-gain charge signal has a signal-to-noise ratio $\Omega_H$ at a crossover signal strength of the electromagnetic signal at which the radiation-sensitive element generates an electric charge equal to the high-gain channel charge capacity;

wherein, when the pixel element is in the low-gain mode, the pixel element has a low-gain channel charge capacity, the low-gain charge signal comprises a dark noise signal with a low-gain channel dark noise magnitude, and the low-gain charge signal has a signal-to-noise ratio $\Omega_L$ at the crossover signal strength; and wherein the determining the one or more target channel properties comprises determining one or both of a target low-gain channel charge capacity and a target high-gain channel charge capacity such that a normalized crossover noise offset, defined as $\alpha=(\Omega_H-\Omega_L)/\Omega_H$, is one or more of at least 2%, at least 5%, at least 10%, at least 15%, at least 20%, at least 25%, at least 30%, at most 40%, at most 27%, at most 22%, at most 17%, at most 12%, at most 7%, and at most 3%.

Example 47. The method of any example herein, particularly any one of examples 31-46, wherein one or both of:

(i) the reading out the low-gain charge signal comprises configuring, with a controller, a low-gain channel charge capacity of the pixel element in the low-gain mode; and (ii) the reading out the high-gain charge signal comprises configuring, with the controller, a high-gain channel charge capacity of the pixel element in the high-gain mode.

Example 48. The method of any example herein, particularly example 47, wherein the configuring the low-gain channel charge capacity comprises configuring such that a ratio of the low-gain channel charge capacity to the high-gain channel charge capacity is one or more of at least 30:1, at least 50:1, at least 100:1, at least 150:1, at most 200:1, at most 125:1, at most 75:1, and at most 40:1.

Example 49. The method of any example herein, particularly example 48, wherein, when the pixel element is in the high-gain mode, the pixel element has a high-gain channel charge capacity, and the high-gain charge signal comprises a dark noise signal with a high-gain channel dark noise magnitude, wherein, when the pixel element is in the low-gain mode, the low-gain charge signal comprises a dark noise signal with a low-gain channel dark noise magnitude, and wherein one or both of the configuring the low-gain channel charge capacity and the configuring the high-gain channel charge capacity comprises configuring such that a total dynamic range of the pixel element, defined as the ratio of the low-gain channel charge capacity to the high-gain channel dark noise magnitude, is one or more of at least 50,000:1, at least 100,000:1, at least 150,000:1, at least 200,000:1, at least 500,000:1, at least 1,000,000:1, at least 1,500,000:1, at most 2,000,000:1, at most 1,250,000:1, at most 750,000:1, at most 300,000:1, at most 175,000:1, at most 125,000:1, and at most 75,000:1.

Example 50. The method of any example herein, particularly any one of examples 47-49, wherein the pixel element comprises a radiation-sensitive element configured to receive an electromagnetic signal and to generate an electric charge, wherein, when the pixel element is in the high-gain mode, the pixel element has a high-gain channel charge capacity, the high-gain charge signal comprises a dark noise signal with a high-gain channel dark noise magnitude, and the high-gain charge signal has a signal-to-noise ratio $\Omega_H$ at a crossover signal strength of the electromagnetic signal at which the radiation-sensitive element generates an electric charge equal to the high-gain channel charge capacity, wherein, when the pixel element is in the low-gain mode, the pixel element has a low-gain channel charge capacity, the low-gain charge signal comprises a dark noise signal with a low-gain channel dark noise magnitude, and the low-gain charge signal has a signal-to-noise ratio $\Omega_L$ at the crossover signal strength, and wherein one or both of the configuring the low-gain channel charge capacity and the configuring the high-gain channel charge capacity comprises configuring such that a normalized crossover noise offset, defined as $\alpha=(\Omega_H-\Omega_L)/\Omega_H$, is one or more of at least 2%, at least 5%, at least 10%, at least 15%, at least 20%, at least 25%, at least 30%, at most 40%, at most 27%, at most 22%, at most 17%, at most 12%, at most 7%, and at most 3%.

Example 51. The method of any example herein, particularly any one of examples 47-50, wherein the pixel element comprises a radiation-sensitive element configured to receive an electromagnetic signal and to generate an electric charge, wherein the radiation-sensitive element is configured to generate the electric charge at an average charge carrier conversion rate, defined as a number of charge carriers generated by the radiation-sensitive element for each particle of the particle beam that is received in an area corresponding to the pixel element, and wherein the configuring the low-gain channel charge capacity comprises configuring such that a target low-gain channel dark noise magnitude $D_L$ is substantially equal to the quantity $$D_L = \beta' \sqrt{P_C(\rho^2 - 1) + \left(\frac{\rho D_H}{\beta'}\right)^2},$$

where β' represents the average charge carrier conversion rate, $P_C$ represents a crossover signal strength of the electromagnetic signal at which the radiation-sensitive element generates an electric charge equal to a high-gain channel charge capacity of the pixel element in the high-gain mode, $\rho=\Omega_H/\Omega_L$, where $\Omega_H$ is a signal-to-noise ratio of the high-gain charge signal at the crossover signal strength and $\Omega_L$ is the signal-to-noise ratio of the low-gain charge signal at the crossover signal strength, and $D_H$ represents a high-gain channel dark noise magnitude of the high-gain charge signal.

Example 52. The method of any example herein, particularly example 51, wherein the pixel element is a component of a PBM image sensor that comprises a scintillator that receives the particle beam and that generates the electromagnetic signal responsive to the particle beam at an average photon conversion rate, and wherein the average charge carrier conversion rate is based, at least in part, on the average photon conversion rate.

Example 53. The method of any example herein, particularly any one of examples 47-52, wherein the configuring the low-gain channel charge capacity comprises varying, with the controller, a capacitance of a tunable capacitive element.

Example 54. The method of any example herein, particularly any one of examples 47-53, wherein the pixel element comprises:

a radiation-sensitive element configured to receive an electromagnetic signal that is representative of a particle beam and to generate an electric charge;

a charge accumulation region that receives and stores the electric charge generated by the radiation-sensitive element; and an electrode configured to vary a capacity of the charge accumulation region;

wherein the reading out the high-gain charge signal is performed with the electrode at a high-gain mode electrode voltage, and wherein the configuring the low-gain channel charge capacity comprises bringing, with the controller, the electrode to a low-gain mode electrode voltage that increases the capacity of the charge accumulation region relative to the capacity of the charge accumulation region when the pixel element is in the high-gain mode.

Example 55. The method of any example herein, particularly example 54, further comprising, prior to the reading out the pixel element, determining one or more target channel properties of the pixel element corresponding to one or both of the high-gain mode and the low-gain mode, and wherein the determining the one or more target channel properties comprises:

determining a target low-gain channel charge capacity of the charge accumulation region when the pixel element is in the low-gain mode; and determining the low-gain mode electrode voltage based, at least in part, on the target low-gain channel charge capacity.

Example 56. The method of any example herein, particularly any one of examples 47-55, wherein the configuring the high-gain channel charge capacity comprises varying, with the controller, a capacitance of a tunable capacitive element.

Example 57. The method of any example herein, particularly any one of examples 47-56, wherein the pixel element comprises:

a radiation-sensitive element configured to receive an electromagnetic signal that is representative of a particle beam and to generate an electric charge;

a charge accumulation region that receives and stores the electric charge generated by the radiation-sensitive element; and an electrode configured to vary a capacity of the charge accumulation region; and wherein the reading out the high-gain charge signal comprises bringing, with the controller, the electrode to a high-gain mode electrode voltage.

Example 58. The method of any example herein, particularly example 57, wherein the high-gain mode electrode voltage is equal to, or approximately equal to, a ground voltage.

Example 59. The method of any example herein, particularly any one of examples 47-58, wherein the reading out the high-gain charge signal is performed prior to the reading out the low-gain charge signal.

Example 60. The method of any example herein, particularly any one of examples 47-59, wherein the reading out the low-gain charge signal is performed prior to the reading out the high-gain charge signal.

Example 61. A computer-readable medium comprising stored processor-executable instructions that, when executed by a processor, cause the processor to perform the method of any one of examples 31-60.

Example 62. A pixel element comprising:

a radiation-sensitive element configured to receive an electromagnetic signal that is representative of a particle beam and to generate and store an electric charge;

a floating diffusion (FD) node;

an output stage connected to the FD node and configured to generate a charge signal representative of an amount of electric charge stored in at least a portion of the pixel element; and a charge storage device connected to the FD node, wherein the pixel element is characterized by a high-gain charge capacity equal to a charge capacity of the radiation-sensitive element and a low-gain charge capacity equal to a total charge capacity of the FD node and the charge storage device, wherein the pixel element is configured to operate in a high-gain mode, in which the charge signal is a high-gain charge signal that represents the amount of electric charge stored in the radiation-sensitive element during an integration period, and a low-gain mode, in which the charge signal is a low-gain charge signal that represents the amount of electric charge stored in one or both of the FD node and the charge storage device during the integration period, wherein the high-gain charge signal has a high-gain signal dark noise magnitude, and wherein the pixel element has a total dynamic range that is defined as the ratio of the low-gain charge capacity to the high-gain signal dark noise magnitude.

Example 63. The pixel element of any example herein, particularly example 62, wherein the total dynamic range is one or more of at least 50,000:1, at least 100,000:1, at least 150,000:1, at least 200,000:1, at least 500,000:1, at least 1,000,000:1, at least 1,500,000:1, at most 2,000,000:1, at most 1,250,000:1, at most 750,000:1, at most 300,000:1, at most 175,000:1, at most 125,000:1, and at most 75,000:1.

Example 64. The pixel element of any example herein, particularly any one of examples 62-63, wherein the radiation-sensitive element comprises one or more of a photodiode, a regular photodiode, a hybrid photodiode, a monolithic photodiode, a pinned photodiode, and a photogate.

Example 65. The pixel element of any example herein, particularly any one of examples 62-64, wherein the FD node is separated from the radiation-sensitive element and collects charges generated by in the radiation-sensitive element via a conductive path between the radiation-sensitive element and the FD node.

Example 66. The pixel element of any example herein, particularly example 65, wherein the pixel element further comprises a transfer gate between the radiation-sensitive element and the FD node to control transfer of charges from the radiation-sensitive element to the FD node.

Example 67. The pixel element of any example herein, particularly example 66, wherein the transfer gate is configured to be selectively transitioned between an ON state, in which electric charge is free to transfer from the radiation-sensitive element to the FD node, an OFF state, in which the transfer gate restricts electric charge from transferring from the radiation-sensitive element to the FD node, and at least one intermediate state, in which the transfer gate produces a potential barrier between the radiation-sensitive element and the FD node such that only electric charges in excess of a saturation level of the radiation-sensitive element can be transferred from the radiation-sensitive element to the FD node.

Example 68. The pixel element of any example herein, particularly example 67, further comprising a drive circuit configured to selectively transition the transfer gate between the ON state, the OFF state, and the at least one intermediate state.

Example 69. The pixel element of any example herein, particularly any one of examples 62-68, further comprising a charge storage merge switch between the FD node and the charge storage device, and wherein the charge storage merge switch is configured to be selectively transitioned between an open state, in which the FD node is electrically disconnected from the charge storage device, and a closed state, in which the FD node is electrically connected to the charge storage device.

Example 70. The pixel element of any example herein, particularly example 69, wherein the charge storage merge switch is in the open state when the pixel element operates in the high-gain mode, and wherein the charge storage merge switch is in the closed state when the pixel element operates in the low-gain mode.

Example 71. The pixel element of any example herein, particularly any one of examples 62-70, wherein the charge storage device comprises one or more capacitors.

Example 72. The pixel element of any example herein, particularly example 71, wherein the one or more capacitors comprises a plurality of capacitors arranged in parallel.

Example 73. The pixel element of any example herein, particularly example 72, wherein each pair of adjacent capacitors of the plurality of capacitors is separated by a parallel capacitor merge switch configured to be selectively electrically connect and disconnect the pair of adjacent capacitors to vary a charge storage capacity of the charge storage device.

Example 74. The pixel element of any example herein, particularly any one of examples 71-73, wherein the one or more capacitors are formed in one or more metal-oxide layers of the pixel element.

Example 75. The pixel element of any example herein, particularly any one of examples 62-74, further comprising an FD node reset transistor connected between the FD node and a drain voltage source for depletion of electric charge in the FD node.

Example 76. The pixel element of any example herein, particularly any one of examples 62-75, further comprising a charge storage reset transistor connected between the charge storage device and a drain voltage source for depletion of electric charge in at least a portion of the charge storage device.

Example 77. The pixel element of any example herein, particularly any one of examples 62-76, further comprising a drain region and a drain gate configured to selectively electrically connect the radiation-sensitive element to the drain region.

Example 78. The pixel element of any example herein, particularly example 77, wherein integration of charge in the radiation-sensitive element is prevented while the drain gate electrically connects the radiation-sensitive element to the drain region.

Example 79. The pixel element of any example herein, particularly any one of examples 62-78, wherein, when the pixel element operates in the high-gain mode, the high-gain charge signal has a signal-to-noise ratio $\Omega_H$ at a crossover signal strength of the electromagnetic signal at which the radiation-sensitive element generates an electric charge equal to the high-gain charge capacity, wherein, when the pixel element operates in the low-gain mode, the low-gain charge signal has a signal-to-noise ratio $\Omega_L$ at the crossover signal strength, wherein the pixel element is characterized by a normalized crossover noise offset that is defined as $\alpha=(\Omega_H-\Omega_L)/\Omega_H$, and wherein the normalized crossover noise offset is one or more of at least 2%, at least 5%, at least 10%, at least 15%, at least 20%, at least 25%, at least 30%, at most 40%, at most 27%, at most 22%, at most 17%, at most 12%, at most 7%, and at most 3%.

Example 80. The pixel element of any example herein, particularly any one of examples 62-79, wherein a ratio of the low-gain channel charge capacity to the high-gain charge capacity is one or more of at least 30:1, at least 50:1, at least 100:1, at least 150:1, at most 200:1, at most 125:1, at most 75:1, and at most 40:1.

Example 81. The pixel element of any example herein, particularly any one of examples 62-80, wherein, when the pixel element operates in the low-gain mode, the low-gain charge signal has a signal-to-noise ratio $\Omega_L$ at a crossover signal strength of the electromagnetic signal at which the radiation-sensitive element generates an electric charge equal to the high-gain charge capacity, and wherein the signal-to-noise ratio $\Omega_L$ is one or more of at least 5:1, at least 10:1, at least 15:1, at least 20:1, at least 25:1, at least 30:1, at least 40:1, at most 50:1, at most 35:1, at most 27:1, at most 22:1, at most 17:1, at most 12:1, and at most 7:1.

Example 82. A PBM image sensor comprising the pixel element of any example herein, particularly any one of examples 62-81.

Example 83. The PBM image sensor of any example herein, particularly example 82, further comprising a pixel controller operative to at least partially control readout of the pixel element.

Example 84. The PBM image sensor of any example herein, particularly example 83, wherein the charge storage device comprises a plurality of capacitors electrically connected in parallel via merge switches, and wherein the pixel controller is operative to actuate each merge switch to dynamically vary a charge capacity of the charge storage device.

Example 85. The PBM image sensor of any example herein, particularly any one of examples 82-84, wherein the PBM image sensor is configured such that the radiation-sensitive element generates charge carriers at an average charge carrier conversion rate (3', defined as a number of charge carriers generated by the radiation-sensitive element for each particle of the particle beam that is received in an area corresponding to the pixel element, that is one or more of at least 10, at least 20, at least 30, at least 50, at least 100, at most 200, at most 75, at most 40, at most 25, and at most 15.

Example 86. The PBM image sensor of any example herein, particularly any one of examples 82-85, further comprising a scintillator that receives the particle beam and that generates the electromagnetic signal responsive to the particle beam.

Example 87. The PBM image sensor of any example herein, particularly example 86, wherein the scintillator produces photons of the electromagnetic signal at an average photon conversion rate $\beta$, defined as an average number of photons generated for each received particle of the particle beam, that is one or more of at least 10, at least 50, at least 100, at least 150, at least 200, at least 300, at least 500, at most 1000, at most 400, at most 250, at most 175, at most 125, at most 75, and at most 25.

Example 88. A PBM comprising the pixel element of any example herein, particularly any one of examples 62-81.

Example 89. The PBM of any example herein, particularly example 88, wherein the PBM comprises one or more of a scanning electron microscope (SEM), a transmission electron microscope (TEM), and a scanning transmission electron microscope (STEM).

Example 90. The PBM of any example herein, particularly any one of examples 88-89, wherein the PBM comprises a PBM image sensor that comprises the pixel element.

Example 91. The PBM of any example herein, particularly any one of examples 88-90, wherein the PBM comprises a pixel controller operative to at least partially control readout of the pixel element.

Example 92. A method, comprising:

providing a pixel element that comprises:

- a radiation-sensitive element configured to receive an electromagnetic signal that is representative of a particle beam and to generate and store an electric charge;
- a floating diffusion (FD) node;
- an output stage connected to the FD node and configured to generate a charge signal representative of an amount of electric charge stored in at least a portion of the pixel element; and
- a charge storage device connected to the FD node; and producing, with the pixel element, the charge signal, wherein the radiation-sensitive element is configured to generate the electric charge at an average charge carrier conversion rate $\beta'$, defined as a number of charge carriers generated by the radiation-sensitive element for each particle of the particle beam that is received in an area corresponding to the pixel element, and wherein the producing the charge signal is based, at least in part, on the average charge carrier conversion rate.

Example 93. The method of any example herein, particularly example 92, wherein the electromagnetic signal is produced by a scintillator that receives the particle beam and that generates the electromagnetic signal responsive to the particle beam at an average photon conversion rate, and wherein the average charge carrier conversion rate is based, at least in part, on the average photon conversion rate.

Example 94. The method of any example herein, particularly example 93, wherein the charge signal comprises a high-gain charge signal and a low-gain charge signal, and wherein the producing the charge signal comprises:

- receiving the electromagnetic signal at the radiation-sensitive element to generate the electric charge;
- operating the pixel element in a high-gain mode to produce the high-gain charge signal; and
- operating the pixel element in a low-gain mode to produce the low-gain charge signal.

Example 95. The method of any example herein, particularly any one of examples 92-94, wherein the pixel element is characterized by a high-gain charge capacity equal to a charge capacity of the radiation-sensitive element and a low-gain charge capacity equal to a total charge capacity of the FD node and the charge storage device, and wherein the providing the pixel element comprises providing such that one or both of the high-gain charge capacity and the low-gain charge capacity is based, at least in part, on the average charge carrier conversion rate.

Example 96. The method of any example herein, particularly example 95, wherein the providing the pixel element comprises configuring the low-gain charge capacity based, at least in part, on the average photon conversion rate, and wherein the configuring the low-gain charge capacity comprises configuring a charge capacity of the charge storage device.

Example 97. The method of any example herein, particularly example 96, wherein the charge storage device comprises one or more capacitors, and wherein the configuring the charge capacity of the charge storage device comprises configuring the total charge capacity of the one or more capacitors.

Example 98. The method of any example herein, particularly any one of examples 95-97, wherein the producing the charge signal comprises operating the pixel element in a high-gain mode to produce a high-gain charge signal with a high-gain signal dark noise magnitude, and wherein the providing the pixel element comprises providing such that a total dynamic range of the pixel element, defined as the ratio of the low-gain charge capacity to the high-gain signal dark noise magnitude, is one or more of at least 50,000:1, at least 100,000:1, at least 150,000:1, at least 200,000:1, at least 500,000:1, at least 1,000,000:1, at least 1,500,000:1, at most 2,000,000:1, at most 1,250,000:1, at most 750,000:1, at most 300,000:1, at most 175,000:1, at most 125,000:1, and at most 75,000:1.

Example 99. The method of any example herein, particularly any one of examples 92-98, further comprising reading out the charge signal.

Example 100. The method of any example herein, particularly example 99, wherein the reading out the charge signal is performed by a pixel controller that receives the charge signal from the output stage.

Example 101. The method of any example herein, particularly any one of examples 99-100, wherein the charge signal comprises a high-gain charge signal and a low-gain charge signal, and wherein the reading out the charge signal comprises reading out the high-gain charge signal prior to reading out the low-gain charge signal.

Example 102. The method of any example herein, particularly any one of examples 92-101, wherein the pixel element further comprises a drain region and a drain gate configured to selectively electrically connect the radiation-sensitive element to the drain region, wherein integration of charge in the radiation-sensitive element is prevented while the drain gate electrically connects the radiation-sensitive element to the drain region, and wherein the producing the charge signal comprises:

electrically connecting the radiation-sensitive element to the drain region with the drain gate prior to an integration initiation time;

at the integration initiation time, electrically disconnecting the radiation-sensitive element from the drain region with the drain gate; and at a charge readout time, generating the charge signal with the output stage, wherein the charge readout time and the integration initiation time are separated by a time-gated integration time interval, and wherein one or both of:

(i) the time-gated integration time interval is one or more of at least 1/10000 of a total frame time between initiation of successive frames, at least 1/1000 of the total frame time, at least 1/100 of the total frame time, at least 1/10 of the total frame time, at most equal to the total frame time, at most 1/5 of the total frame time, at most 1/50 of the total frame time, at most 1/500 of the total frame time, and/or at most 1/5000 of the total frame time; and (ii) the time-gated integration time interval is one or more of at least 1 microsecond (μs), at least 3 μs, at least 5 μs, at least 10 μs, at most 20 μs, at most 15 μs, at most 7 μs, at most 2 μs, and at most 1 μs.

Example 103. The method of any example herein, particularly any one of examples 92-102, wherein the pixel element is the pixel element of any one of examples 62-81.

Example 104. A computer-readable medium comprising stored processor-executable instructions that, when executed by a processor, cause the processor to perform the method of any one of examples 92-102.

Example 105. An apparatus, comprising:

a sensor configured to receive an electromagnetic signal and to generate a charge signal at an average charge carrier conversion rate that is greater than 1, wherein the sensor comprises at least one pixel element configured to produce a high-gain charge signal and a low-gain charge signal that collectively are characterized by a total dynamic range, and wherein the at least one pixel element is calibrated such that the total dynamic range is based, at least in part, on the average charge carrier conversion rate.

Example 106. The apparatus of any example herein, particularly example 105, further comprising:

a scintillator configured to receive a particle beam and to generate the electromagnetic signal at an average photon conversion rate; and a waveguide configured to convey the electromagnetic signal from the scintillator to the sensor, wherein the average charge carrier conversion rate is based, at least in part, on the average photon conversion rate.

Example 107. The apparatus of any example herein, particularly example 106, wherein the waveguide comprises a fiber optic plate.

Example 108. The apparatus of any example herein, particularly any one of examples 106-107, wherein the apparatus comprises a particle beam microscope (PBM).

Example 109. The apparatus of any example herein, particularly any one of examples 106-108, wherein the pixel element is the pixel element of any one of examples 1-19 or examples 62-81.

In view of the many possible embodiments to which the principles of the disclosed technology may be applied, it should be recognized that the illustrated embodiments are only representative examples and should not be taken as limiting the scope of the disclosure. Alternatives specifically addressed in these sections are merely exemplary and do not constitute all possible alternatives to the embodiments described herein. For instance, various components of systems described herein may be combined in function and use. We therefore claim all that comes within the scope and spirit of these claims.

The invention claimed is:

1. A pixel element comprising:

a radiation-sensitive element configured to receive an electromagnetic signal that is representative of a particle beam and to generate and store an electric charge;

a floating diffusion (FD) node;

an output stage connected to the FD node and configured to generate a charge signal representative of an amount of electric charge stored in at least a portion of the pixel element; and a charge storage device separate from the radiation-sensitive element and configured to be selectively connected to the FD node, wherein the charge storage device is configured to be selectively electrically disconnected from the radiation-sensitive element and the FD node, wherein the pixel element is characterized by a high-gain charge capacity equal to a charge capacity of the radiation-sensitive element and a low-gain charge capacity equal to a total charge capacity of the FD node and the charge storage device, wherein the pixel element is configured to operate in a high-gain mode, in which the charge signal is a high-gain charge signal that represents the amount of electric charge stored in at least the radiation-sensitive element during an integration period, and a low-gain mode, in which the charge signal is a low-gain charge signal that represents the amount of electric charge stored in at least the charge storage device during the integration period, wherein the charge storage device is configured to store at least a portion of the low-gain charge signal while the charge storage device is electrically disconnected from the FD node, wherein the high-gain charge signal has a high-gain signal dark noise magnitude, wherein the pixel element has a total dynamic range, defined as the ratio of the low-gain charge capacity to the high-gain signal dark noise magnitude, that is at least 100,000:1, wherein, when the pixel element operates in the high-gain mode, the high-gain charge signal exhibits a signal-to-noise ratio $\Omega_H$ at a crossover signal strength of the electromagnetic signal at which the radiation-sensitive element generates an electric charge equal to the high-gain charge capacity, wherein, when the pixel element operates in the low-gain mode, the low-gain charge signal exhibits a signal-to-noise ratio $\Omega_L$ at the crossover signal strength, wherein the pixel element is characterized by a normalized crossover noise offset that is defined as $\alpha=(\Omega_H-\Omega_L)/\Omega_H$, and wherein the normalized crossover noise offset is at least 5% and at most 20%.

2. The pixel element of claim 1, further comprising a charge storage merge switch between the FD node and the charge storage device, wherein the charge storage merge switch is configured to be selectively transitioned between an open state, in which the FD node is electrically disconnected from the charge storage device, and a closed state, in which the FD node is electrically connected to the charge storage device, wherein the charge storage merge switch is in the open state when the pixel element operates in the high-gain mode, wherein the charge storage merge switch is in the closed state when the pixel element operates in the low-gain mode, and wherein the charge storage device is configured to store at least a portion of the low-gain charge signal while the charge storage merge switch is in the closed state.

3. The pixel element of claim 1, wherein the charge storage device comprises a plurality of capacitors arranged in parallel, wherein each pair of adjacent capacitors of the plurality of capacitors is separated by a parallel capacitor merge switch configured to selectively electrically connect and disconnect the pair of adjacent capacitors to vary a charge storage capacity of the charge storage device.

4. The pixel element of claim 1, wherein a ratio of the low-gain charge capacity to the high-gain charge capacity is at least 30:1.

5. The pixel element of claim 1, wherein the signal-to-noise ratio $\Omega_L$ is at least 10:1 and at most 50:1.

6. A particle beam microscope (PBM) image sensor comprising the pixel element of claim 1 and a pixel controller operative to at least partially control readout of the pixel element.

7. The PBM image sensor of claim 6, wherein the charge storage device comprises a plurality of capacitors electrically connected in parallel via merge switches, and wherein the pixel controller is operative to actuate each merge switch to dynamically vary a charge capacity of the charge storage device.

8. The PBM image sensor of claim 6, further comprising a scintillator that receives the particle beam and that generates the electromagnetic signal responsive to the particle beam, and wherein the scintillator produces photons of the electromagnetic signal at an average photon conversion rate β, defined as an average number of photons generated for each received particle of the particle beam, that is at least 10.

9. A PBM comprising the pixel element of claim 1.

10. A method, comprising:

providing the pixel element of claim 1; and producing, with the pixel element, the charge signal, wherein the radiation-sensitive element is configured to generate the electric charge at an average charge carrier conversion rate β', defined as a number of charge carriers generated by the radiation-sensitive element for each particle of the particle beam that is received in an area corresponding to the pixel element, and wherein the producing the charge signal is based, at least in part, on the average charge carrier conversion rate.

11. The method of claim 10, wherein the providing the pixel element comprises providing such that one or both of the high-gain charge capacity and the low-gain charge capacity is based, at least in part, on the average charge carrier conversion rate.

12. The method of claim 11, wherein the providing the pixel element comprises configuring the low-gain charge capacity based, at least in part, on the average charge carrier conversion rate, and wherein the configuring the low-gain charge capacity comprises configuring a charge capacity of the charge storage device.

13. The method of claim 10, wherein the pixel element further comprises a drain region and a drain gate configured to selectively electrically connect the radiation-sensitive element to the drain region, wherein integration of charge in the radiation-sensitive element is prevented while the drain gate electrically connects the radiation-sensitive element to the drain region, and wherein the producing the charge signal comprises:

electrically connecting the radiation-sensitive element to the drain region with the drain gate prior to an integration initiation time;

at the integration initiation time, electrically disconnecting the radiation-sensitive element from the drain region with the drain gate; and at a charge readout time, generating the charge signal with the output stage, wherein the charge readout time and the integration initiation time are separated by a time-gated integration time interval that is at least 1/1000 of a total frame time between initiation of successive frames and at most equal to the total frame time.

14. An apparatus, comprising:

a sensor configured to receive an electromagnetic signal and to generate a charge signal at an average charge carrier conversion rate that is greater than 1, wherein the sensor comprises at least one pixel element configured to produce a high-gain charge signal and a low-gain charge signal that collectively are characterized by a total dynamic range, and wherein the at least one pixel element is calibrated such that the total dynamic range is based, at least in part, on the average charge carrier conversion rate.

15. A computer-readable medium comprising stored processor-executable instructions that, when executed by a processor, cause the processor to:

read out a pixel element by reading out a high-gain charge signal with the pixel element in a high-gain mode and reading out a low-gain charge signal with the pixel element in a low-gain mode;

wherein the pixel element is configured to generate charge carriers at an average charge carrier conversion rate that is greater than 1, wherein, when the pixel element is in the high-gain mode, the pixel element has a high-gain channel charge capacity and when the pixel element is in the low-gain mode, the pixel element has a low-gain channel charge capacity, wherein, when the pixel element operates in the high-gain mode, the high-gain charge signal exhibits a signal-to-noise ratio Ly at a crossover signal strength of an electromagnetic signal at which a radiation-sensitive element of the pixel element generates an electric charge equal to the high-gain charge capacity, wherein, when the pixel element operates in the low-gain mode, the low-gain charge signal exhibits a signal-to-noise ratio $\Omega_L$ at the crossover signal strength, and wherein the reading out the low-gain charge signal comprises configuring, with a pixel controller, the low-gain channel charge capacity of the pixel element such that a ratio of the low-gain channel charge capacity to the high-gain channel charge capacity is at least 30:1 and such that the low-gain channel charge capacity is based, at least in part, on:

(i) the average charge carrier conversion rate;

(ii) a high-gain channel dark noise magnitude of the high-gain charge signal; and (iii) a difference between $\Omega_H$ and $\Omega_L$.

16. The computer-readable medium of claim 15, wherein the electromagnetic signal is representative of a particle beam, wherein the radiation-sensitive element is configured to receive the electromagnetic signal and to generate an electric charge, and wherein the pixel element comprises:

a charge accumulation region that receives and stores the electric charge generated by the radiation-sensitive element; and an electrode configured to vary a capacity of the charge accumulation region;

wherein the reading out the high-gain charge signal is performed with the electrode at a high-gain mode electrode voltage, and wherein the configuring the low-gain channel charge capacity comprises bringing, with the pixel controller, the electrode to a low-gain mode electrode voltage that increases the capacity of the charge accumulation region relative to the capacity of the charge accumulation region when the pixel element is in the high-gain mode.

17. The computer-readable medium of claim 16, wherein the stored processor-executable instructions, when executed by the processor, further cause the processor to, prior to the reading out the pixel element, determine one or more target channel properties of the pixel element corresponding to one or both of the high-gain mode and the low-gain mode, and wherein the determining the one or more target channel properties comprises:

determining a target low-gain channel charge capacity of the charge accumulation region when the pixel element is in the low-gain mode; and determining the low-gain mode electrode voltage based, at least in part, on the target low-gain channel charge capacity, wherein the radiation-sensitive element is configured to generate the electric charge at the average charge carrier conversion rate, defined as a number of charge carriers generated by the radiation-sensitive element for each particle of the particle beam that is received in an area corresponding to the pixel element, and wherein the determining the target low-gain channel charge capacity is based, at least in part, on the average charge carrier conversion rate.

18. The computer-readable medium of claim 15, wherein the high-gain charge signal comprises a dark noise signal with the high-gain channel dark noise magnitude, wherein, when the pixel element is in the low-gain mode, the low-gain charge signal comprises a dark noise signal with a low-gain channel dark noise magnitude, and wherein the configuring the low-gain channel charge capacity comprises configuring such that a total dynamic range of the pixel element, defined as the ratio of the low-gain channel charge capacity to the high-gain channel dark noise magnitude, is at least 100,000:1.

19. The computer-readable medium of claim 15, wherein the radiation-sensitive element is configured to receive the electromagnetic signal and to generate the electric charge at the average charge carrier conversion rate, wherein the average charge carrier conversion rate is defined as a number of charge carriers generated by the radiation-sensitive element for each particle of a particle beam that is received in an area corresponding to the pixel element, and wherein the configuring the low-gain channel charge capacity comprises configuring such that a target low-gain channel dark noise magnitude $D_L$ is substantially equal to the quantity $$D_L = \beta' \sqrt{P_C(\rho^2 - 1) + \left(\frac{\rho D_H}{\beta'}\right)^2},$$

where β' represents the average charge carrier conversion rate, $P_C$ represents the crossover signal strength of the electromagnetic signal, $\rho = \Omega_H/\Omega_L$, where $\Omega_H$ is a signal-to-noise ratio of the high-gain charge signal at the crossover signal strength and $\Omega_L$ is the signal-to-noise ratio of the low-gain charge signal at the crossover signal strength, and $D_H$ represents the high-gain channel dark noise magnitude of the high-gain charge signal.

20. The computer-readable medium of claim 15, wherein the configuring the low-gain channel charge capacity comprises configuring such that the pixel element is characterized by a normalized crossover noise offset that is defined as $\alpha = (\Omega_H - \Omega_L)/\Omega_H$, and wherein the normalized crossover noise offset is at least 5% and at most 20%.

* * * * *